United States Patent
Savage-Leuchs et al.

(10) Patent No.: US 9,923,329 B2
(45) Date of Patent: Mar. 20, 2018

(54) Q-SWITCHED OSCILLATOR SEED-SOURCE FOR MOPA LASER ILLUMINATOR APPARATUS AND METHOD

(71) Applicant: Lockheed Martin Corporation, Bethesda, MD (US)

(72) Inventors: Matthias P. Savage-Leuchs, Woodinville, WA (US); Christian E. Dilley, Everett, WA (US); Charles A. Lemaire, Apple Valley, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 102 days.

(21) Appl. No.: 14/596,020

(22) Filed: Jan. 13, 2015

(65) Prior Publication Data
US 2015/0214690 A1    Jul. 30, 2015

Related U.S. Application Data

(62) Division of application No. 12/952,190, filed on Nov. 22, 2010, now Pat. No. 8,934,509.
(Continued)

(51) Int. Cl.
*H01S 3/11* (2006.01)
*H01S 3/10* (2006.01)
(Continued)

(52) U.S. Cl.
CPC ........ *H01S 3/06758* (2013.01); *B60Q 1/0076* (2013.01); *H01S 3/06716* (2013.01);
(Continued)

(58) Field of Classification Search
CPC ........... H01S 3/06758; H01S 3/094003; H01S 3/06716; H01S 3/0941; H01S 3/1022;
(Continued)

(56) References Cited

U.S. PATENT DOCUMENTS 3,728,117 A    4/1973    Heidenhain et al.
4,313,648 A    2/1982    Yano et al.
(Continued)

FOREIGN PATENT DOCUMENTS

JP    05-251832    9/1993
JP    2007-081054    3/2007
WO    WO 2007132182    11/2007

OTHER PUBLICATIONS

"Japanese Examiner's Action in related Japanese Application Tokugan 2012-540140, dated Jun. 30, 2014, 3 pages Associate's English summary, 3 pages Japanese Action".
(Continued)

*Primary Examiner* — Yuanda Zhang
(74) *Attorney, Agent, or Firm* — Charles A. Lemaire; Jonathan M. Rixen; Lemaire Patent Law Firm, P.L.L.C.

(57) ABSTRACT

An apparatus, method and system that uses a Q-switched laser or a Q-seed source for a seed pulse signal having a controlled high-dynamic-range amplitude that avoids and/or compensates for pulse steepening in high-gain optical-fiber and/or optical-rod amplification of optical pulses. Optionally, the optical output is used for LIDAR or illumination purposes (e.g., for image acquisition). In some embodiments, well-controlled pulse shapes are obtained having a wide dynamic range, long duration, and not-too-narrow linewidth. In some embodiments, upon the opening of a Q-switch in an optical cavity having a gain medium, the amplification builds relatively slowly, wherein each round trip through the gain medium increases the amplitude of the optical pulse. Other embodiments use quasi-Q-switch devices or a plurality of amplitude modulators to obtain Q-seed pulses. These configurations provide optical pulses having wide dynamic ranges that ameliorate problems of
(Continued)

pulse steepening, non-linear spectral broadening and the like in very-high-power MOPA devices.

20 Claims, 14 Drawing Sheets

Related U.S. Application Data

(60) Provisional application No. 61/263,736, filed on Nov. 23, 2009.

(51) Int. Cl.
| | |
|---|---|
| H01S 3/067 | (2006.01) |
| H01S 3/115 | (2006.01) |
| H01S 3/102 | (2006.01) |
| B60Q 1/00 | (2006.01) |
| H01S 3/0941 | (2006.01) |
| H01S 3/094 | (2006.01) |
| H01S 3/113 | (2006.01) |
| H01S 3/127 | (2006.01) |
| H01S 3/23 | (2006.01) |
| H01S 5/14 | (2006.01) |

(52) U.S. Cl.
CPC ........ *H01S 3/06791* (2013.01); *H01S 3/0941* (2013.01); *H01S 3/094003* (2013.01); *H01S 3/1022* (2013.01); *H01S 3/115* (2013.01); H01S 3/0675 (2013.01); H01S 3/06704 (2013.01); H01S 3/06712 (2013.01); H01S 3/094011 (2013.01); H01S 3/094053 (2013.01); H01S 3/113 (2013.01); H01S 3/127 (2013.01); H01S 3/2316 (2013.01); H01S 5/146 (2013.01); H01S 2301/03 (2013.01)

(58) Field of Classification Search
CPC .. H01S 3/06791; H01S 3/115; H01S 3/06704; H01S 3/094011; H01S 3/0675; H01S 3/127; H01S 3/094053; H01S 3/2316; B60Q 1/0076
See application file for complete search history.

(56) References Cited

U.S. PATENT DOCUMENTS

| | | | |
|---|---|---|---|
| 4,728,168 A | 3/1988 | Alferness et al. | |
| 4,778,237 A | 10/1988 | Sorin et al. | |
| 4,895,790 A | 1/1990 | Swanson et al. | |
| 5,257,274 A * | 10/1993 | Barrett | G02B 6/4296 372/10 |
| 5,357,363 A * | 10/1994 | Li | H04B 10/803 398/141 |
| 5,546,415 A * | 8/1996 | Delfyett | H01S 5/50 372/18 |
| 5,907,436 A | 5/1999 | Perry et al. | |
| 6,097,863 A | 8/2000 | Chowdhury | |
| 6,192,062 B1 | 2/2001 | Sanchez-Rubio et al. | |
| 6,208,679 B1 | 3/2001 | Sanchez-Rubio et al. | |
| 6,212,310 B1 | 4/2001 | Waarts et al. | |
| 6,288,835 B1 | 9/2001 | Nilsson et al. | |
| 6,324,016 B1 | 11/2001 | Luster | |
| 6,330,388 B1 | 12/2001 | Bendett et al. | |
| 6,396,975 B1 | 5/2002 | Wood et al. | |
| 6,456,756 B1 | 9/2002 | Mead | |
| 6,493,476 B2 | 12/2002 | Bendett | |
| 6,587,483 B2 * | 7/2003 | Kittelmann | H01S 3/117 372/12 |
| 6,636,678 B1 | 10/2003 | Bendett et al. | |
| 6,721,344 B2 | 4/2004 | Nakao et al. | |
| 6,813,405 B1 | 11/2004 | Bendett et al. | |
| 6,813,429 B2 | 11/2004 | Price et al. | |
| 6,822,796 B2 | 11/2004 | Takada et al. | |
| 6,833,946 B2 | 12/2004 | Islam | |
| 6,954,564 B2 | 10/2005 | Bendet | |
| 6,958,859 B2 | 10/2005 | Hoose et al. | |
| 6,970,494 B1 | 11/2005 | Bendett et al. | |
| 7,199,924 B1 | 4/2007 | Brown et al. | |
| 7,203,209 B2 | 4/2007 | Young et al. | |
| 7,251,258 B2 | 7/2007 | Wise et al. | |
| 7,256,930 B2 | 8/2007 | Liu | |
| 7,372,880 B2 | 5/2008 | Jablonski et al. | |
| 7,379,648 B1 | 5/2008 | Brooks et al. | |
| 7,386,211 B1 | 6/2008 | Di Teodoro et al. | |
| 7,391,561 B2 | 6/2008 | Di Teodoro et al. | |
| 7,391,794 B2 | 6/2008 | Kane | |
| 7,397,832 B2 | 7/2008 | Dell'Acqua et al. | |
| 7,400,804 B1 | 7/2008 | Di Teodoro et al. | |
| 7,403,677 B1 | 7/2008 | Zhao et al. | |
| 7,424,185 B2 | 9/2008 | Glebov et al. | |
| 7,429,734 B1 | 9/2008 | Tidwell | |
| 7,430,352 B2 | 9/2008 | Di Teodoro et al. | |
| 7,443,893 B2 | 10/2008 | Murison et al. | |
| 7,471,705 B2 | 12/2008 | Gerstenberger et al. | |
| 7,477,664 B2 | 1/2009 | Liu | |
| 7,532,656 B2 | 5/2009 | Yang et al. | |
| 7,539,231 B1 | 5/2009 | Honea et al. | |
| 7,558,300 B2 | 7/2009 | Dragic | |
| 7,620,077 B2 | 11/2009 | Henderson | |
| 7,701,987 B1 | 4/2010 | Savage-Leuchs et al. | |
| 7,768,700 B1 | 8/2010 | Savage-Leuchs | |
| 7,792,166 B2 | 9/2010 | Borschowa | |
| 7,817,683 B2 | 10/2010 | Khitrov | |
| 7,872,794 B1 | 1/2011 | Minelly et al. | |
| 7,876,498 B1 * | 1/2011 | Honea | H01S 3/06758 359/341.41 |
| 7,949,021 B2 | 5/2011 | Kakui | |
| 8,379,298 B2 * | 2/2013 | Clowes | H01S 3/06758 359/341.32 |
| 2005/0063441 A1 | 3/2005 | Brown | |
| 2006/0219673 A1 * | 10/2006 | Varnham | B23K 26/0734 219/121.6 |
| 2007/0121689 A1 * | 5/2007 | Brown | H01S 3/025 372/39 |
| 2008/0037604 A1 * | 2/2008 | Savage-Leuchs | G02B 6/4296 372/44.01 |
| 2008/0117940 A1 * | 5/2008 | Tang | H01S 3/067 372/6 |
| 2008/0175279 A1 * | 7/2008 | Kakui | H01S 3/06791 372/10 |
| 2009/0237781 A1 * | 9/2009 | Hoshi | H01S 3/005 359/344 |
| 2009/0262761 A1 * | 10/2009 | Khitrov | H01S 3/06754 372/6 |
| 2010/0098112 A1 * | 4/2010 | Gapontsev | H01S 3/0064 372/3 |

OTHER PUBLICATIONS

Bochove, Eric J., "Theory of Spectral Beam Combining", "IEEE Journal of Quantum Electronics", 2002, pp. 432-445, vol. 38, No. 5.

Brooks, Christopher D, et al., "1-mJ energy, 1-MW peak-power, 10-W averagepower, spectrally narrow, diffraction-limited pulses from a photonic-crystal f", "Optics Express", Oct. 31, 2005, pp. 8999-9002, vol. 13, No. 22.

Di Teodoro, Fabio, et al., "MW peak-power, mJ pulse energy, multi-kHz repetition rate pulses from Yb-doped fiber amplifiers", "Proc. of SPIE", 2006, pp. 61020K.1-61020K.8, vol. 6102.

Farrow, Roger L., et al., "Compact fiber lasers for efficient high-power generation", "Proceedings of the SPIE", 2006, pp. 62870C-1-62870C-6, vol. 6287, No. 62870C.

Han, H.-S., et al., "Coefficient determination related to optical gain in erbium-doped silicon-rich silicon oxide waveguide amplifier", "Appl. Phys. Lett.", Nov. 22, 2002, pp. 3720-3722, vol. 81, No. 20.

Kik, P.G., et al., "Exciton-erbium energy transfer in Si nanocrystal-doped SiO2", "J. Appl. Phys.", Aug. 15, 2000, pp. 1992-1998, vol. 88, No. 4.

(56) References Cited

OTHER PUBLICATIONS

Kik, P.G., et al., "Strong exciton-erbium coupling in Si nanocrystal-doped SiO2", "Applied Physics Letters", Apr. 24, 2000, pp. 2325-2327, vol. 76, No. 17.
Kik, P.G., et al., "Exciton-erbium energy transfer in Si nanocrystal-doped SiO2", "Materials Science and Engineering", 2001, pp. 38, vol. B81.
Loftus, T.H., et al., "Spectrally Beam-Combined Fiber Lasers for High-Average-Power Applications", "IEEE Journal of Selected Topics in Quantum Electronics", May 1, 2007, pp. 487-497, vol. 13, No. 3.
Orsila, Lasse, et al., "Three- and four-level transition dynamics in Yb-fiber", "Optics Express", May 2, 2005, pp. 3218-3223, vol. 13, No. 9.
Shay, et al., "First experimental demonstration of self-synchronous phase locking of an optical array", "Optics Express", Dec. 11, 2006, pp. 12015-12021, vol. 14, No. 25.
Publisher: EPO Communication pursuant to Article 94(3) EPC for related application EP 10834960.6, dated Apr. 19, 2017, 7 pages.
Jiang, et al., "All-fiberized MOPA structured single-mode pulse Yb fiber laser with a linearly polarized output power of 30 W", "Laser Physics Letters", Feb. 6, 2009, p. 384-387, vol. 6, No. 5.

* cited by examiner

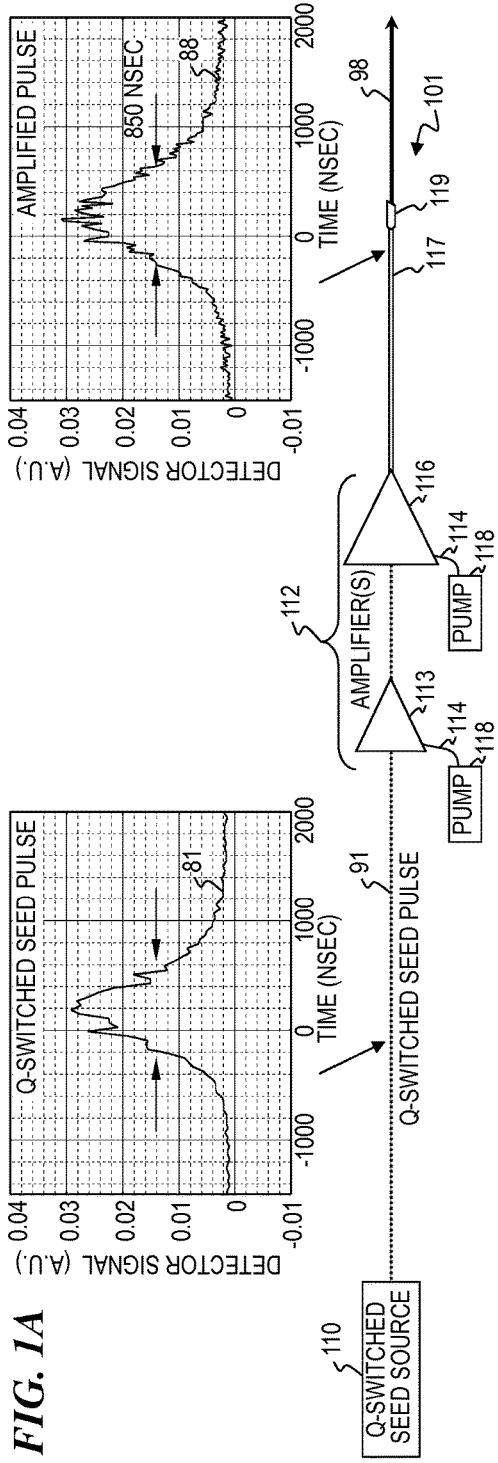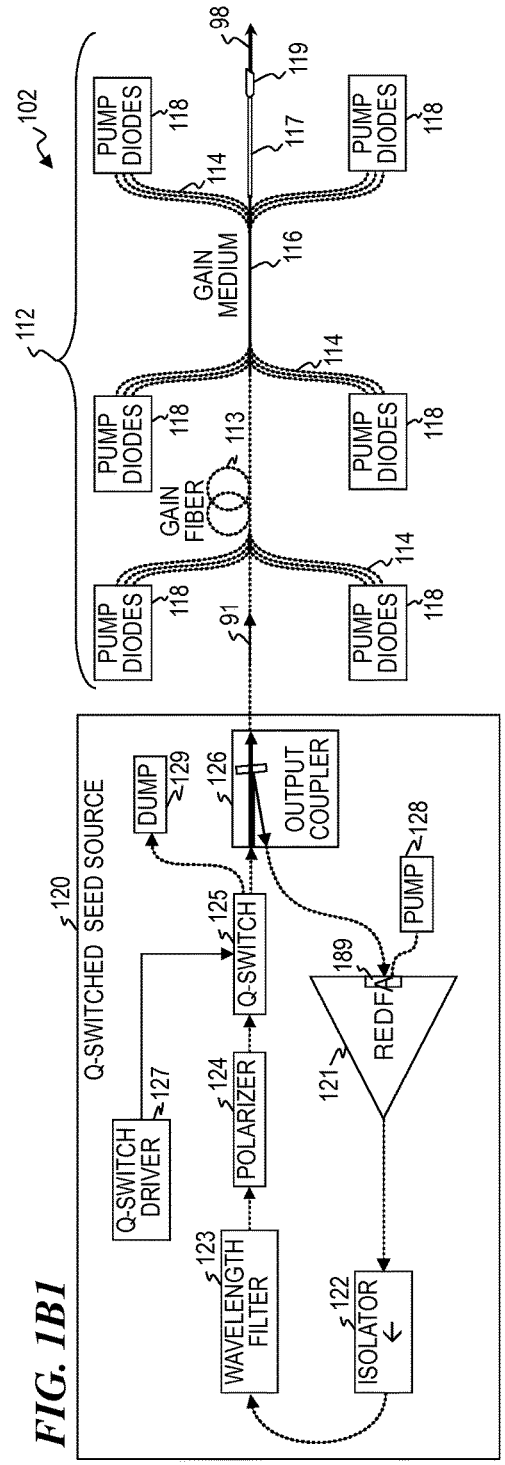

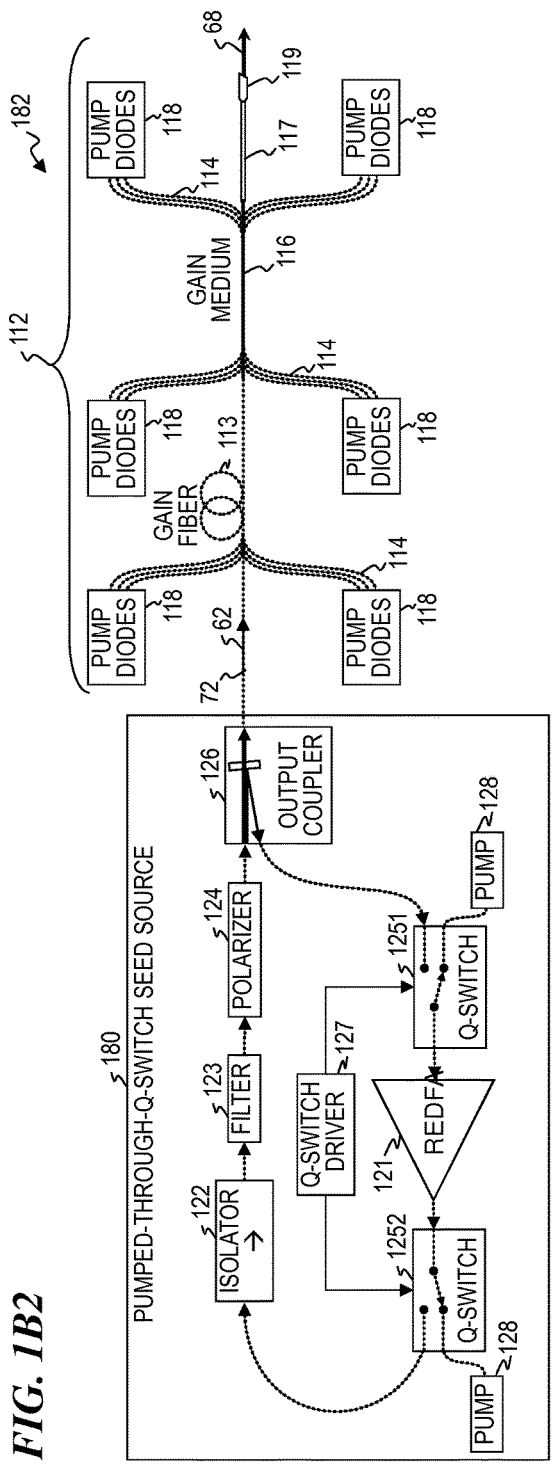
*FIG. 1B2*
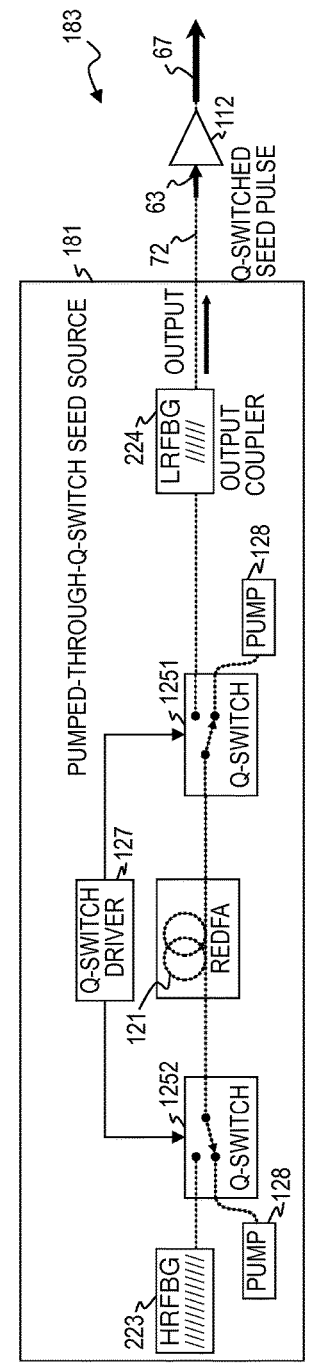
*FIG. 1B3*

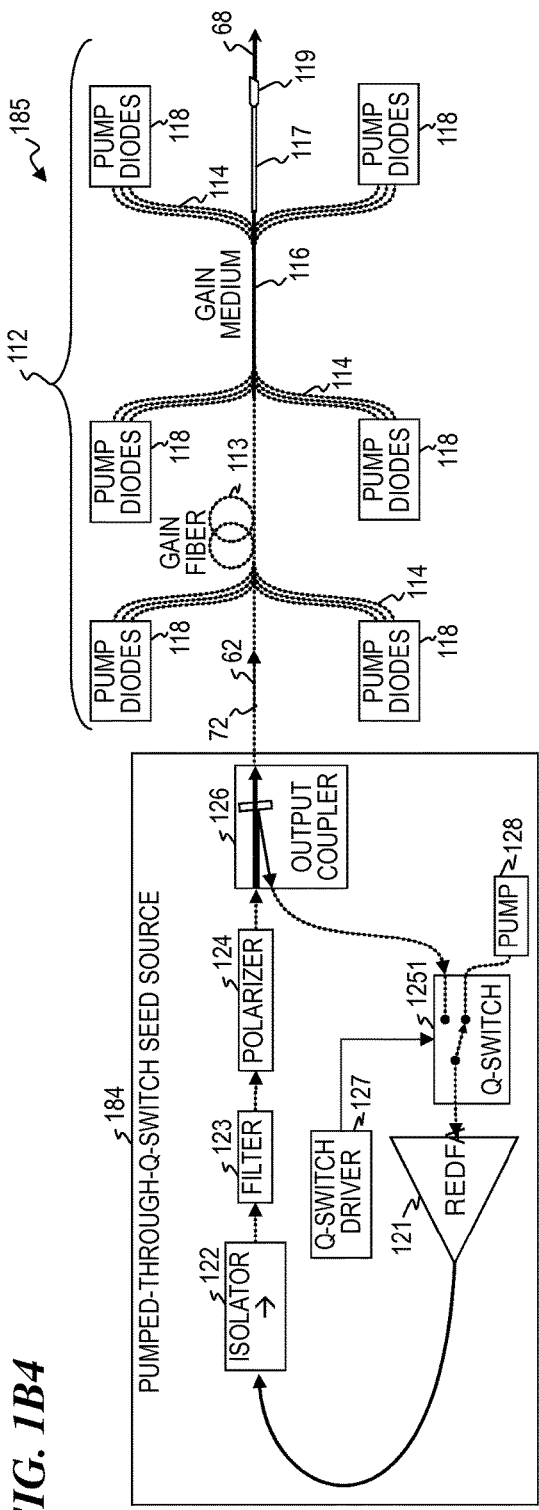
*FIG. 1B4*
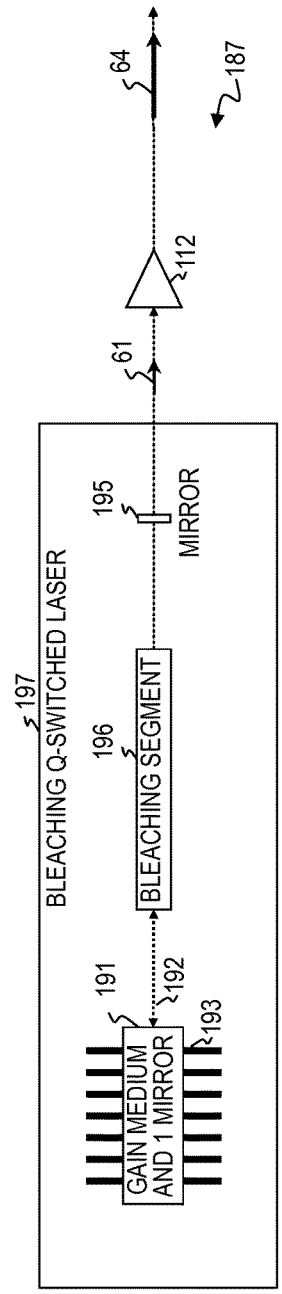
*FIG. 1B5*

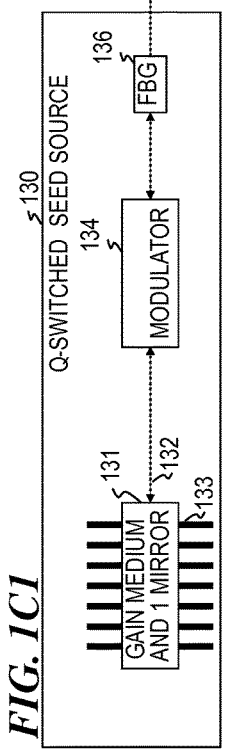
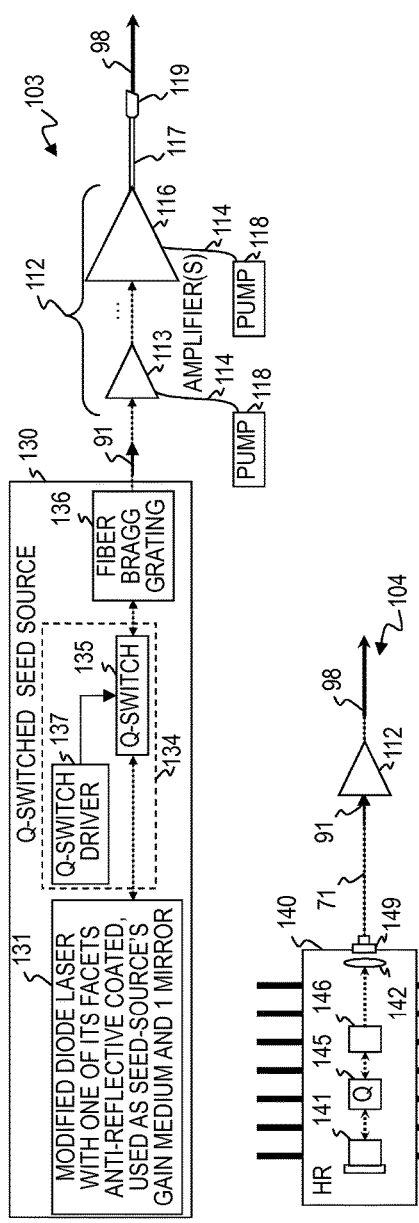
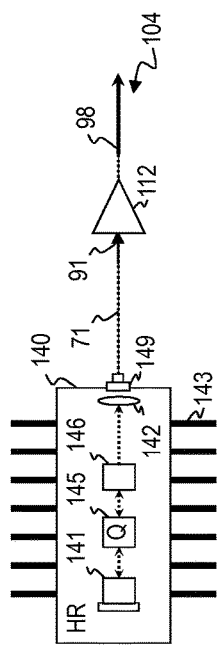
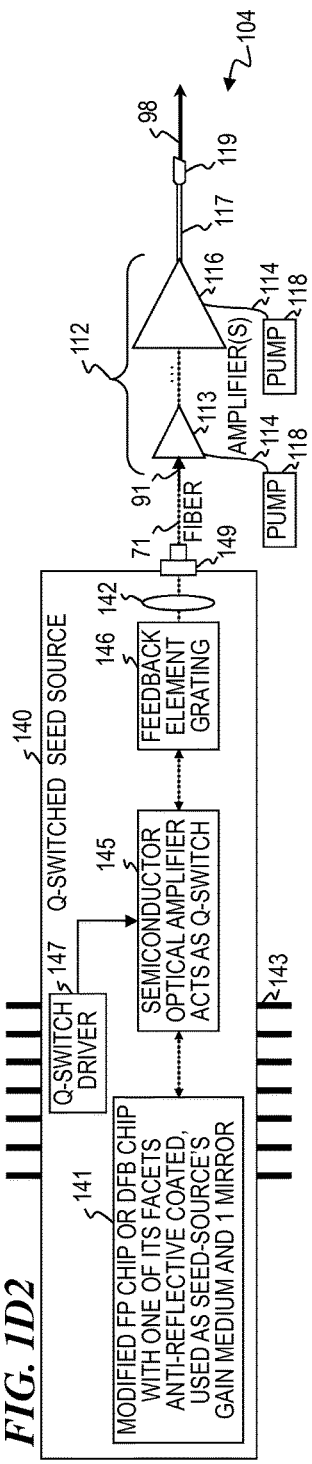

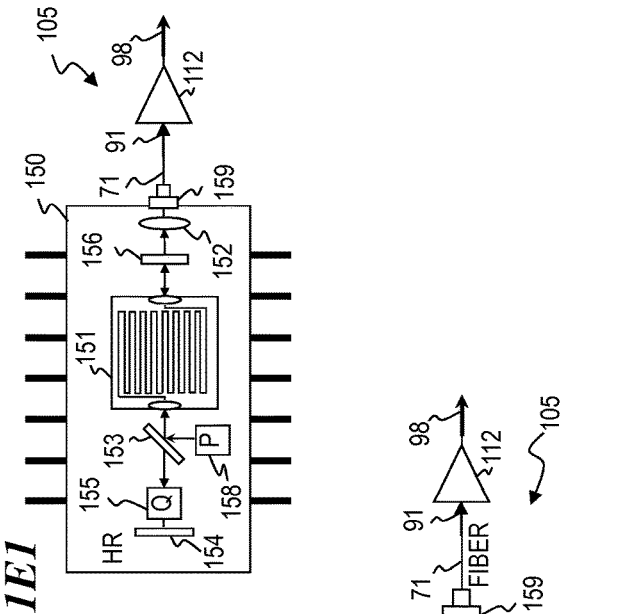
FIG. 1E1
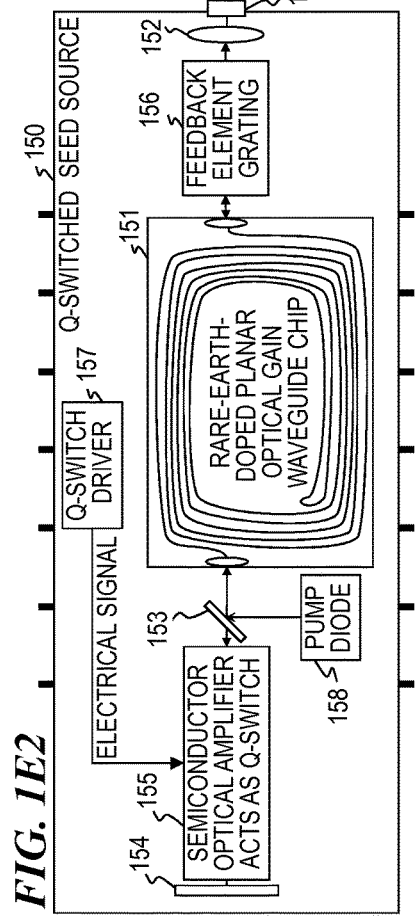
FIG. 1E2
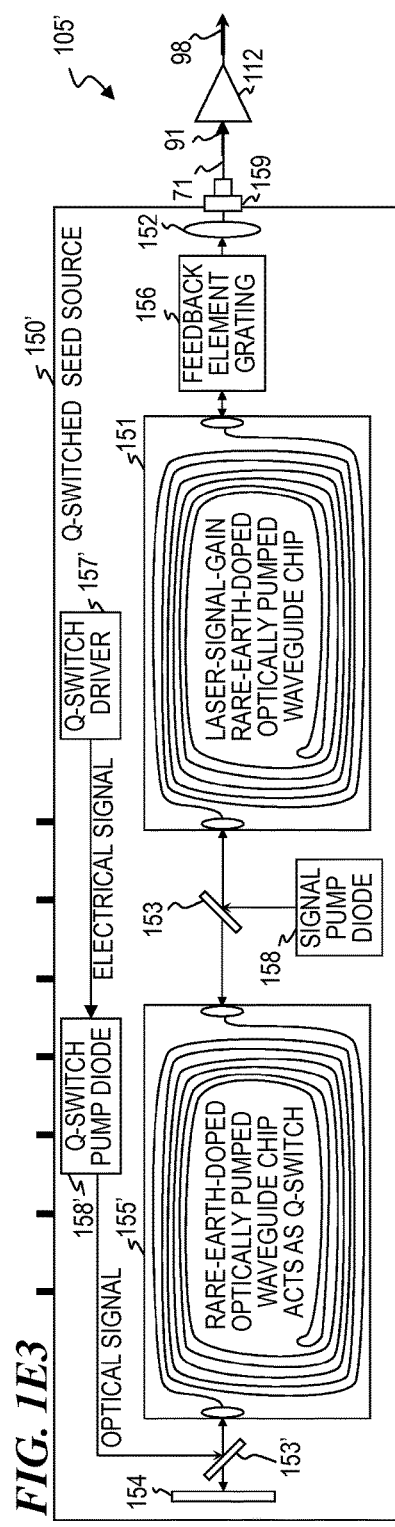
FIG. 1E3

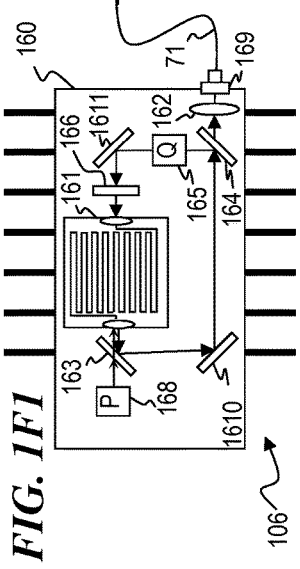
FIG. 1F1
FIG. 1F2
FIG. 1F3

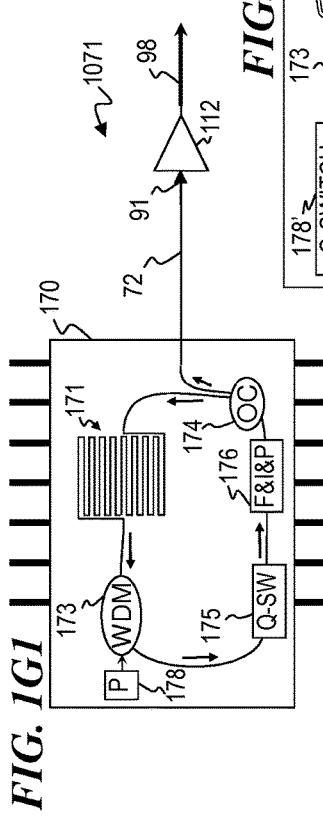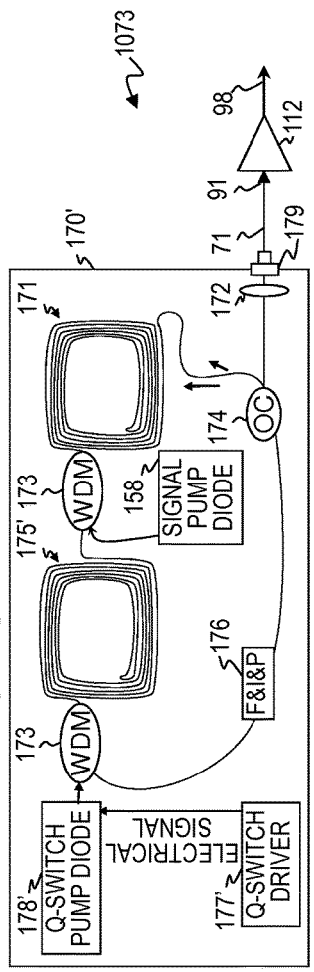
FIG. 1G1
FIG. 1G2
FIG. 1G3

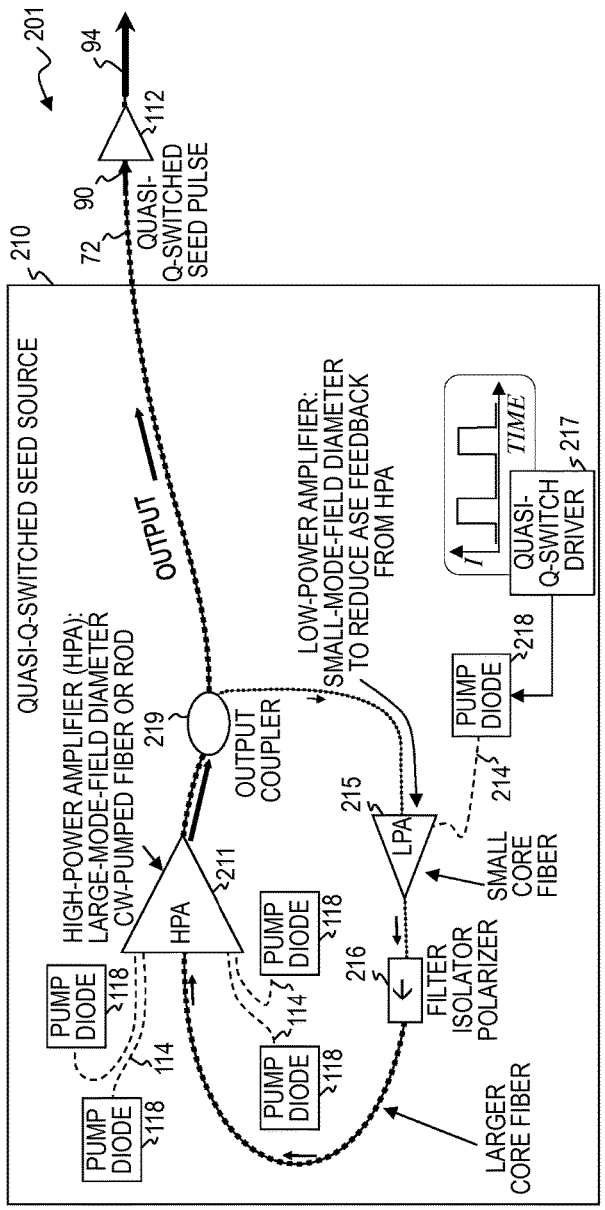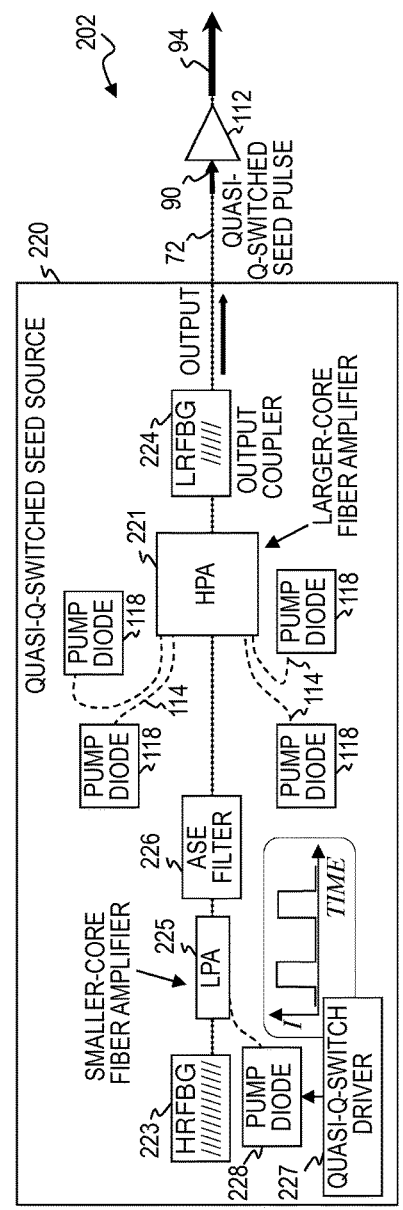
FIG. 2A
FIG. 2B

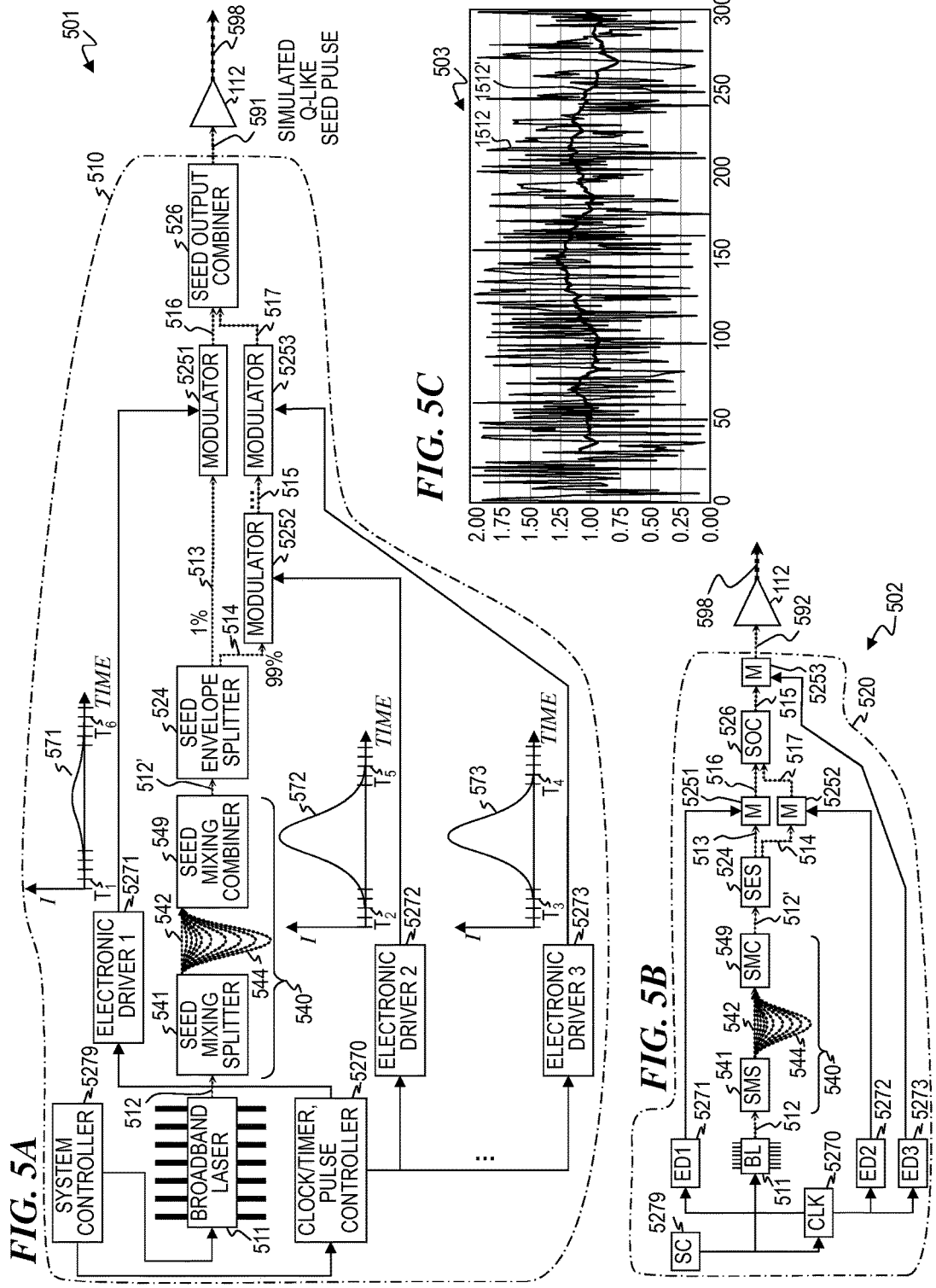

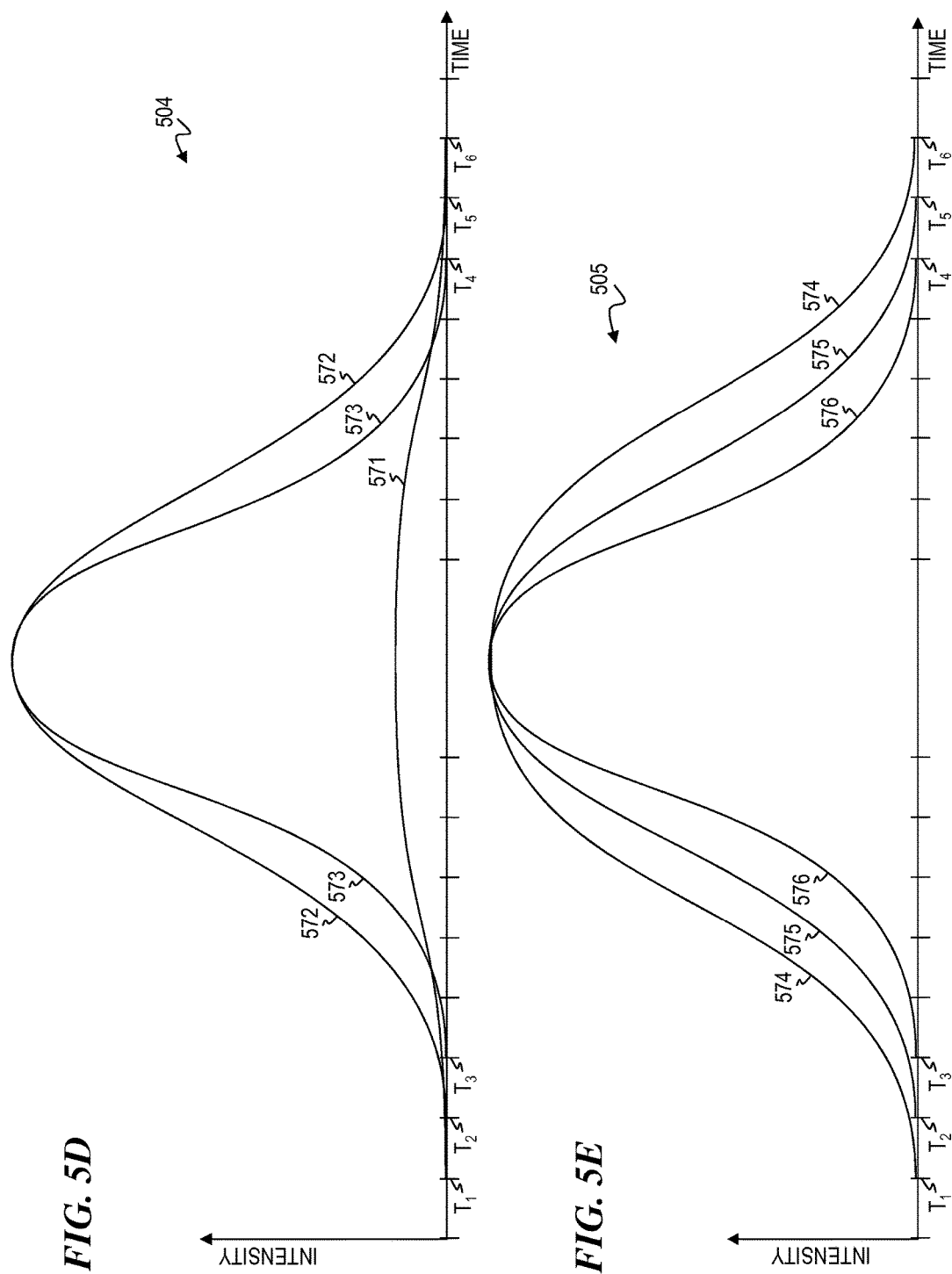

Q-SWITCHED OSCILLATOR SEED-SOURCE FOR MOPA LASER ILLUMINATOR APPARATUS AND METHOD

CROSS-REFERENCE TO RELATED APPLICATIONS

This application is a divisional of and claims benefit of U.S. patent application Ser. No. 12/952,190 filed Nov. 22, 2010, titled "Q-SWITCHED OSCILLATOR SEED-SOURCE FOR MOPA LASER ILLUMINATOR METHOD AND APPARATUS" (which issued as U.S. Pat. No. 8,934,509 on Jan. 13, 2015), which claims priority benefit under 35 U.S.C. § 119(e) to U.S. Provisional Patent Application No. 61/263,736 filed on Nov. 23, 2009 by Matthias P. Savage-Leuchs et al., titled "Q-SWITCHED OSCILLATOR SEED-SOURCE FOR MOPA LASER ILLUMINATOR METHOD AND APPARATUS", each of which is incorporated herein by reference in its entirety.

This invention is related to:

U.S. Provisional Patent Application 61/343,947 filed Apr. 12, 2010 by Matthias P. Savage-Leuchs titled "HIGH-POWER LASER SYSTEM HAVING DELIVERY FIBER WITH NON-CIRCULAR CROSS SECTION FOR ISOLATION AGAINST BACK REFLECTIONS";

U.S. Provisional Patent Application 61/343,948 filed Apr. 12, 2010 by Matthias P. Savage-Leuchs titled "HIGH BEAM QUALITY AND HIGH AVERAGE POWER FROM LARGE-CORE-SIZE OPTICAL-FIBER AMPLIFIERS; SIGNAL AND PUMP MODE-FIELD ADAPTOR FOR DOUBLE-CLAD FIBERS AND ASSOCIATED METHOD";

U.S. patent application Ser. No. 12/854,868 filed Aug. 11, 2010 by Tolga Yilmaz et al. titled "IN-LINE FORWARD/BACKWARD FIBER-OPTIC SIGNAL ANALYZER" (which issued as U.S. Pat. No. 8,755,649 on Jun. 17, 2014);

U.S. Provisional Patent Application 61/343,949 filed Apr. 12, 2010 by Yongdan Hu titled "METHOD AND APPARATUS FOR IN-LINE FIBER-CLADDING-LIGHT DISSIPATION";

U.S. patent application Ser. No. 12/793,508 filed Jun. 3, 2010 by Yongdan Hu titled "METHOD AND APPARATUS FOR IN-LINE FIBER-CLADDING-LIGHT DISSIPATION" (which issued as U.S. Pat. No. 8,355,608 on Jan. 15, 2013);

U.S. patent application Ser. No. 12/861,773 filed Aug. 23, 2010 by Yongdan Hu et al. titled "OPTICAL-FIBER ARRAY METHOD AND APPARATUS" (which issued as U.S. Pat. No. 8,503,840 on Aug. 6, 2013);

U.S. Pat. No. 6,456,756 issued Sep. 24, 2002 to Roy Mead et al., titled "FIBER RAMAN AMPLIFIER PUMPED BY AN INCOHERENTLY BEAM COMBINED DIODE LASER,"

U.S. Pat. No. 7,792,166 titled "APPARATUS AND METHOD FOR DRIVING LASER DIODES" issued Sep. 7, 2010 to Lawrence A. Borschowa;

U.S. Pat. No. 7,620,077 titled "APPARATUS AND METHOD FOR PUMPING AND OPERATING OPTICAL PARAMETRIC OSCILLATORS USING DFB FIBER LASERS" issued Nov. 17, 2009 to Angus J. Henderson;

U.S. Pat. No. 7,539,231 titled "APPARATUS AND METHOD FOR GENERATING CONTROLLED-LINEWIDTH LASER-SEED-SIGNALS FOR HIGH-POWERED FIBER-LASER AMPLIFIER SYSTEMS" issued May 26, 2009 to Eric C. Honea et al.;

U.S. patent application Ser. No. 11/623,058 titled "APPARATUS AND METHOD FOR GENERATING CHIRP-SLICE CONTROLLED-LINEWIDTH LASER-SEED SIGNALS" filed Jan. 12, 2007 by Matthias P. Savage-Leuchs et al. (which issued as U.S. Pat. No. 7,701,987 on Apr. 20, 2010);

U.S. Pat. No. 7,471,705 titled "ULTRAVIOLET LASER SYSTEM AND METHOD HAVING WAVELENGTH IN THE 200-NM RANGE" that issued Dec. 30, 2008 to David C. Gerstenberger et al.;

U.S. Pat. No. 7,391,561 titled "FIBER-OR ROD-BASED OPTICAL SOURCE FEATURING A LARGE-CORE, RARE-EARTH-DOPED PHOTONIC-CRYSTAL DEVICE FOR GENERATION OF HIGH-POWER PULSED RADIATION AND METHOD" that issued Jun. 24, 2008 to Fabio Di Teodoro et al.;

U.S. Pat. No. 7,430,352 titled "MULTI-SEGMENT PHOTONIC-CRYSTAL-ROD WAVEGUIDES FOR AMPLIFICATION OF HIGH-POWER PULSED OPTICAL RADIATION AND ASSOCIATED METHOD" that issued Sep. 30, 2008 to Fabio Di Teodoro et al.;

U.S. Pat. No. 7,379,648 titled "OPTICAL HOLLOW-CORE DELIVERY FIBER AND HOLLOW-ENDCAP TERMINATION AND ASSOCIATED METHOD" that issued May 27, 2008 to Christopher D. Brooks et al.;

U.S. Pat. No. 7,386,211 titled "METHOD AND APPARATUS FOR SPECTRAL-BEAM COMBINING OF MEGAWATT-PEAK-POWER BEAMS FROM PHOTONIC-CRYSTAL RODS" that issued Jun. 10, 2008 to Fabio Di Teodoro et al.;

U.S. Pat. No. 7,400,804 titled "MONOLITHIC OR RIBBON-LIKE MULTI-CORE PHOTONIC-CRYSTAL FIBERS AND ASSOCIATED METHOD" which issued Jul. 15, 2008 to Fabio Di Teodoro et al.;

U.S. Pat. No. 7,429,734 titled "SYSTEM AND METHOD FOR AIRCRAFT INFRARED COUNTER-MEASURES TO MISSILES" that issued Sep. 30, 2008 to Steven C. Tidwell;

U.S. Pat. No. 7,199,924 titled "APPARATUS AND METHOD FOR SPECTRAL-BEAM COMBINING OF HIGH-POWER FIBER LASERS," which issued on Apr. 3, 2007 to Andrew J. W. Brown et al.;

U.S. patent application Ser. No. 11/565,619 titled "METHOD AND APPARATUS FOR OPTICAL GAIN FIBER HAVING SEGMENTS OF DIFFERING CORE SIZES" filed on Nov. 30, 2006 by Matthias P. Savage-Leuchs (which issued as U.S. Pat. No. 7,768,700 on Aug. 3, 2010);

U.S. patent application Ser. No. 12/018,193 titled "HIGH-ENERGY EYE-SAFE PULSED FIBER AMPLIFIERS AND SOURCES OPERATING IN ERBIUM'S L-BAND" filed Jan. 22, 2008 by John D. Minelly et al. (which issued as U.S. Pat. No. 7,872,794 on Jan. 18, 2011); and U.S. patent application Ser. No. 12/624,327 titled "SPECTRALLY BEAM COMBINED LASER SYSTEM AND METHOD AT EYE-SAFER WAVELENGTHS" filed on Nov. 23, 2009 by Roy D. Mead (which issued as U.S. Pat. No. 8,441,718 on May 14, 2013);

which are all incorporated herein in their entirety by reference.

FIELD OF THE INVENTION

The invention relates generally to optical waveguides and more particularly to Q-switched-laser and Q-switched-like seed sources for high-power and high-energy pulsed master-oscillator power-amplifier (MOPA) illuminators, wherein the pulsed-seed sources have a controlled wide dynamic range in order to prevent excessive pulse steepening in high-gain optical-fiber and optical-rod amplifiers.

BACKGROUND OF THE INVENTION

The current state-of-the-art fiber lasers and fiber amplifiers have difficulty in amplifying laser pulses to very large power levels such that the output pulse lasts for about one microsecond or longer, and outputs several millijoules of energy while also avoiding undesired non-linear effects such as stimulated Brillouin scattering (SBS). SBS is exacerbated by long pulse duration (pulses longer than about 5 nanoseconds (nsec)) and by very narrow linewidths (laser signals having a relatively broad linewidth are less likely to cause SBS degradation).

Optical gain fibers doped with rare-earth dopants (such as erbium-doped fiber amplifiers (EDFAs)) enable laser designs where the optical gain fiber is optically pumped over an extended period of time (e.g., 100's or 1000's of microseconds) in order to accumulate a relatively large amount of energy, and an optical seed pulse (a lower-power laser pulse from a laser source) is then launched into the waveguide core of the optical gain fiber to extract the accumulated energy by stimulated-emission amplification. Unfortunately, this typically results in pulse steepening, since the leading edge of the seed pulse encounters the highest gain, while later temporal portions of the pulse will undergo lower amounts of amplification.

One approach to solving the pulse-steepening problem is to shape the seed pulse by amplitude modulation (providing a low-amplitude leading edge for the seed pulse followed by a rising amplitude later in the pulse), but it is quite difficult to provide sufficient dynamic range and fine control to obtain satisfactory energy extraction, pulse shape, and avoidance of non-linear effects. Even when a fiber amplifier or fiber laser is designed to compensate for the above effects, there will be a limit on the maximum power that can be obtained from a single fiber when scaling to larger fiber sizes and/or lengths, pump powers, and the like.

Various inventions use spectral-beam combining. U.S. Pat. No. 6,192,062 to Sanchez-Rubio et al. entitled "Beam combining of diode laser array elements for high brightness and power" and U.S. Pat. No. 6,208,679 to Sanchez-Rubio et al. entitled "High-power multi-wavelength external cavity laser" describe the fundamental techniques of spectral beam combining, and both are incorporated herein by reference.

In some embodiments, the gratings used for spectral-beam combining are "blazed," i.e., formed with V-grooves having sidewall angles that are asymmetrical with respect to a vector normal to the overall surface of the grating. U.S. Pat. No. 3,728,117 to Heidenhain et al. entitled "Optical Diffraction Grid" (incorporated herein by reference) describes a method for making blazed gratings having asymmetric grooves. U.S. Pat. No. 4,895,790 to Swanson et al. entitled "High-efficiency, multilevel, diffractive optical elements" (incorporated herein by reference) describes a method for making blazed gratings having asymmetric grooves using binary photolithography to create stepped profiles. U.S. Pat. No. 6,097,863, titled "Diffraction Grating with Reduced Polarization Sensitivity" issued Aug. 1, 2000 to Chowdhury (incorporated herein by reference) describes a reflective diffraction grating with reduced polarization sensitivity for dispersing the signals. The Chowdhury grating includes facets that are oriented for reducing efficiency variations within a transmission bandwidth and that are shaped for reducing differences between the diffraction efficiencies in two orthogonal directions of differentiation. U.S. Pat. No. 4,313,648 entitled "Patterned Multi-Layer Structure and Manufacturing Method" issued Feb. 2, 1982 to Yano et al. (incorporated herein by reference) describes a manufacturing method for a patterned (striped) multi-layer article.

U.S. Pat. No. 6,822,796 to Takada et al. titled "DIFFRACTIVE OPTICAL ELEMENT" (incorporated herein by reference) describes a method for making blazed gratings having asymmetric grooves with dielectric coatings. U.S. Pat. No. 6,958,859 to Hoose et al. entitled "Grating device with high diffraction efficiency" (incorporated herein by reference) describes a method for making blazed gratings having dielectric coatings.

U.S. Pat. No. 5,907,436 titled "MULTILAYER DIELECTRIC DIFFRACTION GRATINGS" issued May 25, 1999 to Perry et al., and is incorporated herein by reference. This patent describes the design and fabrication of dielectric grating structures with high diffraction efficiency. The gratings have a multilayer structure of alternating index dielectric materials, with a grating structure on top of the multi-layer, and obtain a diffraction grating of adjustable efficiency, and variable optical bandwidth.

U.S. Pat. No. 6,212,310 titled "HIGH POWER FIBER GAIN MEDIA SYSTEM ACHIEVED THROUGH POWER SCALING VIA MULTIPLEXING" issued 3 April 2001 to Waarts et al., and is incorporated herein by reference. This patent describes certain methods of power scaling by multiplexing multiple fiber gain sources with different wavelengths, pulsing or polarization modes of operation is achieved through multiplex combining of the multiple fiber gain sources to provide high power outputs, such as ranging from tens of watts to hundreds of watts, provided on a single mode or multimode fiber.

U.S. Pat. No. 7,532,656 issued to Yang, et al. on May 12, 2009 titled "ALL-SILICON RAMAN AMPLIFIERS AND LASERS BASED ON MICRO RING RESONATORS" and is incorporated herein by reference. This patent describes devices for generating a laser beam. The devices include a silicon optical micro-ring having at least one silicon optical waveguide disposed at a distance from the micro-ring. The radius and the cross-sectional dimension of the micro-ring, the cross-sectional dimension of the waveguide, and the distance between the micro-ring and the waveguide are determined such that one or more pairs of whispering-gallery-mode resonant frequencies of the micro-ring are separated by an optical-phonon frequency of silicon.

U.S. Pat. No. 6,330,388 issued to Bendett, et al. on Dec. 11, 2001 titled "METHOD AND APPARATUS FOR WAVEGUIDE OPTICS AND DEVICES," and U.S. Pat. No. 6,636,678 issued to Bendett, et al. on Oct. 21, 2003, also titled "METHOD AND APPARATUS FOR WAVEGUIDE OPTICS AND DEVICES," and both are incorporated herein by reference. These patents describe optical structures and methods for producing tunable-waveguide lasers. In one embodiment, a waveguide is defined within a glass substrate doped with a rare-earth element or elements by ion diffusion. Feedback elements such as mirrors or reflection gratings in the waveguide further define a laser-resonator cavity so that laser light is output from the waveguide when pumped optically or otherwise. Means are disclosed for varying the wavelengths reflected by the reflection gratings and varying the effective length of the resonator cavity to thereby tune the laser to a selected wavelength. These patents also describe apparatus and method for integrating rare-earth-doped lasers and optics on glass substrates.

U.S. Pat. No. 6,970,494 issued to Bendett, et al. on Nov. 29, 2005 titled "Rare-earth doped phosphate-glass lasers and associated methods" and is incorporated herein by reference. This patent describes integrating lasers and optics on glass substrates. An optical (e.g., laser) component formed from a glass substrate doped with an optically active lanthanides species with a plurality of waveguides defined by channels within the substrate. The laser component optionally includes a monolithic array of individual waveguides in which the waveguides form laser resonator cavities with differing resonance characteristics.

U.S. Pat. No. 6,813,405 issued to Bendett, et al. on Nov. 2, 2004 titled "Compact apparatus and method for integrated photonic devices having folded directional couplers" and is incorporated herein by reference. This patent describes an integrated photonic apparatus that includes a glass substrate having a major surface, a first waveguide segment and a second waveguide segment, and a folded evanescent coupler connecting the first waveguide segment to the second. The folded evanescent coupler is formed by a first length of the first waveguide segment and an equivalent length portion of the second waveguide running parallel and adjacent to the first waveguide segment. The first length is substantially equal to one half of an evanescent-coupler length needed to transfer a first wavelength in a non-folded evanescent coupler. A reflector (e.g., dielectric mirror that is highly reflective to light of the first wavelength and also highly transmissive to light of a second wavelength) is located at an end of the folded evanescent coupler.

U.S. Pat. No. 6,493,476 issued to Bendett on Dec. 10, 2002 titled "APPARATUS AND METHOD FOR INTEGRATED PHOTONIC DEVICES HAVING GAIN AND WAVELENGTH-SELECTIVITY" and is incorporated herein by reference. This patent describes an integrated photonic apparatus that includes a glass substrate having a major surface, wherein the glass substrate includes a plurality of regions, each region having a different index of refraction, including a first region having a first index of refraction and a second region having a second index of refraction lower than the first index of refraction, and a first waveguide formed along the major surface of the substrate, wherein the first waveguide has a higher index of refraction than an intrinsic index of refraction of adjacent portions of the substrate, and wherein the first waveguide passes through the first region and through the second region of the glass substrate.

U.S. Pat. No. 7,403,677, to Zhao, et al., which issued Jul. 22, 2008 titled "Fiberoptic reconfigurable devices with beam shaping for low-voltage operation," is incorporated herein by reference. U.S. Pat. No. 7,403,677 describes an apparatus and method to operate on a light beam by using a lens that collimates the light beam to a collimated beam with at least one cross-sectional dimension less than a critical dimension of 400 microns or less over a working range WR. The apparatus has a bulk electro-optic material of small thickness, e.g., less than 300 microns positioned within a working range and the collimated beam traverses it along its path. The apparatus has a voltage source for applying a low operating or drive voltage, e.g. less than 400 V, to the bulk electro-optic material for performing an operation on the collimated beam. The lens for collimating the light beam is a free-space collimator such as a graded index (GRIN) lens or preferably a C-lens. U.S. Pat. No. 4,778,237 to Sorin, et al. issued Oct. 18, 1988 titled "Single-mode fiber optic saturable absorber" is incorporated herein by reference. U.S. Pat. No. 4,778,237 describes fiber optic saturable absorber for processing optical signals comprises an optical fiber from which a portion of the cladding is removed to form a facing surface. A light-absorbing substance having non-linear light-absorbing characteristics is applied to the facing surface such that a portion of the optical signal energy is transferred from the fiber to the substance where it is absorbed. The device selectively attenuates the optical signal and noise, and can be used to reduce pulse waveform distortion caused by pulse broadening and by amplification of system noise.

U.S. Pat. No. 6,396,975 to Wood et al. issued May 28, 2002 titled "MEMS optical cross-connect switch" and is incorporated herein by reference. U.S. Pat. No. 6,396,975 describes a MEMS (microelectromechanical) structure capable of switching optical signals from an input fiber to one of two or more output fibers. In one embodiment, the MEMS optical cross-connect switch comprises a first microelectronic substrate having a pop-up mirror disposed on the surface of the substrate and a rotational magnetic field source, such as a variably controlled magnetic field source. The rotational magnetic field source allows for reliable actuation of the pop-up minor from a non-reflective state to a reflective state. Additionally the invention is embodied in a MEMS optical cross-connect switch having a first microelectronic substrate having a pop-up minor disposed on the surface of the substrate and a positioning structure disposed in a fixed positional relationship relative to the first substrate. The positioning structure may comprise a positioning structure extending from a second microelectronic substrate that is in a fixed positional relationship relative to the first microelectronic substrate. The positioning structure serves to restrict further movement of the pop-up minor when the pop-up minor has been actuated into a reflective state.

U.S. Pat. No. 4,778,237 to Sorin, et al. Oct. 18, 1988 "Single-mode fiber optic saturable absorber", is incorporated herein by reference. U.S. Pat. No. 4,778,237 describes fiber optic saturable absorber for processing optical signals comprises an optical fiber from which a portion of the cladding is removed to form a facing surface. A light-absorbing substance having non-linear light-absorbing characteristics is applied to the facing surface such that a portion of the optical signal energy is transferred from the fiber to the substance where it is absorbed. The device selectively attenuates the optical signal and noise, and can be used to reduce pulse waveform distortion caused by pulse broadening and by amplification of system noise.

U.S. Pat. No. 7,203,209 to Young, et al. Apr. 10, 2007 titled "System and method for a passively Q-switched, resonantly pumped, erbium-doped crystalline laser", is incorporated herein by reference. U.S. Pat. No. 7,203,209 describes a laser that includes a resonant cavity formed between a first mirror and a second mirror. An unsensitized erbium-doped crystal gain medium for producing laser gain is disposed within the resonant cavity. A saturable absorber is disposed within the resonant cavity. A pump source is positioned to energize the gain medium. The saturable absorber, the laser gain, the resonator length, and the second minor being selected so that output pulses having a duration of less than 75 nanoseconds are generated by the laser.

The present invention can be used with or combined with any of the prior-art patents described herein to obtain novel and non-obvious combinations, including spectral-beam-combined laser beams from fiber lasers for directed energy (DE) weapons, for example as being proposed for the U.S. robust electric-powered laser initiative (RELI). In some embodiments, the present invention produces a high-power laser that pumps Raman-fiber amplifiers or lasers for DE at eye-safer wavelengths.

There is a need for improved laser systems, particularly Q-switched fiber lasers and/or fiber optical amplifiers for use in MOPA designs. While other fiber-laser alternatives are available, the present invention provides improved performance (higher output power) and/or lower cost.

SUMMARY OF THE INVENTION

In some embodiments, the present invention provides an apparatus, method and system that uses a Q-switched laser as a seed source having a controlled high-dynamic-range amplitude that avoids and/or compensates for pulse steepening in high-gain optical-fiber amplification of long-duration laser pulses. In some embodiments, the output is used for illumination purposes (e.g., illuminating a scene for image acquisition). In some embodiments, well-controlled pulse shapes are obtained having a wide dynamic range, long duration, and not-too-narrow linewidth. In some embodiments, upon the opening of a Q-switch in an optical cavity having a gain medium, the amplification builds relatively slowly, wherein each round trip through the gain medium increases the amplitude of the optical pulse. This configuration results in an optical pulse having a very wide dynamic (i.e., very low amplitude after one round trip and a relatively slow and controlled increase in amplitude over time as the light passes again and again through the gain medium).

As used herein, a Q-switch is an optical element residing within a laser cavity that is considered "closed" or "off" when it propagates insufficient signal to allow lasing (i.e., a sub-threshold amount of light of the lasing-signal wavelength, typically allowing minimal or no signal to circulate) in the laser cavity, and is considered "open" or "on" when it propagates sufficient signal to allow lasing (i.e., an above-threshold amount of light of the lasing-signal wavelength, typically allowing maximal or all signal to circulate) in the laser cavity. Typically, the Q-switch is configured as a variably transmissive element, wherein the Q-switch transmits signal light when the Q-switch is "on" and does not transmit signal light when the Q-switch is "off". In other embodiments, the Q-switch is configured as a variable-transparency semiconductor element, wherein a Q-switch driver circuit supplies sufficient electrical power to make the semiconductor transparent to allow lasing when the Q-switch is "on" and does not supply sufficient electrical power for transparency to allow lasing when the Q-switch is "off", and in some such embodiments, this same semiconductor element also provides additional optical gain when sufficient electrical power is applied. In still other embodiments, the Q-switch is configured as a variable-reflectance element, wherein the Q-switch reflects sufficient signal to cause lasing in the laser cavity when the Q-switch is "on" and does not reflect sufficient signal to allow lasing when the Q-switch is "off".

In some embodiments, the Q-switch itself is gradually opened (rather than going from fully closed to fully open) under electronic control to provide additional fine-grain control over the rate of amplitude increase. In some embodiments, an acousto-optic modulator (AOM) is used as the Q-switch, and is electrically controlled to turn on more slowly (e.g., in some embodiments, it is driven by a controlled-slope ramped pulse) than it would open if fully driven (e.g., if driven by a square pulse).

In some embodiments, the present invention provides a rare-earth-doped (RE-doped) optical gain fiber in a Q-switched ring-seed-laser configuration that includes an optical isolator to help force unidirectional light travel around the ring, an optical bandpass filter to help narrow and control the linewidth of the seed signal, a polarizer and/or polarization-maintaining fiber to polarize the seed signal, a Q-switch driver operatively coupled to a Q-switch to control the temporal pulse shape, and an output coupler that couples a portion of the seed signal as feedback to the laser ring and couples another portion of the seed signal out to one or more external optical power amplifiers. The high dynamic range and amplitude control of the seed signal prevents or compensates for pulse steepening that otherwise would occur using the same one or more external optical power amplifiers and a conventional seed pulse in a master-oscillator power-amplifier (MOPA) configuration.

In some embodiments, the present invention provides a "Q-switched seed signal" from a Q-switched laser, such as shown in FIG. 1A, FIG. 1B1, FIG. 1B2, FIG. 1B3, FIG. 1C1, FIG. 1C2, FIG. 1D1, FIG. 1D2, FIG. 1E1, FIG. 1E2, FIG. 1E3, FIG. 1F1, FIG. 1F2, FIG. 1F3, FIG. 1G1, FIG. 1G2 and FIG. 1G3 described below. In other embodiments, the present invention provides "quasi-Q-switch seed signal" from a quasi-Q-switched laser that uses a pulse-pumped small-core gain fiber in place of a Q-switch, in a configuration that uses a large-core gain fiber to accumulate lasing energy for the seed pulse, such as shown in FIG. 2A and FIG. 2B described below. In yet other embodiments, the present invention provides "Q-like seed signal" from a conventional laser or a controlled-linewidth amplified-spontaneous-emission (ASE) device that has its output modulated using a plurality of optical-amplitude modulators to form a high-dynamic-range pulse having a very slowly rising leading edge whose slope increases later in time to form a seed pulse that has a leading edge much like a Q-switched seed signal, using apparatus such as shown in FIG. 5A, FIG. 5B and FIG. 5E described below.

As used herein, a "Q-seed signal" is a generic term for a signal having a Gaussian or Gaussian-like temporal intensity shape that includes Q-switched seed signals, quasi Q-switched seed signals, and Q-like seed signals. As used herein, a "Q-seed source" is a generic term for a pulsed light source that generates Q-seed signals. As used herein, "light" signals and "optical" signals each include electromagnetic radiation (EMR) of any wavelength between about 100 nm and about 400 nm (generally referred to as ultraviolet light), between about 400 nm and about 700 nm (visible light from violet to red, although the exact wavelengths that define the edges of this visibility-spectrum range, i.e., the wavelengths that can be perceived by human, may vary based on the individual and the intensity of the light) or between about 700 nm and about 10,000 nm (generally referred to as infrared light). In addition, in some embodiments, the present invention contemplates using EMR signals having wavelengths shorter than 100 nm or longer than 10,000 nm.

In some embodiments, the present invention provides a MOPA device that uses Q-seed signals from a Q-seed source that are amplified by a fiber- or rod-based power amplifier or power amplifier chain (a series of fiber- or rod-based gain media) that amplify the Q-seed signal to very high powers substantially without pulse steepening.

In some embodiments, the novel seed sources of the present invention are very compact, rugged and cost effective. In some embodiments, the novel seed sources have potential to generate pulses as short as 5 nsec or less. In some embodiments, the Q-switched seed source uses a solid-state amplifier as its Q-switch. In some embodiments, the Q-switched seed signal incurs no pulse steepening in fiber-amplifier stages, including power-amplifier stages. In some embodiments, the Q-switched seed signal incurs no stimulated Brillouin scattering (SBS) or modulation instabilities. In some embodiments, the present invention uses a co-propagating pumping scheme with minimum spectral broadening. In some embodiments, the linewidth is tailored to minimize speckles. In some embodiments, the linewidth is tailored to match wavelength filters used in the detection subsystem of the illuminator-detector system.

The present invention is also of importance for narrow-band amplification because pulse steepening does not occur and therefore the linewidths of the pulses do not decrease.

In some embodiments, the present invention provides Gaussian-type high-pulse-energy pulses from fiber-based systems.

The Q-switched pulses generated by the present invention show self-phase modulation as a nonlinearity. However, the Q-switched pulses generated by the present invention do not show four-wave mixing, which leads to spectral broadening of the signal pulse to wavelengths outside the power-amplifier bandwidth, and thereby clamping of the energy extraction capability of the power amplifier.

The present invention enables higher-pulse-energy signals that provide a longer range for illuminators for long-range image-acquisition systems (illuminating scenes for cameras), and improved light-distancing-and-ranging (LI-DAR) systems.

Another aspect of some embodiments of the invention is the use of one-port-by-two-port (1×2) electrically controlled optical switches to provide the dual functions of Q-switching the signal light in the lasing cavity as well as switching off the path to the pump lasers when the Q-switch is on in order to protect the pump lasers from high-power signal pulses.

Yet another aspect of some embodiments of the invention is the use of a noise averager that reduces the amplitude-variation noise of a laser seed source. In some embodiments, such noise is reduced by the noise averager that divides the signal into a plurality of portions, then delays each portion by a different amount of time (e.g., by passing each portion through a different-length surface waveguide of a planar optical device or through an optical fiber of a different length), and then recombines (mixes) the delayed portions with each other.

In other embodiments, the present invention is used for 1.94-micron medical lasers. In still other embodiments, it is used in material-processing systems. In yet other embodiments, the present invention is used for infrared countermeasures (IRCM). In some embodiments, the present invention provides a very rugged apparatus that enables military-specification-qualified (mil-spec-qualified) high-pulse-energy laser systems.

The present invention is also of importance for military tactical systems, and defense Advanced Programs, as well as for the illuminator market, active imaging, material processing, medical applications (2-micron-wavelength version), IRCM; military applications, surveillance systems, medical systems, industrial applications, laser for DIALs.

BRIEF DESCRIPTION OF THE DRAWINGS

FIG. 1A is a block diagram of a subsystem 101 that includes a Q-switched laser seed source 110 that outputs a seed pulse 91 (shown as graphed plot 81) that is amplified by high-power amplifier 112 that outputs an amplified pulse 98 (shown as graphed plot 88), according to some embodiments of the present invention.

FIG. 1B1 is a block diagram of a subsystem 102 that includes a Q-switched laser seed source 120 that outputs a seed pulse 91 that is amplified by high-power amplifier 112 that outputs an amplified pulse 98, according to some embodiments of the present invention.

FIG. 1B2 is a block diagram of a subsystem 182 that includes a pumped-through-Q-switch ring-laser seed source 180 that outputs a seed pulse 62 that is amplified by high-power amplifier 112 that outputs an amplified pulse 68, according to some embodiments of the present invention.

FIG. 1B3 is a block diagram of a subsystem 183 that includes a pumped-through-Q-switched laser seed source 181 that outputs a seed pulse 63 that is amplified by high-power amplifier 112 that outputs an amplified pulse 67, according to some embodiments of the present invention.

FIG. 1B4 is a block diagram of a subsystem 185 that includes a pumped-through-Q-switch ring-laser seed source 184 that outputs a seed pulse 62 that is amplified by high-power amplifier 112 that outputs an amplified pulse 68, according to some embodiments of the present invention.

FIG. 1B5 is a block diagram of a subsystem 187 that includes a bleached pulse Q-switch source 197 that outputs a seed pulse 61 that is amplified by high-power amplifier 112 that outputs an amplified pulse 64, according to some embodiments of the present invention.

FIG. 1C1 is a schematic diagram of a subsystem 103 that includes a Q-switched laser seed source 130 that outputs a seed pulse 91 that is amplified by high-power amplifier 112 that outputs an amplified pulse 98, according to some embodiments of the present invention.

FIG. 1C2 is a block diagram of subsystem 103 that includes Q-switched laser seed source 130 that outputs a seed pulse 91 that is amplified by high-power amplifier 112 that outputs an amplified pulse 98, according to some embodiments of the present invention.

FIG. 1D1 is a schematic diagram of a subsystem 104 that includes a flat-pack packaged semiconductor-laser-based Q-switched laser seed source 140 that outputs a seed pulse 91 that is amplified by high-power amplifier 112 that outputs an amplified pulse 98, according to some embodiments of the present invention.

FIG. 1D2 is a block diagram of subsystem 104 that includes Q-switched laser seed source 140 that outputs a seed pulse 91 that is amplified by high-power amplifier 112 that outputs an amplified pulse 98, according to some embodiments of the present invention.

FIG. 1E1 is a schematic diagram of a subsystem 105 that includes a flat-pack packaged rare-earth-doped-laser-based Q-switched laser seed source 150 that outputs a seed pulse 91 that is amplified by high-power amplifier 112 that outputs an amplified pulse 98, according to some embodiments of the present invention.

FIG. 1E2 is a block diagram of subsystem 105 that includes Q-switched laser seed source 150 that uses a semiconductor optical amplifier as a Q-switch and outputs a seed pulse 91 that is amplified by high-power amplifier 112 that outputs an amplified pulse 98, according to some embodiments of the present invention.

FIG. 1E3 is a block diagram of subsystem 105' that includes Q-switched laser seed source 150' that uses an optically pumped planar waveguide optical amplifier 155' as a Q-switch and outputs a seed pulse 91 that is amplified by high-power amplifier 112 that outputs an amplified pulse 98, according to some embodiments of the present invention.

FIG. 1F1 is a schematic diagram of a subsystem 106 that includes a flat-pack packaged rare-earth-doped-laser-based Q-switched ring-laser seed source 160 that outputs a seed pulse 91 that is amplified by high-power amplifier 112 that outputs an amplified pulse 98, according to some embodiments of the present invention.

FIG. 1F2 is a block diagram of subsystem 106 that includes Q-switched ring-laser seed source 160 that outputs a seed pulse 91 that is amplified by high-power amplifier 112 that outputs an amplified pulse 98, according to some embodiments of the present invention.

FIG. 1F3 is a block diagram of an alternative subsystem 106' that includes Q-switched laser seed source 160' that uses an optically pumped planar waveguide optical amplifier 165' as a Q-switch and outputs a seed pulse 91, which is amplified by high-power amplifier 112 that outputs an amplified pulse 98, according to some embodiments of the present invention.

FIG. 1G1 is a schematic diagram of a subsystem 1071 that includes a flat-pack packaged rare-earth-doped-laser-based Q-switched ring-laser seed source 170 that outputs a seed pulse 91 that is amplified by high-power amplifier 112 that outputs an amplified pulse 98, according to some embodiments of the present invention.

FIG. 1G2 is a block diagram of subsystem 1072 that includes Q-switched ring-laser seed source 170 that outputs a seed pulse 91 that is amplified by high-power amplifier 112 that outputs an amplified pulse 98, according to some embodiments of the present invention.

FIG. 1G3 is a block diagram of an alternative subsystem 1073 that includes Q-switched laser seed source 170' that uses an optically pumped planar waveguide optical amplifier 175' as a Q-switch and outputs a seed pulse 91, which is amplified by high-power amplifier 112 that outputs an amplified pulse 98, according to some embodiments of the present invention.

FIG. 2A is a block diagram of subsystem 201 that includes a quasi-Q-switched ring-laser seed source 210 that outputs a quasi-Q-switched seed pulse 90 that is amplified by high-power amplifier 112 that outputs an amplified quasi-Q-switched pulse 94, according to some embodiments of the present invention.

FIG. 2B is a block diagram of subsystem 202 that includes a quasi-Q-switched laser seed source 220 that outputs a quasi-Q-switched seed pulse 90 that is amplified by high-power amplifier 112 that outputs an amplified quasi-Q-switched pulse 94, according to some embodiments of the present invention.

FIG. 5A is a schematic diagram of a subsystem 501 that includes a laser-and-serial/parallel-modulator combination (called a Q-like-seed-pulse generator) 510 that outputs a Q-like-seed pulse 591 that is amplified by high-power amplifier 112 that outputs an amplified pulse 598, according to some embodiments of the present invention.

FIG. 5B is a schematic diagram of a subsystem 502, an alternative embodiment in which seed source 520 has only modulators 5251 and 5252 being coupled in parallel, and their respective outputs are coupled together by combiner 526, the output of which is then connected serially through modulator 5253.

FIG. 5C is a schematic graph 503 showing plot 1512 of a simulated noise signal 512 (see FIG. 5A and FIG. 5B) and a plot 1512' of a noise-reduced signal 512' (see FIG. 5A and FIG. 5B) obtained by averaging thirty-two portions, each delayed by a different time amount.

FIG. 5D is a schematic graph 504 showing plots of idealized electrical pulses 571, 572, and 573 used to drive respective optical modulators (e.g., modulators 5251, 5252, and 5253 in some embodiments of subsystem 501 of FIG. 5A or some embodiments of subsystem 502 of FIG. 5B).

FIG. 5E is a schematic graph 505 showing plots of idealized electrical pulses 574, 575, and 576 used to drive respective optical modulators (e.g., modulators 5254, 5255, and 5256 in some embodiments of subsystem 506 of FIG. 5F).

DETAILED DESCRIPTION

Figure 3A:
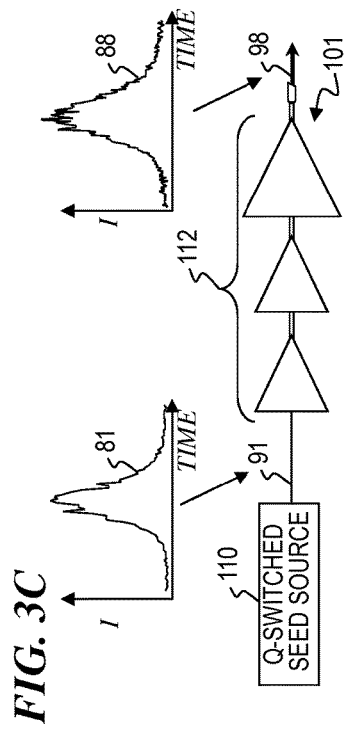
FIG. 3A is a block diagram of a subsystem 301 that includes a conventionally modulated ramped-pulse laser seed source 50 that outputs a ramped seed pulse 92 (shown as graphed plot 82) that is amplified by high-power amplifier 112 that outputs an amplified pulse 93 (shown as graphed plot 83).

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component that appears in multiple figures. Signals and connections may be referred to by the same reference number or label, and the actual meaning will be clear from its use in the context of the description. In the descriptions herein, reference numbers in the various figures that are not explicitly described in the description of a particular respective figure refer to corresponding elements or signals that are as described for the same reference number in earlier-described figures.

According to the present invention, a relatively low-power Q-switched pulse from a "master oscillator" laser is used as the seed signal that is amplified by an optical-power amplifier in a highly pumped master-oscillator power-amplifier system that includes optical-fiber and/or optical-rod gain media for at least some of the laser and/or gain sections (the one or more gain sections after the master oscillator are referred to herein as the amplifier chain). Some such systems are used as pulsed illuminators for image acquisition. In some embodiments, the output pulses are on the order of 1 microsecond full-width half-maximum (FWHM) in duration. In other embodiments, the pulse duration is between about 0.1 microsecond and about 10 microseconds. In yet other embodiments, the Q-switched seed pulse duration is as short as 1 to 2 nanoseconds. Conventional systems having high-amplification fiber or rod optical-gain media store large amounts of energy from a pump source until a pulse arrives such that the leading edge of the pulse is highly amplified and later portions of the pulse achieve lower amplification, which leads to pulse steepening and high peak power, which lead to undesirable non-linear effects such as SBS. One way to address this is to provide an optical modulator configured to amplitude-modulate a laser signal to form the seed pulse, and to thus ramp the seed pulse from an initially low intensity (which experiences the highest gain from the amplifier chain) to a high intensity later in the pulse (when the stored energy has been partially used up and accordingly there is less amplification from the amplifier chain).

In some embodiments, the present invention provides a seed pulse from a Q-switched laser cavity. In some embodiments, the Q-switched laser cavity is configured as a ring laser, while in other embodiments, a linear-laser-cavity configuration is used. When the Q-switch in the Q-switched laser cavity is opened (e.g., from fully closed to fully open), the intensity of the signal in the cavity builds over a time that is related to the cavity length (with each round trip through the gain medium, the pulse intensity increases until the energy stored in the cavity is depleted, and thus the cavity length and/or geometry at least in part controls the temporal pulse shape). In some embodiments, the Q-switch in the Q-switched laser cavity is driven by a temporally shaped pulse (e.g., a ramped pulse), in order to achieve additional control over the temporal shape of the seed pulse. In some embodiments, a bandpass wavelength filter is used in the Q-switched laser cavity to control the lasing wavelength and linewidth of the seed signal pulse such that the signal pulse is spectrally broad enough to prevent stimulated Brillouin scattering (SBS). In addition, the Q-switched seed pulse has a plurality of longitudinal lasing modes that make the seed pulse spectrally broad enough to prevent SBS.

In some embodiments, the systems described herein are combined with other systems or elements such that amplified output pulse is processed further (e.g., by further amplification such as described in U.S. Pat. No. 7,430,352 titled "MULTI-SEGMENT PHOTONIC-CRYSTAL-ROD WAVEGUIDES FOR AMPLIFICATION OF HIGH-POWER PULSED OPTICAL RADIATION AND ASSOCIATED METHOD" which issued Sep. 30, 2008; or by spectral-beam combining such as described in U.S. Pat. No. 7,386,211 titled "METHOD AND APPARATUS FOR SPECTRAL-BEAM COMBINING OF MEGAWATT-PEAK-POWER BEAMS FROM PHOTONIC-CRYSTAL RODS" which issued Jun. 10, 2008 and U.S. Pat. No. 7,199,924 titled "APPARATUS AND METHOD FOR SPECTRAL-BEAM COMBINING OF HIGH-POWER FIBER LASERS," which issued on Apr. 3, 2007; or by operating in a particular wavelength region such as described in U.S. patent application Ser. No. 12/018,193 titled "HIGH-ENERGY EYE-SAFE PULSED FIBER AMPLIFIERS AND SOURCES OPERATING IN ERBIUM'S L-BAND" filed Jan. 22, 2008 (which issued as U.S. Pat. No. 7,872,794 on Jan. 18, 2011); or by non-linear wavelength conversion such as an optical parametric oscillator (OPO) as described in U.S. Pat. No. 7,620,077 titled "APPARATUS AND METHOD FOR PUMPING AND OPERATING OPTICAL PARAMETRIC OSCILLATORS USING DFB FIBER LASERS" that issued Nov. 17, 2009, or by wavelength doubling, tripling, quadrupling, or quintupling as described in U.S. Pat. No. 7,471,705 titled "ULTRAVIOLET LASER SYSTEM AND METHOD HAVING WAVELENGTH IN THE 200-NM RANGE" that issued Dec. 30, 2008, or by Raman-wavelength lengthening and spectral-beam combining (SBC) such as described in U.S. patent application Ser. No. 12/624,327 titled "SPECTRALLY BEAM COMBINED LASER SYSTEM AND METHOD AT EYE-SAFER WAVELENGTHS" filed on Nov. 23, 2009 by Roy D. Mead (which issued as U.S. Pat. No. 8,441,718 on May 14, 2013); or by pointing the beam in a particular direction such as described in U.S. Pat. No. 7,429,734 titled "SYSTEM AND METHOD FOR AIRCRAFT INFRARED COUNTERMEASURES TO MISSILES" that issued Sep. 30, 2008, each of which is incorporated herein by reference. In some embodiments, the present invention uses one or more pump laser diodes that are driven by electrical current pulses generated by circuits such as described in U.S. Pat. No. 7,792,166 titled "APPARATUS AND METHOD FOR DRIVING LASER DIODES" that issued Sep. 7, 2010 to Lawrence A. Borschowa, which is also incorporated herein by reference.

FIG. 1A is a block diagram of a generic subsystem 101, according to some embodiments of the present invention. In some embodiments, subsystem 101 includes a Q-switched pulsed laser seed source 110 that outputs a seed pulse 91 (the intensity, in arbitrary units (A.U.), of an exemplary seed pulse versus time is graphed plot 81) that is amplified by high-power amplifier 112 that outputs an amplified pulse 98 (shown as graphed plot 88). The Q-switched seed pulse 91 provides a gradual initial ramp increase having a finer granularity of control (better dynamic range) than pulses generated by conventional optical modulators. When the Q-switch in Q-switched laser seed source 110 opens (allows enough signal light through to overcome cavity losses such that lasing occurs) the seed pulse within and leaving the cavity relatively gradually increases in intensity in a manner that generates a pulsed seed signal, which, when amplified by one or more very-high-gain optical fiber amplifiers 112, has a temporal shape that prevents excessive pulse steepening that otherwise occurs in the amplifier chain 112. In some embodiments, the output pulse 98 after amplification by amplifier chain 112 has a slightly longer FWHM duration than did the seed pulse 91; however, the pulse shape allows more complete energy extraction from the amplifier chain 112 than is possible using conventionally shaped pulses, as shown in the comparison of pulse shapes in FIG. 3A and FIG. 3B described below. In some embodiments, amplifier chain 112 includes a first fiber amplifier 113 that is optically pumped by a pump laser 115 that is optically coupled to the first fiber amplifier 113 by an optical fiber 114 in which the pump light propagates. In some embodiments, amplifier chain 112 includes one or more additional amplifier stages such as a second fiber amplifier 116 that is optically pumped by another pump laser 118 that is optically coupled to the second fiber amplifier 113 by another optical fiber 114 that conducts the pump light to amplifier 116. In some embodiments, the amplified output pulse is delivered using a delivery fiber 117 (e.g., in some embodiments, this is a hollow-core fiber 117 having a fiber endcap 119 such as described in commonly assigned U.S. Pat. No. 7,379,648 titled "OPTICAL HOLLOW-CORE DELIVERY FIBER AND HOLLOW-ENDCAP TERMINATION AND ASSOCIATED METHOD" that issued May 27, 2008, which is incorporated herein by reference).

FIG. 1B1 is a block diagram of a subsystem 102 that includes a Q-switched ring-laser seed source 120 that outputs a seed pulse 91 that is amplified by high-power amplifier 112 that outputs an amplified pulse 98, according to some embodiments of the present invention. In some embodiments, subsystem 102 is a portion of a larger system such as an image-acquisition system that includes an imaging device (not shown here) that acquires image information from a scene that is illuminated by pulsed output beam 98. In some embodiments, subsystem 102 includes a rare-earth-doped fiber amplifier (REDFA) 121, which is optically pumped by a pump laser 128 (such as a semiconductor laser diode). In some embodiments, REDFA 121 includes a polarization-maintaining erbium-doped fiber amplifier (EDFA) (such as is available from Coractive Inc., 2700 Jean-Perrin, Suite 121, Quebec (QC) Canada G2C 1S9, part number Er—25-05-PM) and a pump-and-signal optical multiplexor (OMUX) 189 (such as is available from Micro-Optics, Inc., 43-A Newburgh Rd., Suite 101, Hackettstown, N.J. 07840 USA, part number PMWDM—EDFA-1-1-2-1-0). In some embodiments, pump laser 128 includes one or more continuous-wave (CW) laser diodes (such as 560-mW, 976-nm wavelength pump diode(s), which are available from JDS Uniphase Corporation, 430 N. McCarthy Blvd., Milpitas, Calif. 95035 USA, catalog number 30-7602-560) driven by DC (direct current) electrical current such that pump light is applied to REDFA 121 on a substantially continuous basis (i.e., the pump-light output is CW) as long as power is supplied to subsystem 102; in other embodiments, pump laser 128 is driven by pulsed electrical current such that pump light is applied to REDFA 121 only just before a seed pulse is desired (e.g., on an as-demanded basis). In some embodiments, the signal output from REDFA 121 passes through a one-way optical isolator 122 (which helps ensure that signal light travels only in a single direction (clockwise in this figure)), a wavelength bandpass filter 123 (which helps set the signal light wavelength and linewidth), and a polarizer 124 (which helps polarize the signal light to obtain better signal-beam quality). In other embodiments, REDFA 121 and pump laser 128 are implemented in a single package gain block including electronics and drivers (in some embodiments, a MSA Compact Low Cost Pre-Amplifier EDFA (Gain Block), such as part number MOAPG2ONQA12439, which is available from Lightwaves2020 Inc., 1323 Great Mall Dr., Milpitas, Calif. 95035 USA).

In some embodiments, isolator 122, filter 123, and polarizer 124 are combined into a single part (such as a custom narrow-band-pass fixed PM filter (with a wavelength of 1541.35 nm) integrated with a polarization-maintaining (PM) isolator (single polarization, single stage) for high-power applications and having a PANDA 1550 pigtail fiber, such as available from Micro-Optics, Inc., 43-A Newburgh Rd., Suite 101, Hackettstown, N.J. 07840 USA, part number PM-FF-1541.35 nm (CH-45-100 GHz)+SPFI-SS-2(Standard 1550 nm Panda)-1-0-ECF-HP).

In some embodiments, an electronic Q-switch driver circuit 127 (which, in some embodiments, includes an optical switch driver such as described in U.S. Pat. No. 7,403,677, to Zhao, et al., which issued Jul. 22, 2008 titled "Fiberoptic reconfigurable devices with beam shaping for low-voltage operation," which is incorporated herein by reference, and such as available from Agiltron Inc., 15 Cabot Road, Woburn, Mass. 01801 USA, part number SWDR-112211112) is operatively coupled to, and controls the transparency and/or absorption of, Q-switch 125. In some embodiments, Q-switch 125 is configured as a one-by-two (1×2) optical switch (in this case, Q-switch 125 is implemented as a one-input, two-output optical multiplexor (OMUX), which, in some embodiments, includes an optical switch such as described in U.S. Pat. No. 7,403,677, and such as available from Agiltron Inc., 15 Cabot Road, Woburn, Mass. 01801 USA, part number NSSW-125115131) that directs signal light into dump 129 (e.g., a light absorber) when it is "off" and, when it is "on," directs signal light into output coupler 126, which receives any signal light that exits the lower output of Q-switch 125 and transmits a portion as seed signal 91 and reflects a portion back to REDFA 121 to provide the lasing feedback to ring laser 120. When Q-switch 125 is sufficiently open (and thus transparent or non-absorbing), enough signal light reaches output coupler 126 such that the portion that is reflected back to REDFA 121 is sufficient to sustain lasing and is amplified until the stored energy in REDFA 121 is depleted, thus forming a Q-switched pulse such as graphed in plot 81 of FIG. 1A. In some embodiments, seed signal 91 is amplified by optical gain fiber 113 (which, in some embodiments, is a REDFA that is optically pumped by pump light from one or more pump laser diodes 118 that is delivered through one or more optical fibers 114 that are coupled to deliver pump light into optical gain fiber 113), and then further amplified by optical gain medium 116 (which, in some embodiments, is optically pumped by pump light from one or more additional pump laser diodes 118 that is delivered through one or more additional optical fibers 114 that are coupled to deliver pump light into optical gain medium 116). In some embodiments, optical gain medium 116 includes a REDFA or a rare-earth-doped rod (i.e., similar to an optical fiber but having a diameter that is sufficiently large (e.g., 1 mm or greater) that the rod substantially maintains its shape in situations where a conventional optical gain fiber would bend under its own weight). In some such embodiments, optical gain fiber 113 and/or optical gain medium 116 are photonic-crystal structures (i.e., photonic-crystal fibers (PCFs) or photonic-crystal rods (PCRs) or photonic-crystal ribbons, such as described in U.S. Pat. No. 7,400,804 which issued Jul. 15, 2008 titled "MONOLITHIC OR RIBBON-LIKE MULTI-CORE PHOTONIC-CRYSTAL FIBERS AND ASSOCIATED METHOD" having one or more large-mode-area cores or signal waveguides (e.g., waveguides having a diameter of 50 microns or more). In some embodiments, optical gain fiber 113 and/or optical gain medium 116 are multiply clad structures that have pump light launched (into a cladding layer) in a co-propagating direction (in the same direction as the signal light) and/or in a counter-propagating direction (in the opposite direction as the signal light). In some embodiments, the delivery fiber 117 and endcap 119 are as described above for FIG. 1A. In some embodiments, subsystem 102 further includes a controller circuit, not shown here (e.g., a programmed microcontroller), operatively coupled to the Q-switch driver circuit 127 and to pump lasers 118 and 128 that controls timing, pulse intensity levels and the like, and an electrical power supply, also not shown here, that supplies electrical current to the controller circuit, the Q-switch driver circuit 127, and pump lasers 118 and 128.

Figure 4A:
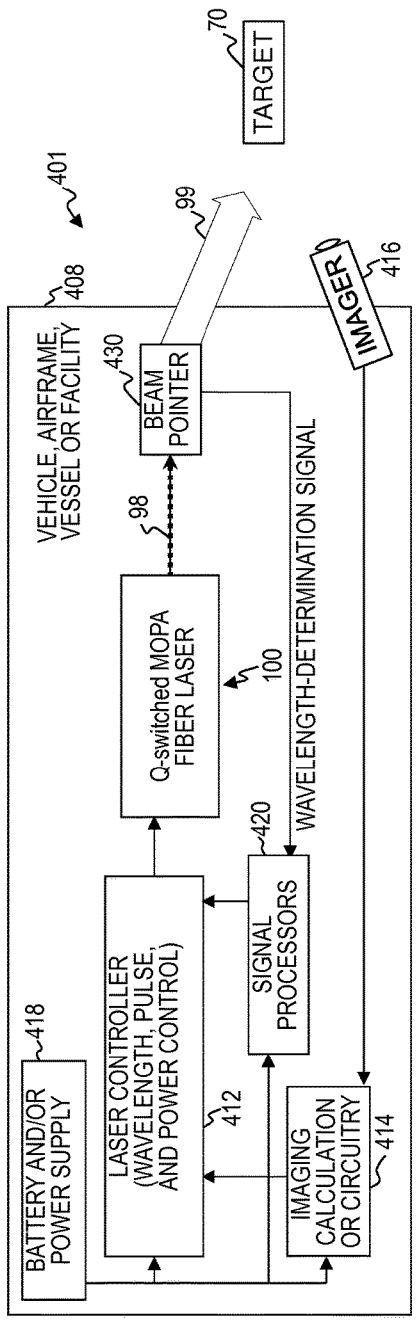
FIG. 4A is a block diagram of system 401 that includes a Q-seeded MOPA subsystem 100 mounted to a vehicle or facility 408, according to some embodiments of the present invention.
Figure 4B:
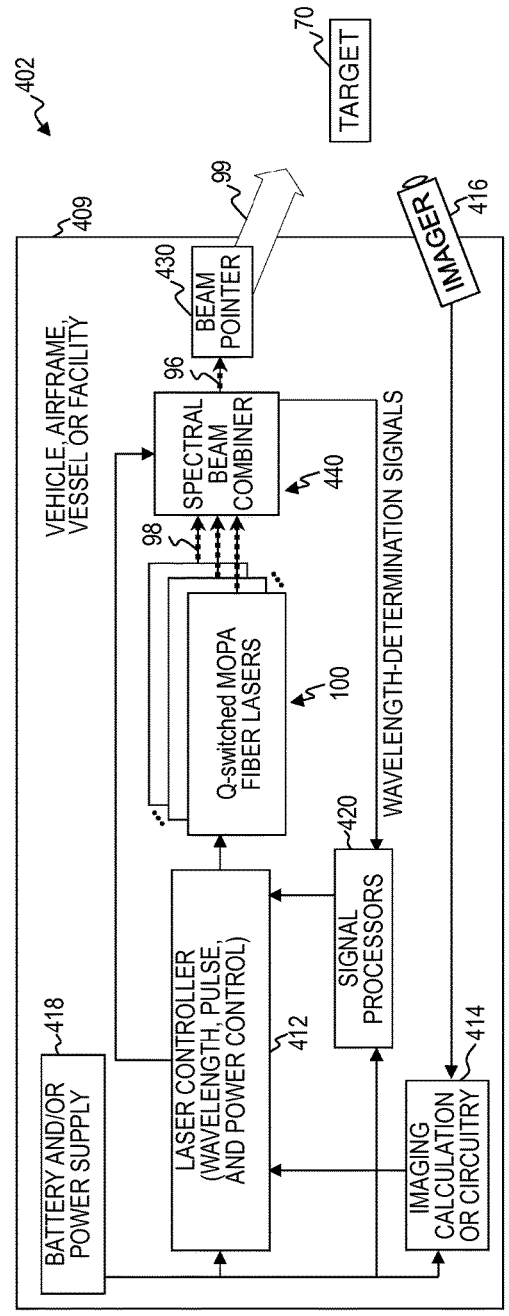
FIG. 4B is a block diagram of system 402 that includes a plurality of Q-seeded MOPA subsystems 100 whose output beams are combined in spectral-beam-combiner apparatus 440, all mounted to a vehicle or facility 409, according to some embodiments of the present invention.

In some embodiments, subsystem 101 of FIG. 1A or subsystem 102 of FIG. 1B1 (or any of the other subsystems in the other Figures described herein), as well as their respective controller circuits and power supplies, are mounted in or to a vehicle, as shown in FIG. 4A and FIG. 4B described below (such as an underwater vehicle (e.g., a submarine), a surface vessel (such as a destroyer, missile cruiser or aircraft carrier), an aircraft (such as a helicopter or jet fighter), and/or a land vehicle (such as a Humvee® or tank)), or building or bunker facility.

Pulses with durations less than about 50 nsec are difficult to obtain from conventional Q-switched lasers because pulse duration is determined, at least in part, by the cavity length, and conventional Q-switched lasers have cavities at least several centimeters in length. The configurations of subsystem 103 (shown in FIG. 1C1 and FIG. 1C2 and described below) and subsystem 104 (shown in FIG. 1D1 and FIG. 1D2 and described below) can be used to obtain Q-switched pulses less than 50 nsec (and, in some embodiments, having FWHM pulse durations as short as 5 nsec or less or even as short as about 1 nsec). In some embodiments, such short-cavity-length Q-switched lasers are used as single-frequency lasers, and lasers used as illuminators in LIDAR systems.

In some embodiments, the pulse-repetition rate is relatively low at about 10,000 to 20,000 pulses per second (pps). In some embodiments, this low repetition rate and short pulse duration (e.g., about 1 nsec) allows the use of lower-power pump lasers (e.g., in the range of 10 mW) to obtain very high-power output pulses (e.g., about 100 watts or more; since at 20,000 pps, the delay between pulses is about 50,000 nsec, and if the pulse is about 1 nsec and the efficiency is even as low as about 20%, the gain will be about 10,000 times; in some embodiments, the present invention uses wavelengths of about 1.8 to 2.1 microns and thulium doping to obtain efficiencies of 60 to 70%, yielding even higher output power with pump powers in the range of 10 mW, and yet higher output power with the use of higher pump power laser sources).

The use of Q-seed pulses (pulses from a Q-switched laser or pulses from one of the other systems described herein and having leading-edge temporal shapes that resemble Q-switched pulses) is one major factor of what allows the higher efficiencies and high power extraction of energy from the output fiber amplifiers 112.

In other embodiments, longer Q-switched pulses are generated with the present invention, wherein in some embodiments, the pulses are longer in duration-about 100 nsec in duration. In some embodiments, the pulses are used to illuminate objects that are a long distance (e.g., about 20 to 30 miles (30 to 50 km)) away from the laser. In some embodiments, the pulse repetition rate is relatively low at about 10,000 to 20,000 pulses per second (pps).

In some embodiments, the laser system outputs relatively eye-safe wavelengths of about 1.5 microns to about 2.1 microns. In some such embodiments, a fiber amplifier having an optical fiber that is co-doped with thulium (Tm) and holmium (Ho) is used to obtain efficiencies of 40% to 50% at a wavelength of about 2 microns (in some such embodiments, lasing at a wavelength of about 2 microns is much more efficient that lasing at a wavelength of about 1.5 microns). In some embodiments, a fiber amplifier having an optical fiber that is doped with thulium is used to obtain efficiencies of 60% to 70% at a wavelength in the range of about 1.8 to 2.1 microns.

FIG. 1B2 is a block diagram of a subsystem 182 that includes a pumped-through-Q-switch ring-laser seed source 180 that outputs a seed pulse 62 that is amplified by high-power amplifier 112 that outputs an amplified pulse 68, according to some embodiments of the present invention. In some embodiments, ring-laser seed source 180 includes a rare-earth-doped fiber amplifier (REDFA) 121, such as described above for FIG. 1B1, except that the pump light is delivered through an electrically controlled "1×N" (one-by-N way, wherein N is an integer value of two or more) optical switch (e.g., in some embodiments, a "1×2" (one-by-two way, wherein a first port of the switch is selectively optically connected to either a second port or to a third port) switch having one port on one side that is switchable under electrical control to be optically connected to a selected one of two ports on the other side, while in other embodiments, 1×3, 1×4, or other types of 1×N-way or M×N-way optical switches are used, wherein M and/or N have values larger than one). In some embodiments, REDFA 121 is pumped from both ends by directing pump light through Q-switch 1251 and Q-switch 1251 (e.g., in FIG. 1B2, both connect light through the lower connection) during the times when no lasing output is desired, and then, when a Q-switched output pulse 62 is desired to be output through direct-connected fiber pigtail 72, both Q-switch 1251 and Q-switch 1252 are switched to their other connection state (e.g., in FIG. 1B2, both connect light through the upper connection). Using 1×2 (one-to-two) optical switches in this way not only provides the Q-switching function, but also protects the pump laser diodes 128 against damage from the Q-switched optical pulse, since both switches optically connect to the pump laser diodes only when the Q-switch is "off" relative to the generation of the signal pulse, and both switches optically disconnect from the pump laser diodes when the Q-switch is "on" relative to the generation of the signal pulse. In some embodiments, Q-switch 1251 and Q-switch 1252 are each configured as a 1×2 optical switch/modulator (in this case, Q-switch 1251 is implemented as a two-input, one-output optical switch and Q-switch 1252 is implemented as a one-input, two-output optical switch; and in some embodiments, each includes an optical "Nano-switch"™ such as described in U.S. Pat. No. 7,403,677, which is incorporated herein by reference, and such as available from Agiltron Inc., 15 Cabot Road, Woburn, Mass. 01801, part number NSSW-125115131). The remaining parts in FIG. 1B2 are the same as corresponding part numbers of FIG. 1B1. In some embodiments, a fiber Bragg grating (FBG) is included in the optical fiber connection between pump laser diodes 128 and their respective Q-switch 1251 and Q-switch 1252, wherein the FBG is configured to transmit light of the pump wavelength and to block or disperse light of the signal wavelength of REDFA 121, in order to further protect the pump laser diodes 128 from possible damage from amplified spontaneous emission (ASE) of REDFA 121 during the times between signal pulses. In some embodiments, the Q-switched output pulse 62 is amplified by amplifier chain 112 and output as amplified output pulse 68.

FIG. 1B3 is a block diagram of a subsystem 183 that includes a pumped-through-Q-switched laser seed source 181 that outputs a seed pulse 63 that is amplified by high-power amplifier 112 that outputs an amplified pulse 67, according to some embodiments of the present invention. In some embodiments, laser seed source 181 includes REDFA 121 such as described above for FIG. 1B1 and FIG. 1B2, except the lasing cavity is designed as a two-reflector linear laser rather than as a ring laser. In some embodiments, a high-reflectivity FBG (HRFBG) 223 forms the reflector at one end (the left-hand end in FIG. 1B3) and a partially transmissive and low-reflectivity FBG (LRFBG) 224 forms the reflector at the opposite end (the right-hand end in FIG. 1B3). In some embodiments, REDFA 121 is pumped from both ends by directing pump light through Q-switch 1251 and Q-switch 1252 (e.g., in FIG. 1B3, both connect light through the lower connection) during the times when no lasing output is desired, and then, when a Q-switched output pulse 63 is desired to be output through direct-connected fiber pigtail 72, both Q-switch 1251 and Q-switch 1252 are switched to their other connection state (e.g., in FIG. 1B3, both connect light through the upper connection). In some embodiments, the Q-switched output pulse 63 is amplified by amplifier chain 112 and output as amplified output pulse 63. In some embodiments (not shown), an additional polarizer and filter (such as polarizer 124 and/or filter 123) are included within the cavity (between HRFBG 223 and LRFBG 224) to provide polarization and/or additional filtering functionality. In some embodiments, an optical isolator is provided at the output of seed source 181 (e.g., between LRFBG 224 and fiber pigtail 72) to provide protection for seed source 181 against amplified reflected pulses from amplifier chain 112. Other aspects and reference-numbered elements of FIG. 1B3 are as described above in the descriptions of FIG. 1B1 and FIG. 1B2.

FIG. 1B4 is a block diagram of a subsystem 185 that includes a pumped-through-Q-switch ring-laser seed source 184 that outputs a seed pulse 62 that is amplified by high-power amplifier 112 that outputs an amplified pulse 68, according to some embodiments of the present invention. In some embodiments, pumped-through-Q-switch ring-laser seed source 184 is similar to pumped-through-Q-switch ring-laser seed source 180 of FIG. 1B2, except that REDFA 121 is pumped from only one end (through optical switch 1251, in a configuration similar to FIG. 1B2 except that optical switch 1252 is omitted) in pumped-through-Q-switch ring-laser seed source 184, while the corresponding REDFA 121 in pumped-through-Q-switch ring-laser seed source 180 is pumped from both ends. In other embodiments (not shown), REDFA 121 is pumped from its other end (the output end when the seed source is lasing, in a configuration similar to FIG. 1B2 except that optical switch 1251 is omitted and optical switch 1252 is retained). Other aspects are the same as described above for FIG. 1B2.

FIG. 1B5 is a block diagram of a subsystem 187 that includes a bleached pulse Q-switched seed source 197 that outputs a seed pulse 61 that is amplified by high-power amplifier 112 that outputs an amplified pulse 64, according to some embodiments of the present invention. In some embodiments, the Q-seed source 197 includes a bleached pulse amplifier that itself acts as a Q-switch, wherein the cavity includes a bleaching fiber segment 196 whose transparency increases over time when a sufficiently high-power pulse is propagated through it, and the resulting output pulse has a more slowly increasing amplitude as the lasing light intensity increases due to the changing transparency of the bleaching fiber segment 196 (e.g., in some embodiments, a saturable absorber that prevents the onset of lasing until a calculable amount of pump energy, received into the gain medium 191, has been stored. The onset of lasing produces a high-intensity optical field within the cavity, which quickly saturates the saturable absorber of loss, increasing a cavity Q and resulting in a Q-switched output pulse 61. In some embodiments, saturable absorber 196 may be axially less than one millimeter long, which is desirable in some short-pulse and micro-laser applications, such as described in U.S. Pat. No. 7,203,209 to Young et al. or U.S. Pat. No. 4,778,237 to Sorin et al., which are hereby incorporated by reference in their entirety) that increases in transparency over time as a reaction to the high-power Q-switched pulse buildup (of signal 192) that uses the pump power stored in the gain medium 191 (e.g., in some embodiments, an electrically pumped (via a plurality of electrical leads 193 (electrically conductive pins or surface-mount solderable connections that supply electrical power and/or control signals such as described for FIG. 1D1 below)) semiconductor gain medium, or in other embodiments, an optically pumped semiconductor or optical-fiber gain medium). In some embodiments, the pulses generated by subsystem 187 are "free running" in that their timing is controlled by the timing of optical power build up due to input from gain medium and the bleaching characteristics of element 196. In some other embodiments, an optical modulator (e.g., an AOM or EOM, not shown) is included in the lasing cavity (e.g., adjacent to, and in series with, saturable-absorber element 196) and is driven by a pulse generator that helps determine if and when the light from the gain medium is allowed to reach the saturable-absorber element 196 such that Q-switching operation is enabled. Other aspects are as described above.

FIG. 1C1 is a schematic diagram of a subsystem 103 that includes a miniature and/or modularized Q-switched laser seed source 130 that outputs a seed pulse 91 that is amplified by optical amplifier 112 that outputs an amplified pulse 98, according to some embodiments of the present invention. In some embodiments, an optical-gain device 131 having gain medium and one minor are packaged together (e.g., in a "butterfly" package having a plurality of electrical leads 133 (electrically conductive pins or surface-mount solderable connections that supply electrical power and control signals to device 131, and that optionally output diagnostic signals such as laser optical power, temperature and the like from device 131) and one or more optical outputs 132 (e.g., an optical fiber pigtail or other optical coupler, which carries both the rightward-propagating output signal and the leftward-propagating feedback signal)). In some embodiments, the optical output 132 is optically coupled to a modulator 134 (i.e., an optical modulator that is external to the most intimate package of device 131) that acts as the Q-switch and that is optically coupled to an output coupler 136 (such as a fiber Bragg grating (FBG) that provides an optical-filter function by reflecting a controlled predetermined wavelength and linewidth portion of the signal back through modulator 134, when this modulator is "open" (transparent to signal light), to the gain medium of device 131, which then controls the Q-switch seed signal lasing mode). Output coupler 136 also transmits a portion of the signal as seed signal 91, which is then amplified by amplifier chain 112 and output as signal 98.

FIG. 1C2 is a block diagram of subsystem 103 that includes Q-switched laser seed source 130 that outputs a seed pulse 91 that is amplified by high-power amplifier 112 that outputs an amplified pulse 98, according to some embodiments of the present invention. FIG. 1C2 is another depiction showing additional detail of one embodiment of the system 103 shown in FIG. 1C1, and the same reference numbers in the two figures refer to elements and signals that are the same. In some embodiments, device 131 is a conventional semiconductor laser diode that has been specially modified by adding an anti-reflective coating to its output facet in order to prevent lasing feedback unless and until sufficient feedback light from output coupler 136 is transmitted forward and back through Q-switch modulator 135. In some embodiments, a Q-switch driver 137 provides an electrical control signal to control the optical transmission properties of Q-switch modulator 135. Other aspects of the subsystem 103 of FIG. 1C2 are as described above.

FIG. 1D1 is a schematic diagram of a subsystem 104 that includes a flat-pack packaged semiconductor-laser-based Q-switched laser seed source 140 that outputs a seed pulse 91 that is amplified by high-power amplifier 112 that outputs an amplified pulse 98, according to some embodiments of the present invention. In some embodiments, subsystem 104 is substantially similar in function to subsystem 103 of FIG. 1C1, except that substantially all of the optical components of Q-switched laser seed source 140 are packaged in or on a single package that provides the electrical and optical connectivity to the contained components. In some embodiments, Q-switched laser seed source 140 (e.g., in some embodiments, this is in a "butterfly" package having a plurality of electrical leads 143 (electrically conductive pins or surface-mount solderable connections that supply electrical power and/or control signals to optical-gain device 141 and/or Q-switch driver 147 (see FIG. 1D2), and that optionally output diagnostic signals such as laser optical power, temperature and the like from device 141 or other components of Q-switched laser seed source 140)) includes an optical-gain device 141 having a gain medium and one minor. In some embodiments, the optical output from optical-gain device 141 is optically coupled to an internal modulator 145 (i.e., an optical modulator that is internal to the package of Q-switched laser seed source 140) that acts as the Q-switch and that is optically coupled to an output coupler 146 (such as a fiber Bragg grating (FBG) that provides an optical-filter function by reflecting a controlled predetermined wavelength and linewidth portion of the signal back to the gain medium of device 141, which then controls the Q-switch seed-signal lasing mode). Output coupler 146 also transmits a portion of the signal through lens 142 and optional output ferrule 149 as seed signal 91 in fiber 71, which is then amplified by amplifier chain 112 and output as signal 98.

In some embodiments of the invention, subsystem 104 is implemented in a single package having a volume of no more than 6 cm$^3$ (e.g., 3 cm by 2 cm by 1 cm). In other embodiments, the single package has a volume of no more than 20 cm$^3$. In other embodiments, the single package has a volume of no more than 10 cm$^3$. In other embodiments, the single package has a volume of no more than 8 cm$^3$. In other embodiments, the single package has a volume of no more than 5 cm$^3$. In other embodiments, the single package has a volume of no more than 4 cm$^3$. In other embodiments, the single package has a volume of no more than 3 cm$^3$. In other embodiments, the single package has a volume of no more than 2 cm$^3$. In other embodiments, the single package has a volume of no more than 1 cm$^3$.

In some embodiments of the invention, subsystem 104 outputs (through optical fiber 71) a seed-signal pulse 91 having a full-width half-maximum (FWHM) duration of no more than 50 nsec. In other embodiments, the output seed-signal pulse 91 has an FWHM duration of no more than 40 nsec. In other embodiments, the output seed-signal pulse 91 has an FWHM duration of no more than 30 nsec. In other embodiments, the output seed-signal pulse 91 has an FWHM duration of no more than 20 nsec. In other embodiments, the output seed-signal pulse 91 has an FWHM duration of no more than 10 nsec. In other embodiments, the output seed-signal pulse 91 has an FWHM duration of no more than 5 nsec. In other embodiments, the output seed-signal pulse 91 has an FWHM duration of less than 5 nsec.

In some embodiments of the invention, subsystem 104 outputs a seed-signal pulse 91 having a full-width half-maximum (FWHM) duration of between 40 nsec and 50 nsec inclusive. In other embodiments, the output seed-signal pulse 91 has an FWHM duration of between 30 nsec and 40 nsec inclusive. In other embodiments, the output seed-signal pulse 91 has an FWHM duration of between 20 nsec and 30 nsec inclusive. In other embodiments, the output seed-signal pulse 91 has an FWHM duration of between 10 nsec and 20 nsec inclusive. In other embodiments, the output seed-signal pulse 91 has an FWHM duration of between 5 nsec and 10 nsec inclusive. In other embodiments, the output seed-signal pulse 91 has an FWHM duration of between 3 nsec and 5 nsec inclusive. In other embodiments, the output seed-signal pulse 91 has an FWHM duration of between 1 nsec and 3 nsec inclusive.

FIG. 1D2 is a block diagram of subsystem 104 that includes Q-switched laser seed source 140 that outputs a seed pulse 91 that is amplified by high-power amplifier 112 that outputs an amplified pulse 98, according to some embodiments of the present invention. FIG. 1D2 is another depiction showing additional detail of one embodiment of the system 104 shown in FIG. 1D1, and equal reference numbers in the two figures refer to elements and signals that are the same. In some embodiments, optical-gain device 141 is a conventional semiconductor laser diode (an optical gain medium and reflector(s)) that has been specially modified by adding an anti-reflective coating to its output facet in order to prevent lasing feedback unless and until sufficient feedback light from output coupler 146 is transmitted forward and back through Q-switch modulator 145. In some embodiments, Q-switch modulator 145 includes a semiconductor optical amplifier that absorbs light of the signal wavelength unless electrical power is supplied, in which case the semiconductor becomes transparent to, or even amplifying of, the signal wavelength. In some embodiments, a Q-switch driver 147 provides an electrical control signal to control the optical transmission and/or amplification properties of Q-switch modulator 145. Other aspects of the subsystem 104 of FIG. 1D2 are as described above. In some embodiments (not shown), the Q-switch driver 147 is implemented off chip (in a package that is not in the enclosure for the optical components of Q-switched laser seed source 140). In some embodiments (not shown), lens 142 and ferrule 149 are omitted and the output of feedback-element grating 146 (e.g., in some embodiments, implemented using a fiber Bragg grating) is a directly connected fiber pigtail 71 that extends from the package of seed source 140.

FIG. 1E1 is a schematic diagram of a subsystem 105 that includes a flat-pack packaged rare-earth-doped-laser-based Q-switched laser seed source 150 that outputs a seed pulse 91 that is amplified by high-power amplifier 112 that outputs an amplified pulse 98, according to some embodiments of the present invention. In some embodiments, subsystem 105 is somewhat similar in function to subsystem 103 of FIG.

1C1 and subsystem 104 of FIG. 1D1, except that the electrically pumped semiconductor laser-diode gain medium 141 or 131 of the above-described subsystems has been replaced optically pumped rare-earth-doped optical waveguide (REDOW) planar gain medium 151 that, in some embodiments, is optically pumped by a semiconductor-diode pump laser 158 that is coupled into the REDOW gain medium 151 by dichroic mirror 153. In some embodiments, as shown here, the optical signal wavelength is transmitted by dichroic mirror 153 and the pump wavelength is reflected by dichroic mirror 153 (in other embodiments, the positions of Q-switch 155 and its high-reflectivity (HR) mirror and pump laser 158 are swapped and in that case the optical signal wavelength is reflected by dichroic mirror 153 and the pump wavelength is transmitted by dichroic mirror 153; such a configuration reduces the possibility of damage to the dichroic mirror 153 since the higher-power signal pulse is reflected and does not travel through the dichroic mirror 153, and the lower-power pump laser beam is transmitted through the dichroic mirror 153). In some embodiments, a filter-and-output coupler 156 reflects a predetermined wavelength and linewidth portion of the signal light for lasing feedback and transmits the remaining seed-signal pulse light through lens 152 and fiber-coupling ferrule 159 as seed signal 91 into seed-signal fiber 71. Accordingly, when Q-switch 155 becomes sufficiently transparent, a lasing cavity is formed between the HR mirror 154 on the left and the output coupler 156 toward the right, with optically pumped gain medium 151 providing the optical gain. In some embodiments, the optical components of Q-switched laser seed source 150 are packaged in or on a single package that provides the electrical and optical connectivity to the contained components.

In some embodiments, erbium-doped planar waveguides are used in various embodiments of the present invention. One advantage of an erbium-doped planar waveguide is that it is very compact, since it is compatible with state-of-the-art silicon technology, and the storage time (the 1/e decay time of the upper excited state from which amplification occurs) of erbium is about 10 milliseconds (msec). Some embodiments of the present invention use planar waveguides, gratings, couplers, and/or lasers similar to those described in one or more of the following patents: U.S. Pat. No. 7,532,656 issued May 12, 2009 to Yang, et al. titled "ALL-SILICON RAMAN AMPLIFIERS AND LASERS BASED ON MICRO RING RESONATORS," U.S. Pat. No. 6,330,388 issued Dec. 11, 2001 to Bendett, et al. titled "METHOD AND APPARATUS FOR WAVEGUIDE OPTICS AND DEVICES," U.S. Pat. No. 6,636,678 issued Oct. 21, 2003 to Bendett, et al. also titled "METHOD AND APPARATUS FOR WAVEGUIDE OPTICS AND DEVICES," U.S. Pat. No. 6,970,494 issued to Bendett, et al. on Nov. 29, 2005 titled "RARE-EARTH DOPED PHOSPHATE-GLASS LASERS AND ASSOCIATED METHODS," U.S. Pat. No. 6,813,405 issued Nov. 2, 2004 to Bendett, et al. titled "COMPACT APPARATUS AND METHOD FOR INTEGRATED PHOTONIC DEVICES HAVING FOLDED DIRECTIONAL COUPLERS," and U.S. Pat. No. 6,493,476 issued Dec. 10, 2002 to Bendett titled "APPARATUS AND METHOD FOR INTEGRATED PHOTONIC DEVICES HAVING GAIN AND WAVELENGTH-SELECTIVITY," which are incorporated herein by reference. Some embodiments of the present invention use planar waveguides similar to those described in "Coefficient determination related to optical gain in erbium-doped silicon-rich silicon oxide waveguide amplifier" by H.-S. Han et al., *Appl. Phys. Lett.* 81, 3720 (2002), or P. G. Kik, A. Polman "Exciton—erbium energy transfer in Si nanocrystal-doped $SiO_2$": Materials Science and Engineering B81 (2001) 3-8, or P. G. Kik, A. Polman "Exciton—erbium energy transfer in Si nanocrystal-doped $SiO_2$": J. Appl. Phys., Vol. 88, No. 4, pp 1992-1998, 15 Aug. 2000, which are each incorporated herein by reference.

FIG. 1E2 is a block diagram of subsystem 105 that includes Q-switched laser seed source 150 that outputs a seed pulse 91 that is amplified by high-power amplifier 112 that outputs an amplified pulse 98, according to some embodiments of the present invention. In some embodiments, Q-switched laser seed source 150 (e.g., in some embodiments, this is in a "butterfly" package having a plurality of electrical leads (electrically conductive pins or surface-mount solderable connections that supply electrical power and/or control signals to pump-diode laser 158 and/or Q-switch driver 157, and that optionally output diagnostic signals (not shown here) such as laser optical power, temperature and the like from pump-diode laser 158 or other components of Q-switched laser seed source 150)) includes an optical-gain device 151 having an optically pumped gain medium (e.g., a rare-earth-doped waveguide formed on (or in) a planar glass or silicon substrate) that is optically pumped using light from pump laser diode 158. In some embodiments, optical-gain device 151 includes a lens or other focussing element (e.g., a GRIN (gradient-index) focussing element) at each end of its optical waveguide. In some embodiments, the optical output from optical-gain medium 151 is optically coupled at one end through dichroic minor 153 to an internal electrically pumped semiconductor-diode optical amplifier 155 (i.e., an optical amplifier that is internal to the package of Q-switched laser seed source 150) that acts as the Q-switch and that is optically coupled to an HR minor 154 which forms the left end of the laser optical cavity bounded at the opposite end by output coupler 156 (such as a fiber Bragg grating (FBG) that provides an optical-filter function by reflecting a controlled predetermined wavelength and linewidth portion of the signal back to the optical-gain medium 151, which then controls the Q-switch seed-signal lasing mode). When optical amplifier 155 is supplied with sufficient electrical power, optical amplifier 155 becomes transparent to, or amplifying of, light of the signal wavelength and the Q-switch is "on", but when insufficient electrical power or no electrical power is applied, optical amplifier 155 becomes absorbing of light of the signal wavelength and the Q-switch is "off". Output coupler 156 also transmits a portion of the signal through lens 152 and optional output ferrule 159 as seed signal 91 in fiber 71, which is then amplified by amplifier chain 112 and output as signal 98. In other embodiments, a Mach-Zehnder device, or the like, is used in place of the semiconductor optical amplifier 155 as the Q-switch unit. In some embodiments (not shown), the Q-switch driver 157 is implemented off chip (in a package that is not in the enclosure for the optical components of Q-switched laser seed source 150). In some embodiments (not shown), lens 152 and ferrule 159 are omitted and the output of feedback-element grating 156 (e.g., in some embodiments, implemented using a fiber Bragg grating) is a directly connected fiber pigtail 71 that extends from the package of seed source 150.

FIG. 1E3 is a block diagram of an alternative subsystem 105' that includes Q-switched laser seed source 150' that uses an optically pumped planar waveguide optical amplifier 155' as a Q-switch and outputs a seed pulse 91, which is amplified by high-power amplifier 112 that outputs an amplified pulse 98, according to some embodiments of the present invention. In some embodiments, subsystem 105' is substantially similar to subsystem 105 of FIG. 1E2 described above, except that electrically pumped semiconductor-diode optical amplifier 155 that acts as the Q-switch in subsystem 105 of FIG. 1E2 is replaced by optically pumped planar waveguide optical amplifier 155' and its semiconductor laser-diode Q-switch pump source 158'. When optical amplifier 155' is supplied with sufficient optical pump light from Q-switch pump source 158', optical amplifier 155' becomes transparent to, or amplifying of, light of the signal wavelength and the Q-switch is "on", but when insufficient optical pump light or no pump light is applied, optical amplifier 155' becomes absorbing of light of the signal wavelength and the Q-switch is "off". When the Q-switch is "off", the energy from signal pump diode 158 is stored in the rare-earth dopant ions in optical-gain medium 151. Then, when the Q-switch is turned on, lasing begins and the stored energy in optical-gain medium 151 is output as seed signal pulse 91.

In some embodiments, planar-waveguide technology is used wherein the pump-laser diode can also be incorporated in the silicon-waveguide technology used for a planar wavelength-division multiplexer (WDM), wherein the pump laser diode can be bud-coupled to the pump waveguide on the planar optical substrate. See, e.g., H.-S. Han et al., *Appl. Phys. Lett.* 81, 3720 (2002), or P. G. Kik, A. Polman "Exciton—erbium energy transfer in Si nanocrystal-doped $SiO_2$": Materials Science and Engineering B81 (2001) 3-8, or P. G. Kik, A. Polman "Exciton—erbium energy transfer in Si nanocrystal-doped $SiO_2$": J. Appl. Phys., Vol. 88, No. 4, pp 1992-1998, 15 Aug. 2000, which are each incorporated herein by reference.

In some embodiments, the Q-switch planar waveguide optical amplifier 155' is doped with a rare-earth element such as Tm (thulium) that absorbs signal light of about 1550 nm unless sufficient Q-switch pump light is supplied (e.g., light of about 780 nm supplied by a semiconductor laser diode 158', and the signal-amplifier planar waveguide optical amplifier 155' is doped with Er (erbium) or co-doped with YbEr (ytterbium and erbium) that amplifies signal light of about 1550 nm when its pump light is supplied by semiconductor laser diode 158. In other embodiments, the rare-earth dopant for the signal-light gain chip 155' is selected for a particular desired lasing wavelength of the Q-switched seed pulse. In some embodiments, $Yb^{3+}$ is used as the dopant in some or all of the glass gain media (e.g., planar substrates for planar waveguide optical amplifier 155', or glass gain fibers or gain rods for amplifier chain 112) for lasing at various signal wavelengths in the range of 980 to 1100 nm (such as 1060 nm); in other embodiments, $Er^{3+}$, $Nd^{3+}$, and $Pr^{3+}$ are used for other wavelength ranges, and generally can each have a tuning range of 30 nm or even as much as 50 nm in three-level or four-level lasers and amplifiers. In some embodiments (not shown), the Q-switch driver 157 is implemented off chip (in a package that is not in the enclosure for the optical components of Q-switched laser seed source 150'). In some embodiments (not shown), lens 152 and ferrule 159 are omitted and the output of feedback-element grating 156 (e.g., in some embodiments, implemented using a fiber Bragg grating) is a directly connected fiber pigtail 71 that extends from the package of seed source 150'.

FIG. 1F1 is a schematic diagram of a subsystem 106 that includes a flat-pack packaged rare-earth-doped-laser-based Q-switched ring-laser seed source 160 that outputs a seed pulse 91 that is amplified by high-power amplifier 112 that outputs an amplified pulse 98, according to some embodiments of the present invention. In some embodiments, ring-laser seed source 160 includes a plurality of signal reflectors (minors 1610 and/or 1611 being highly reflective of light of the signal wavelength, dichroic minor 163 that reflects light of the signal wavelength and transmits light of the pump wavelength, and output coupler beam splitter 164 which partially reflects and partially transmits light of the signal wavelength) that form a ring optical-signal path. In the ring optical-signal path, the signal wavelength encounters and is amplified by an optically pumped gain medium 161 (in some embodiments, substantially similar to gain medium 151 of FIG. 1E1), reflects off dichroic mirror 163 (which transmits light of the pump laser 168 in a counter-propagating direction into optically pumped gain medium 161); in some embodiments, the signal light also is selectively passed through Q-switch 165 and FIP (a combined filter-isolator-polarizer) optical element 166 (in some embodiments, FIP optical element 166 includes a filter and/or isolator and/or polarizer for light of the signal wavelength). In some embodiments, when the Q-switch 165 opens, lasing starts in a single direction and at a wavelength and linewidth (and optionally at a polarization) determined by FIP optical element 166. In some embodiments, the various components in the ring signal path are moved to other legs (e.g., in some embodiments, FIP optical element 166 is positioned after optical amplifier 161 (in the left leg between dichroic minor 163 and minor 1610, or in the bottom leg between minor 1610 and output coupler 164 as shown in FIG. 1F2 described below) and before the amplified signal reaches the output coupler 164 in order to further "clean up" the amplified signal from optical amplifier 161 before it leaves ring-laser seed source 160).

FIG. 1F2 is a block diagram of subsystem 106 that includes Q-switched ring-laser seed source 160 that outputs a seed pulse 91 that is amplified by high-power amplifier 112 that outputs an amplified pulse 98, according to some embodiments of the present invention. In some embodiments, Q-switched ring-laser seed source 160 (e.g., in some embodiments, this is packaged in a "butterfly" package having a plurality of electrical leads (electrically conductive pins or surface-mount solderable connections that supply electrical power and/or control signals to pump-diode laser 168 and/or Q-switch driver 167, and that optionally output diagnostic signals (not shown here) such as laser optical power, temperature and the like from pump-diode laser 168 or other components of Q-switched laser seed source 160)) includes an optical-gain device 161 having an optically pumped gain medium (e.g., a rare-earth-doped waveguide formed on (or in) a planar glass or silicon substrate) that is optically pumped using light from pump laser diode 168. In some embodiments, optical-gain device 161 includes a lens or other focussing element (e.g., a GRIN focussing element) at each end of its optical waveguide. In some embodiments, the optical output from optical-gain medium 161 is optically coupled at one end to reflect in a single direction (counter-clockwise in this figure) off dichroic mirror 163 through internal optical-amplitude modulator 165 (in some embodiments, a semiconductor optical amplifier that is internal to the package of Q-switched laser seed source 160) that acts as the Q-switch and that is optically coupled to reflect from HR mirror 1610 through optical element 166 (which, in some embodiments, includes a bandpass filter that determines the wavelength and linewidth of the lasing signal and/or an isolator that forces the lasing to be unidirectional around the ring and/or a polarizer that polarizes the lasing signal) to an output coupler mirror 164 (a partially reflective and partially transmissive mirror), where the reflected portion is coupled to another HR minor 1611 in the upper right corner of the FIG. 1F2 diagram that directs the feedback signal back into the gain element 161. This optical-signal path forms a ring-laser optical cavity, which then controls the Q-switch seed-signal lasing mode. Output coupler 164 also transmits a portion of the signal through lens 162 and optional output ferrule 169 as seed signal 91 in fiber 71, which is then amplified by amplifier chain 112 and output as signal 98. In some embodiments (not shown), the Q-switch driver 167 is implemented off chip (in a package that is not in the enclosure for the optical components of Q-switched laser seed source 160). In some embodiments (not shown), lens 162 and ferrule 169 are omitted and the output of filter-isolator-polarizer 166 (e.g., in some embodiments, implemented using a fiber Bragg grating) is a directly connected fiber pigtail 71 that extends from the package of seed source 160.

FIG. 1F3 is a block diagram of an alternative subsystem 106' that includes Q-switched laser seed source 160' that uses an optically pumped planar waveguide optical amplifier 165' as a Q-switch and outputs a seed pulse 91, which is amplified by high-power amplifier 112 that outputs an amplified pulse 98, according to some embodiments of the present invention. In some embodiments, subsystem 106' is substantially similar to subsystem 106 of FIG. 1F2 described above, except that the electrically pumped semiconductor-diode optical amplifier 165 that acts as the Q-switch in subsystem 106 of FIG. 1F2 is replaced by an optically pumped planar waveguide optical amplifier 165' and its semiconductor laser-diode Q-switch pump source 168', and the geometry and location of some of the optical elements in the ring have changed. In some embodiments, signal pump diode 168 provides laser pump light that is reflected by dichroic mirror 163' into the signal gain element 165 (in some embodiments, signal gain element 165 includes planar substrate having a rare-earth-doped signal-amplifying waveguide formed in or on one surface), while signal light is transmitted through dichroic mirror 163' into the signal Q-switch element 165'. When optical amplifier 165' is supplied with sufficient optical pump light from Q-switch pump source 168' (which outputs pump light only when a sufficient electrical signal is supplied from Q-switch driver circuit 167'), optical amplifier 165' becomes transparent to and/or amplifying of, light of the signal wavelength and the Q-switch is "on", but when insufficient optical pump light or no pump light is applied, optical amplifier 165' becomes absorbing of light of the signal wavelength and the Q-switch is "off". When the Q-switch is "off", the energy from signal pump diode 168 is stored in the rare-earth-dopant ions in the signal-amplifying optical-gain medium 165. Then, when the Q-switch is turned on, lasing begins at the signal wavelength, linewidth, direction and polarization as determined by FIP optical element 166 and much of the stored energy in optical-gain medium 165 is output as seed signal pulse 91. In some embodiments, the Q-switch planar waveguide optical amplifier 165' is doped with a rare-earth element such as Tm (thulium) that absorbs signal light of about 1550 nm unless sufficient Q-switch pump light is supplied (e.g., light of about 780 nm supplied by a semiconductor laser diode 168', and the signal-amplifier planar waveguide optical amplifier 165 is doped with Er (erbium) or co-doped with YbEr (ytterbium and erbium) that amplify signal light of about 1550 nm when its pump light is supplied by semiconductor laser diode 168. In other embodiments, the rare-earth dopant for the signal-light gain chip 165 is selected for a particular desired lasing wavelength of the Q-switched seed pulse. In some embodiments, $Yb^{3+}$ is used as the dopant in glass gain media (e.g., planar substrates for planar waveguide optical amplifier 165, or glass fibers or rods for amplifier chain 112) for lasing at various signal wavelengths in the range of 980 to 1100 nm (such as 1060 nm); $Er^{3+}$, $Nd^{3+}$, and $Pr^{3+}$ are used for other wavelength ranges, and generally can each have a tuning range of 30 nm or even as much as 50 nm. In some embodiments (not shown), the Q-switch driver 167' is implemented off chip (in a package that is not in the enclosure for the optical components of Q-switched laser seed source 160'). In some embodiments (not shown), lens 162 and ferrule 169 are omitted and the output of filter-isolator-polarizer 166 (e.g., in some embodiments, implemented using a fiber Bragg grating) is a directly connected fiber pigtail 71 that extends from the package of seed source 160'.

FIG. 1G1 is a schematic diagram of a subsystem 1071 that includes a flat-pack packaged rare-earth-doped-laser-based Q-switched ring-laser seed source 170 that outputs a seed pulse 91 that is amplified by high-power amplifier 112 that outputs an amplified pulse 98, according to some embodiments of the present invention. In some embodiments, the signal light in the Q-switched seed pulse ring laser 170 is routed using optical fibers that interconnect the various optical elements (rather than the free-space propagation and mirrors used in subsystem 106 of FIG. 1F1). In other embodiments, the signal light in the Q-switched ring-laser seed source 170 is routed using planar waveguides (formed on a glass or silicon substrate) that interconnect the various optical elements of Q-switched seed pulse ring laser 170. In some embodiments, ring-laser seed source 170 includes a plurality of curved waveguides (optical-fiber waveguides or planar waveguides), a wavelength-division multiplexer (WDM) 173 that transmits light of the signal wavelength from optical gain waveguide 171 toward Q-switch 175 which then selectively passes the signal light to optical element 176 (e.g., in some embodiments, optical element 176 includes a filter, an isolator and a polarizer). WDM 173 also transmits light of the pump wavelength from the pump laser 178 into optical gain waveguide 171. In some embodiments, optical element 176 passes the signal light to output coupler beam splitter 174 which transmits part of the light of the signal wavelength as feedback into optical gain waveguide 171 and transmits the remainder of the light of the signal wavelength as the output seed pulse 91. These optical elements form a ring-laser optical-signal path. In the ring optical-signal path, the signal wavelength encounters and is amplified by an optically pumped gain medium 171 (in some embodiments, substantially similar to gain medium 151 of FIG. 1E2), is transmitted by WDM 173 (which transmits light of the pump laser 178 in a counter-propagating direction into optically pumped gain medium 171) toward Q-switch 175. In some embodiments, the signal light is then selectively passed through Q-switch 175, which is controlled by Q-switch driver 177, to FIP optical element 176 (in some embodiments, FIP optical element 176 includes a filter and/or isolator and/or polarizer for light of the signal wavelength). In some embodiments, when the Q-switch 175 opens, lasing starts in a single direction and at a wavelength and linewidth (and optionally at a polarization) determined by FIP optical element 176. In some embodiments, the various components in the ring signal path of ring-laser seed source 170 are arranged in different orders or moved to other legs of the ring. In some embodiments, ring-laser seed source 170 is mounted in an electronic package having a plurality of solderable or socketable electrical connectors and that also includes an optical-fiber pigtail 72 that is directly connected to amplifier chain 112. Note the difference between optical-fiber pigtail 72, which is directly coupled to the output coupler 174, and optical fiber 71 of FIG. 1F1, which is connected via optical-connection ferrule 179 (which, in some embodiments, is disconnectable in order to be more readily reconfigured), and into which the free-space laser output signal of seed source 170 must be focussed using lens 172.

FIG. 1G2 is a block diagram of subsystem 1072 that includes Q-switched ring-laser seed source 170 that outputs a seed pulse 91 that is amplified by high-power amplifier 112 that outputs an amplified pulse 98, according to some embodiments of the present invention. In some embodiments, subsystem 1072 of FIG. 1G2 is substantially similar to subsystem 1071 of FIG. 1G1, with the additional detail that Q-switch 175 is implemented as a semiconductor-diode optical amplifier that is driven by Q-switch driver circuit 177.

FIG. 1G3 is a block diagram of an alternative subsystem 1073 that includes Q-switched laser seed source 170' that uses an optically pumped planar waveguide optical amplifier 175' as a Q-switch and outputs a seed pulse 91, which is amplified by high-power amplifier 112 that outputs an amplified pulse 98, according to some embodiments of the present invention. In some embodiments, subsystem 1073 of FIG. 1G3 is substantially similar to subsystem 1071 of FIG. 1G1, with the additional detail that Q-switch 175 (see FIG. 1G1) is implemented as an optically pumped optical amplifier 175' that is pumped by laser diode 178' that is electrically driven by Q-switch driver circuit 177'. Unless optically pumped optical amplifier 175' receives sufficient pump light from Q-switch pump laser diode 178', it absorbs signal light to such an extent that lasing in the ring does not occur, but when sufficient pump light is provided, optically pumped optical amplifier 175' transmits enough signal for lasing to occur and a Q-switched seed-signal pulse is output. In some embodiments (not shown), the Q-switch driver 177' is implemented off chip (in a package that is not in the enclosure for the optical components of Q-switched laser seed source 170'). In some embodiments (not shown), lens 172 and ferrule 179 are omitted and the output of output coupler 174 is a directly connected fiber pigtail 71 that extends from the package of seed source 170'.

In some embodiments, a standard Q-switch is not used, but rather quasi-Q-switching is used as described below for FIG. 2A and FIG. 2B. In some embodiments, all-glass quasi-Q-switching is used. In some embodiments, no PM (polarization-maintaining) fiber or components are required. In some embodiments of this design, the fiber length needs to be chosen appropriately, since the fiber length will affect the quasi-Q-switching due to the dependence of re-absorption of the signal wavelength as a function of the fiber wavelength (fiber length).

FIG. 2A is a block diagram of subsystem 201 that includes quasi-Q-switched ring-laser seed source 210 that outputs a quasi-Q-switched seed pulse 90 that is amplified by high-power amplifier 112 that outputs an amplified quasi-Q-switched pulse 94, according to some embodiments of the present invention. In some embodiments, seed source 210 includes a relatively high-power optically pumped optical amplifier (HPA) 211 that is pumped using pump laser light from a plurality of pump-wavelength laser diodes 118 that are optically coupled to optically pumped optical amplifier 211 using optical fibers 114; the output from optically pumped optical amplifier 211 is coupled to output coupler 219 by an optical fiber, and when the ring lases, a quasi-Q-switched optical seed pulse 90 is delivered via optical fiber pigtail 72 to optical-amplifier chain 112, which amplifies the seed pulse 90 to form amplified output pulse 94. In some embodiments, a portion of the light going into output coupler 219 is directed as feedback signal into a relatively low-power optically pumped optical amplifier (LPA) 215 that acts as a quasi-Q-switch by absorbing a sufficient amount of signal light to prevent lasing in the ring when LPA 215 is not provided pump light (i.e., when the quasi-Q-switch is "off"), but then transmitting and/or amplifying the signal light in the ring when the quasi-Q-switch driver 217 provides electrical power to quasi-Q-switch pump diode 218, which in turn provides optical pumping via optical fiber 214 to LPA 215, which then amplifies, rather than absorbs, the signal light. In some embodiments, the LPA 215 has a small mode field diameter to reduce ASE feedback from the high power amp 211. LPA 215 is pulsed pumped, which leads to transparency of the cavity when the pump is on.

In some embodiments, LPA 215 is not doped with the same rare-earth ion as is used for HPA 211. For example, in some embodiments, the power amplifier is an erbium-doped fiber amplifier (EDFA) or an erbium-ytterbium co-doped fiber amplifier (EYDFA), and a thulium-doped fiber (TmDF) is used for LPA 215 since it absorbs in the C-band and L-band. In this case, the TmDF is pumped using pump light at a wavelength of 790 nm in order to cause the doped core of LPA 215 to stop absorbing the C-band and L-band signal light from HPA 211, thus causing the quasi-Q-switch to open and emit the seed pulse 90. An advantage of this particular case is that the storage time of Tm is 0.6 msec (instead of 10 msec for pure erbium if that dopant were to be used in LPA 215). Therefore, in some embodiments, a TmDF enables higher repetition rates. However, in other embodiments, LPA 215 is doped with the same rare-earth ion as HPA 211 (e.g., in some embodiments, LPA 215 and HPA 211 both include an EDFA or EYDFA).

The low-power-amplified signal from LPA 215 then passes through FIP optical element 216 (which, in some embodiments, filters the wavelength and linewidth of, one-way isolates, and/or polarizes the signal light) and into the HPA 211. In some embodiments, HPA 211 is implemented as a large-core, large-mode-area fiber having a mode-area diameter of at least 40 microns (e.g., a continuous-wave (CW) pumped optical fiber or rod), while LPA 215 is implemented as a small-core, small-mode-area fiber having a mode-area diameter of no more than 25 microns. In some embodiments, the smaller mode-area diameter of LPA 215 acts to suppress ASE feedback from HPA 211.

FIG. 2B is a block diagram of subsystem 202 that includes quasi-Q-switched linear-laser seed source 220 that outputs a quasi-Q-switched seed pulse 90 that is amplified by high-power amplifier 112 that outputs an amplified quasi-Q-switched pulse 94, according to some embodiments of the present invention. In some embodiments, the laser cavity of seed source 220 is formed between a high-reflectivity fiber Bragg grating (HRFBG) 223 on one end and a low-reflectivity fiber Bragg grating (LRFBG) output coupler 224 (which partially reflects a portion of the signal, and partially transmits a portion of the signal directed through it) on the opposite end. In some embodiments, seed source 220 includes a relatively high-power optically pumped optical amplifier (HPA) 221 that is pumped (in some embodiments, it is CW pumped, wherein the pump lasers are on substantially all the time when the subsystem 202 is in operation) using pump laser light from a plurality of pump-wavelength laser diodes 118 that are optically coupled to optically pumped optical amplifier 221 using optical fibers 114; the amplified output from one end of optically pumped optical amplifier 221 is coupled to output coupler 224 by an optical fiber, and when the cavity lases, a quasi-Q-switched optical seed pulse 90 is delivered via optical fiber pigtail 72 to optical-amplifier chain 112, which amplifies the seed pulse 90 to form amplified output pulse 94. In some embodiments, a portion of the light (which was going toward the right in the diagram into output coupler 224) is reflected as feedback signal back through HPA 221, which amplifies it and passes the signal light through filter 226 into a relatively low-power optically pumped optical amplifier (LPA) 225 that acts as a quasi-Q-switch by absorbing a sufficient amount of signal light to prevent lasing in the ring when LPA 225 is not provided pump light (i.e., when the quasi-Q-switch is "off"), but then transmitting and/or amplifying the signal light in the cavity when the quasi-Q-switch driver 227 provides electrical power to quasi-Q-switch pump diode 228, which in turn provides optical pumping via an optical fiber to LPA 225, which then amplifies, rather than absorbs, the signal light in both directions—first toward HRFBG 223, which reflects signal light having the wavelength and linewidth to which the fiber Bragg grating is tuned, and then back toward filter 226. In some embodiments, filter 226 also provides wavelength and linewidth bandpass filtering to help remove amplified spontaneous emission (ASE) that otherwise would pass to LPA 225 from HPA 221 (leftward-traveling signal light in the diagram), and to HPA 221 from LPA 225 (rightward-traveling signal light in the diagram). In some embodiments, the ASE filtering provided by filter 226 increases performance of the quasi-Q-switch small-core amplifier (LPA 225) since it reduces certain ASE wavelengths going from HPA 221 into LPA 225, which could bleach the gain fiber in LPA 225. In some embodiments, one or more of the optical elements 223, 225, 226, 221, 224 and/or the optical fibers that connect them to one another are polarizing or polarization-maintaining (PM) elements such that the quasi-Q-switched output seed signal 90 is polarized. The low-power, twice-amplified (amplified once in the leftward direction and amplified a second time in the rightward direction) signal from LPA 225 then passes through filter 226 (which, in some embodiments, polarizes and/or filters the wavelength and linewidth of the signal light) and into the HPA 221. In some embodiments, HPA 221 is implemented as a large-core, large-mode-area fiber having a mode-area diameter of at least 40 microns (e.g., a continuous-wave (CW) pumped optical fiber or rod), while LPA 225 is implemented as a small-core, small-mode-area fiber having a mode-area diameter of no more than 25 microns. In some embodiments, the smaller mode-area diameter of LPA 225 acts to further suppress ASE feedback from HPA 221.

FIG. 3A is a block diagram of a subsystem 301 that includes a conventionally modulated ramped-pulse laser seed source 50 that outputs a ramped seed pulse 92 (shown as graphed plot 82) that is amplified by high-power amplifier 112 that outputs an amplified pulse 93 (shown as graphed plot 83). In some embodiments, seed source 50 includes a distributed-feedback laser (DFBL) that outputs a ramped seed pulse conventionally formed (e.g., by modulating the power input to the laser or by modulating the output laser beam from the laser to obtain a seed pulse having an intensity that starts at approximately zero amplitude and that increases over time to form seed pulse 92 (graphed plot 82 shows the intensity versus time for pulse 92). Seed pulse 92 is coupled to amplifier chain 112 (in some embodiments, amplifier chain 112 includes three serially connected optic-fiber gain stages (i.e., the amplified output signal of the first stage is coupled as the input signal to the second stage, the amplified output signal of the second stage is coupled as the input signal to the third stage, the amplified output signal of the third stage is output signal 93 (graphed plot 83 shows the intensity versus time for pulse 93). Due to the difficulty in obtaining good dynamic range (i.e., having the initial rising edge rise slowly enough), the seed pulse undergoes pulse steepening, where the initial part of the pulse is amplified to a great extent, resulting in excessive peak power (which can damage the gain fibers and/or non-linear broadening of the signal pulses) for a very small initial portion of the pulse, but ultimately resulting in lower-than-ideal total energy extraction from the amplifier chain 112 (spectral broadening results in a large portion of the linewidth of the pulse extending beyond the gain bandwidth of the gain medium (having wavelengths that are not amplified very much), meaning the gain medium is unable to amplify those wavelengths of the pulse—the energy extraction is then said to be "clamped"). In addition, a conventional DFBL source outputs a laser signal that has a narrow linewidth, which when amplified to the high powers desired for the present invention, results in stimulated Brillouin scattering (SBS) problems, often resulting in catastrophic damage to the fiber amplifiers and/or seed sources. Yet further, at very high-peak-power levels, the beam can undergo self-focusing behavior, also often resulting in catastrophic damage to the fiber amplifiers.

Figure 3C:
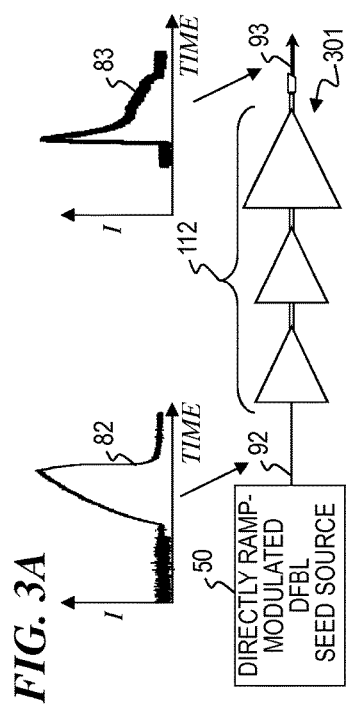
FIG. 3C is a block diagram of subsystem 101 (previously shown in FIG. 1A) that includes a Q-switched laser seed source 110 that outputs a seed pulse 91 (shown as graphed plot 81) that is amplified by high-power amplifier 112 that outputs an amplified pulse 98 (shown as graphed plot 88), according to some embodiments of the present invention.
Figure 3B:
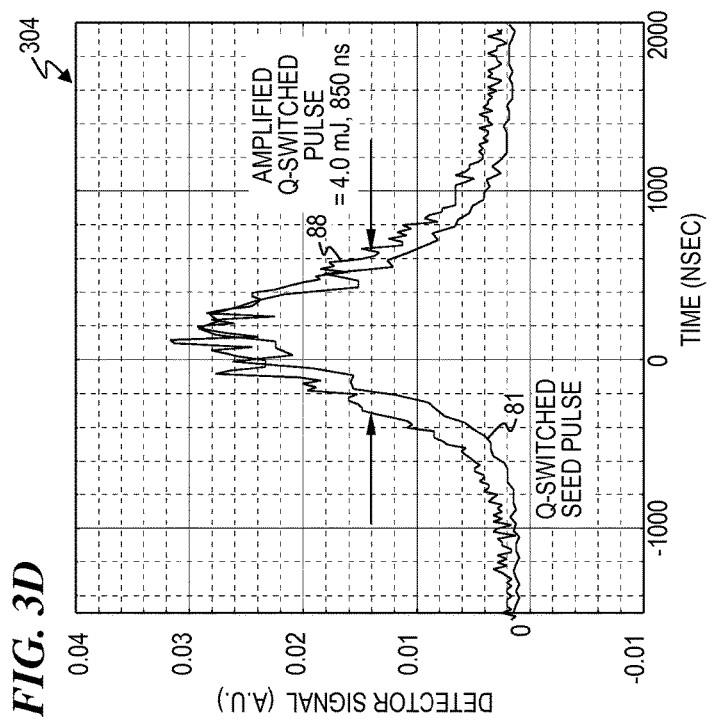
FIG. 3B is a detailed graph 302 of two signals, including a plot 82 showing the intensity-versus-time of ramped seed pulse 92, and a plot 83 showing the intensity-versus-time of the amplified pulse 93 resulting from the pulse steepening of the initial part of seed pulse 92.

FIG. 3B is a detailed graph 302 of two signals (the input seed pulse and output amplified pulse for amplifier chain 112 of FIG. 3A), including a plot 82 showing the intensity-versus-time of ramped seed pulse 92 of FIG. 3A, and a plot 83 showing the intensity-versus-time of the amplified pulse 93 of FIG. 3A resulting from the pulse steepening of the initial part of seed pulse 92.

FIG. 3C is a block diagram of subsystem 101 (previously shown in FIG. 1A) that includes a Q-switched laser seed source 110 that outputs a seed pulse 91 (shown as graphed plot 81) that is amplified by high-power amplifier 112 that outputs an amplified pulse 98 (shown as graphed plot 88), according to some embodiments of the present invention. In various embodiments, subsystem 101 is implemented as any of the configurations shown in Q-switched seed source subsystems of FIG. 1B1, FIG. 1B2, FIG. 1B3, FIG. 1B4, FIG. 1B5, FIG. 1C1, FIG. 1C2, FIG. 1D1, FIG. 1D2, FIG. 1E1, FIG. 1E2, FIG. 1E3, FIG. 1F1, FIG. 1F2, FIG. 1F3, FIG. 1G1, FIG. 1G2, FIG. 1G3, or the quasi-Q-switched seed source subsystems of FIG. 2A-FIG. 2B as described with the respective figure descriptions above.

Figure 3D:
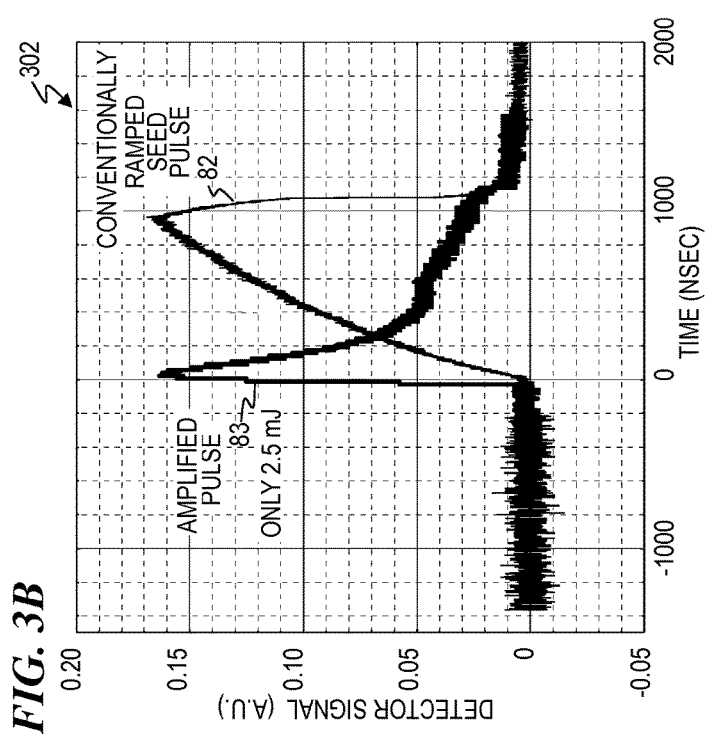
FIG. 3D is a detailed graph 304 of two signals, including a plot 81 showing the intensity-versus-time of Q-switched seed pulse 91, and a plot 88 showing the intensity-versus-time of the amplified pulse 98, according to some embodiments of the present invention.

FIG. 3D is a detailed graph 304 of two signals (the input Q-switched seed pulse and output amplified pulse for amplifier chain 112 of FIG. 3C), including a plot 81 showing the intensity-versus-time of Q-switched seed pulse 91 of FIG. 3C, and a plot 88 showing the intensity-versus-time of the amplified pulse 98 of FIG. 3C, according to some embodiments of the present invention. As can be seen, the amplified output pulse retains the basic temporal shape of the seed pulse, avoiding pulse steepening and obtaining high energy extraction (because the linewidth of the initial pulse is not excessively narrow, SBS problems are avoided, and because high peak power (relative to the energy extraction) is avoided, non-linear spectral broadening is avoided, thus keeping the linewidth of the pulse within the gain bandwidth of the amplifier chain, and energy extraction is thus increased.

Figure 3E:
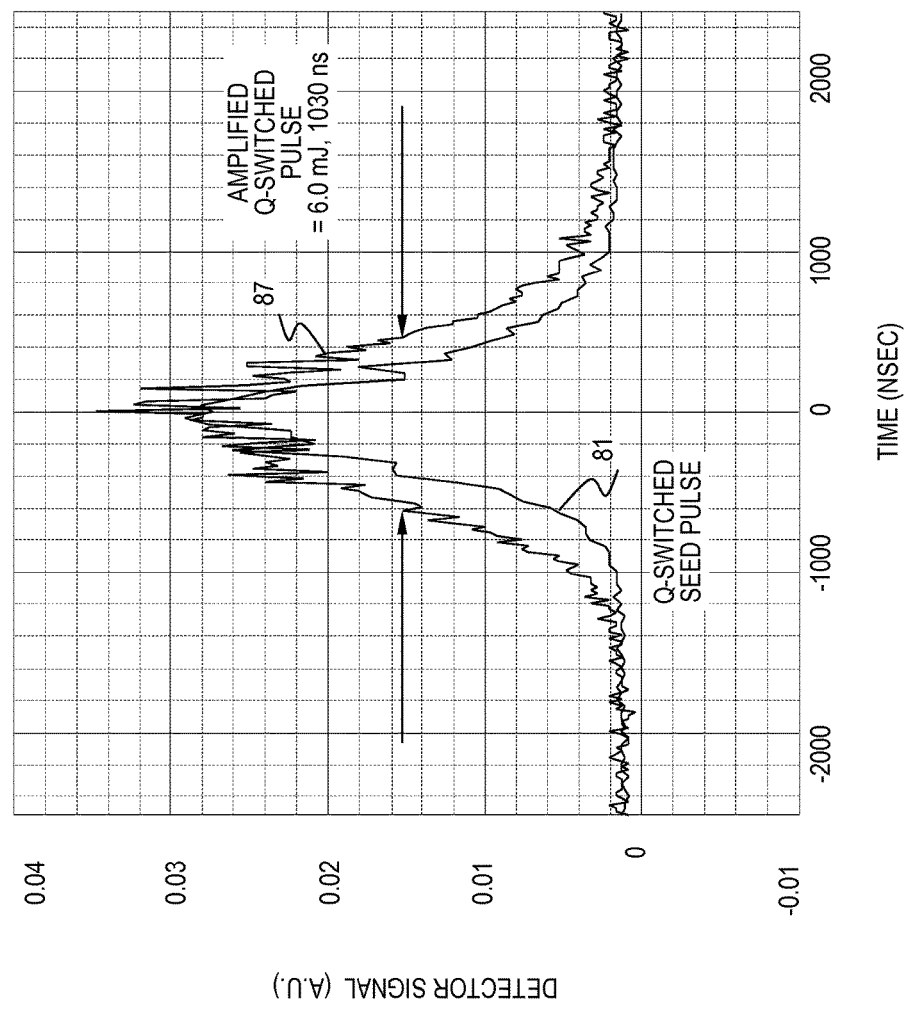
FIG. 3E is a detailed graph 305 of two signals, including a plot 81 showing the intensity-versus-time of Q-switched seed pulse 91, and a plot 87 showing the intensity-versus-time of the amplified pulse 98, according to some embodiments of the present invention.

FIG. 3E is a detailed graph 305 of two signals (corresponding to slightly different conditions and higher pump powers and amplification levels that still correspond to signals 91 and 98 of FIG. 3C), including a plot 81 showing the intensity-versus-time of Q-switched seed pulse signal 91, and a plot 87 showing the intensity-versus-time of the amplified pulse signal 98, according to some embodiments of the present invention. In some embodiments, the output pulse has an energy of about 6 mJ and has a shape that does not have excessive pulse steepening, thus allowing high energy extraction and little or no non-linear problems.

Some embodiments of the method of the present invention further include providing a vehicle having an enclosure (see FIG. 4A and FIG. 4B); supplying electrical power; using the electrical power, controlling and powering one or more optical-fiber amplifiers having Q-seed lasers in a MOPA configuration; and controlling an output direction of the single output beam in one of a plurality of different possible directions relative to the vehicle.

FIG. 4A is a block diagram of system 401 that includes a Q-seeded MOPA subsystem 100 mounted to a vehicle or facility 408, according to some embodiments of the present invention. In various embodiments, Q-seeded MOPA subsystem 100 is implemented using the various apparatus and method embodiments as shown in subsystem 101 of FIG. 1A, subsystem 102 of FIG. 1B1, subsystem 182 of FIG. 1B2, subsystem 183 of FIG. 1B3, subsystem 103 of FIG. 1C1, subsystem 104 of FIG. 1D1, subsystem 105 of FIG. 1E1, subsystem 106 of FIG. 1F1, or subsystem 1071 of FIG. 1G1 (each of which provides a Q-switched laser seed pulse); subsystem 201 of FIG. 2A or subsystem 202 of FIG. 2B (each of which provides a quasi-Q-switched laser seed pulse); or subsystem 501 of FIG. 5A, subsystem 502 of FIG. 5B, or subsystem 506 of FIG. 5F (each of which provides a Q-like seed pulse), and described herein. In some embodiments, system 401 includes vehicle or facility 408 (such as an airframe (e.g., helicopter, jet fighter, missile, autonomous flying vehicle or autonomous flying robot, or the like), a naval vessel (such as a destroyer, frigate, aircraft carrier, hovercraft, submarine or the like), land vehicle (such as a tank, Humvee®, or the like), or land facility (such as a laboratory, manufacturing plant, or bunker)). In some embodiments, vehicle or facility 408 holds one or more batteries and/or power supplies 418 that provide electrical power to the other components, one or more laser controllers 412, one or more image-calculation and -analysis computers or circuits 414, one or more signal processors 420, one or more beam pointers 430 and/or one or more imagers 416 that acquire image information regarding a scene (one or more of these units may be omitted in some embodiments). In some embodiments, each MOPA laser subsystem 100 includes a Q-switched-laser seed source. In some embodiments, the output beam 98 from MOPA laser subsystem 100 is pointed in a particular direction by beam pointer 430, in order to provide illumination or signal light 99 for image acquisition (e.g., by beam spreading to cover the scene or by beam scanning to send optical pulses to each of a plurality of points to be imaged), LIDAR measurements (generally by sending a narrow beam pulse in one of a plurality of directions and measuring the time delay until a reflection pulse is detected—e.g., a pulse reflected from some scene or target 70) and the like.

FIG. 4B is a block diagram of system 402 that includes a plurality of Q-seeded MOPA subsystems 100 whose output beams 98 are combined in spectral-beam-combiner apparatus 440, all mounted to a vehicle or facility 409, according to some embodiments of the present invention. In various embodiments, each of the plurality of Q-seeded MOPA subsystems 100 is implemented using the various apparatus and method embodiments as shown in FIG. 1A, FIG. 1B1, FIG. 1B2, FIG. 1B3, FIG. 1C1, FIG. 1C2, FIG. 1D1, FIG. 1D2, FIG. 1E1, FIG. 1E2, FIG. 1E3, FIG. 1F1, FIG. 1F2, FIG. 1F3, FIG. 1G1, FIG. 1G2, FIG. 1G3, FIG. 2A, FIG. 2B, FIG. 5A, FIG. 5B, or FIG. 5F, and described herein. In some embodiments, system 402 of FIG. 4B is substantially similar to system 401 of FIG. 4A except that the spectral-beam combiner 440 allows spectral-beam combining (SBC) a plurality of pulses from the plurality of laser subsystems 100 into a single, much-higher-energy SBC output pulse 96, which is then optionally pointed by optional beam pointer 430 to form output beam 95. In some embodiments, system 402 includes vehicle or facility 409 (such as an airframe (e.g., helicopter, jet fighter, missile, autonomous flying vehicle or autonomous flying robot, or the like), a naval vessel (such as a destroyer, frigate, aircraft carrier, hovercraft, submarine or the like), land vehicle (such as a tank, Humvee®, or the like), or land facility (such as a laboratory, manufacturing plant, or bunker)). In some embodiments, vehicle or facility 409 holds one or more batteries and/or power supplies 418 that provide electrical power to the other components, one or more laser controllers 412, one or more image calculation and analysis computers or circuits 414, one or more signal processors 420, one or more beam pointers 430 and/or one or more imagers 416 that acquire image information regarding a scene (one or more of these units may be omitted in some embodiments). System 402 also includes a plurality of MOPA laser subsystems 100 whose output beams are combined by SBC unit 440. In some embodiments, each MOPA laser subsystem 100 includes a Q-switched seed source, wherein pulses from a plurality of such sources are synchronized in time (e.g., in some embodiments, to occur simultaneously or substantially simultaneously in order to increase beam brightness). In some embodiments, the output pulse beam 96 from SBC 440 is pointed in a particular direction as output beam 99 by beam pointer 430 (in some embodiments, this is under control of controller 412), in order to provide illumination or signal light for image acquisition, LIDAR measurements and the like (e.g., in relation to scene or target 70). The unique highly efficient energy extraction provided by the Q-seed MOPA sources provides unique capabilities and unique high-power and high-energy light pulses that make system 402 and system 401 a new combination not available using conventional laser-illuminator solutions.

FIG. 5A is a schematic diagram of a subsystem 501 that includes a laser-and-serial/parallel-modulator combination (called a serial/parallel Q-like-seed-pulse generator) 510 that outputs a Q-like seed pulse 591 (i.e., a pulse having a temporal shape that resembles the temporal shape of a pulse from a Q-switched laser, and, in some embodiments, the pulse has a broad spectral linewidth similar to the linewidth obtained by a Q-switched laser) that is amplified by high-power amplifier 112 that outputs an amplified pulse 598, according to some embodiments of the present invention. In some embodiments, serial/parallel Q-like-seed-pulse generator 510 includes a broadband laser device 511 whose operation (e.g., power level, temperature and the like) is controlled by system controller 5279, and which outputs a CW laser signal 512 that is coupled into seed-input splitter 524 (in some embodiments, after passing through noise averager 540). In the context of FIG. 5A, a CW laser signal is a laser signal that has a substantially constant intensity (i.e., substantially constant except for a given amount of amplitude noise) over a period of time (e.g., in some embodiments, more than a second and perhaps more than 15 minutes, in order to obtain stable laser operation) that is very long as compared to the length of the final Q-like seed signal (which, in some embodiments, has an FWHM duration of no more than 1000 microseconds and perhaps no more than 10 microseconds).

Figure 5F:
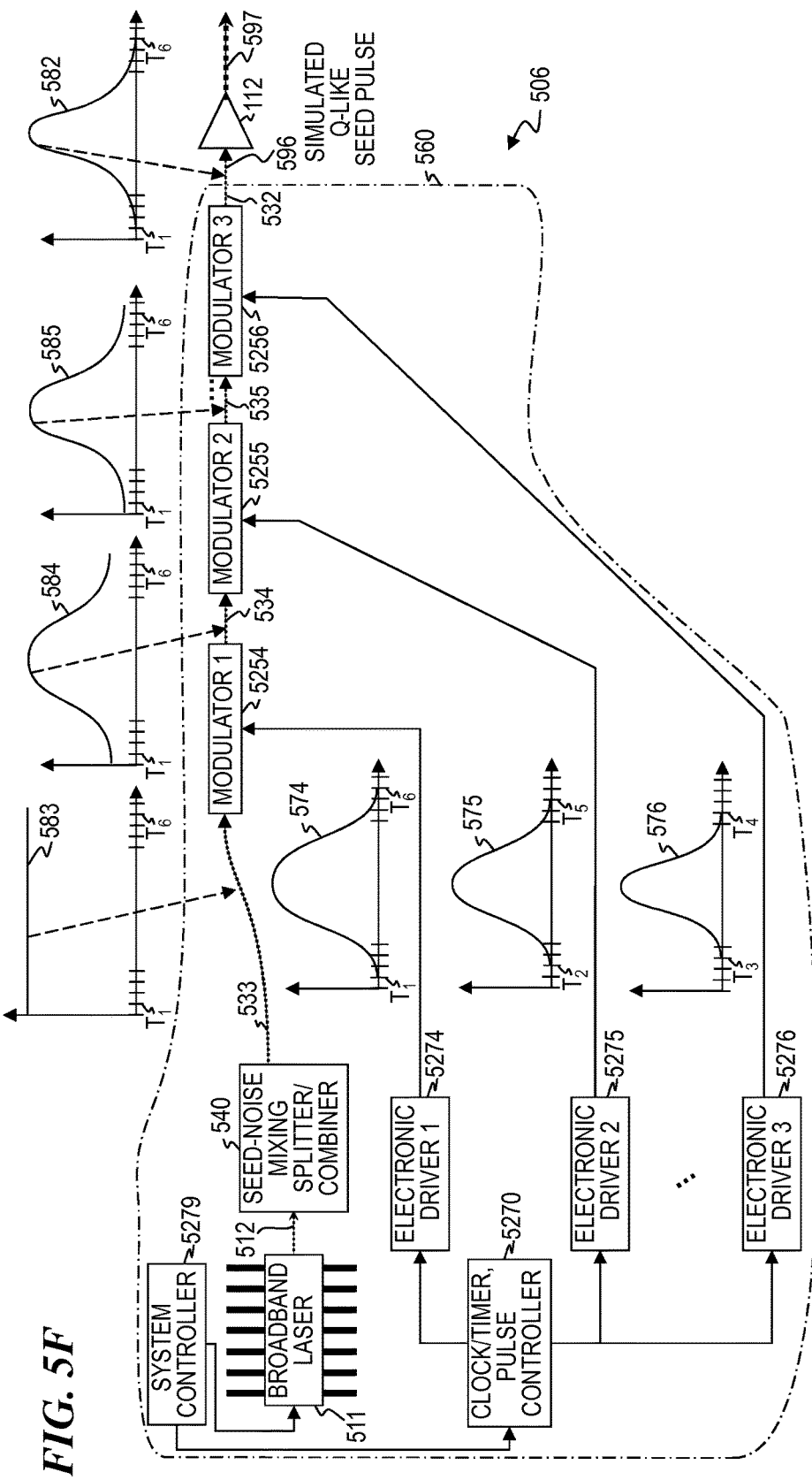
FIG. 5F is a schematic diagram of a subsystem 506 that includes a laser-and-serial-modulator combination 560 (called a Q-like-seed-pulse generator 560) that outputs a Q-like seed pulse 596 that is amplified by high-power amplifier 112 that outputs an amplified pulse 597, according to some embodiments of the present invention.

In other embodiments of subsystem 501 of FIG. 5A (as well as for some other embodiments of subsystem 502 of FIG. 5B and of subsystem 506 of FIG. 5F), rather than using a broadband laser, device 511 instead uses a controlled-linewidth amplified-spontaneous-emission (ASE) device such as described in U.S. Pat. No. 7,539,231 titled "APPARATUS AND METHOD FOR GENERATING CONTROLLED-LINEWIDTH LASER-SEED-SIGNALS FOR HIGH-POWERED FIBER-LASER AMPLIFIER SYSTEMS" issued May 26, 2009 to Eric C. Honea et al., which is incorporated herein by reference.

In still other embodiments, in contrast to using a broadband CW laser for device 511 of FIG. 5A, a pulsed diode laser is used for device 511 into a subsystem otherwise similar to that of FIG. 5A, and a chirp-slice arrangement (such as described in U.S. Pat. No. 7,701,987 titled "APPARATUS AND METHOD FOR GENERATING CHIRP-SLICE CONTROLLED-LINEWIDTH LASER-SEED SIGNALS" issued Apr. 20, 2010 to Matthias P. Savage-Leuchs et al.) is used to generate a chirped laser pulse and to select a suitable time-slice portion of the chirped laser pulse that is then used as the input laser signal for one or more of the modulators 5251, 5252 and 5253 of FIG. 5A. Such a chirped seed pulse avoids SBS by changing the frequency (and thus the wavelength) of the pulse at a rate that is fast enough to avoid SBS. By selecting the temperature, the idle current supplied to the laser diode, and the pulse shape and magnitude of the current supplied to the laser diode, various parameters of the chirped laser signal can be adjusted. By selecting an appropriate start time and end time of the slice of the chirped pulse to be used, the starting wavelength and the amount of change of the wavelength can then be chosen by design. Then, by selecting the magnitude of the portions of the signal that is input to each of a plurality of amplitude modulators (by a suitable signal splitter 524) and the start time of the electrical pulse driving each modulator (relative to the start time of the chirp slice), a great deal of control over the temporal shape, the spectral content (and its change over time), and the wavelength can be obtained.

In some embodiments, the signal from device 511 (in some embodiments, a broadband semiconductor laser or optical-waveguide-based laser as shown in FIG. 5A, or, in other embodiments, from a controlled linewidth ASE source or sliced-chirp laser used in its place (as described more fully in U.S. Pat. Nos. 7,539,231, 7,701,987 described above)) will have an undesirable amount of amplitude noise (i.e., short-term variation in intensity or power). In some embodiments, such noise is reduced by noise averager 540 that divides the signal into a plurality of portions, then delays each portion by a different amount of time (e.g., by passing each portion through a different-length surface waveguide of a planar optical device or through an optical fiber of a different length), and then recombines (mixes) the delayed portions with each other. For example, if the input signal 512 is divided into 32 portions, each of which is delayed by a different incremental amount and then rejoined with the other portions, the resulting averaged signal 512' may be viewed to be a 32-point moving average of the input signal 512. In some embodiments, noise averager 540 includes a seed-mixing splitter that divides the signal 512 from device 511 into a plurality of portions (e.g., in various embodiments, 2, 4, 8, 16, 32, 64, or 128 or other suitable number of portions), wherein each portion is passed through its respective optical-fiber (or planar-waveguide) path 542 . . . path 544, each one of the plurality of paths having a different length (as represented by the depiction of the plurality of paths 542 . . . 544 shown in FIG. 5A, where straight path 542 is the shortest, deeply curved path 544 is the longest, and a plurality of other different-length paths having various intermediate lengths are also provided). The light from the plurality of paths 542 . . . 544 is then recombined with each other by seed-mixing combiner 549 to form noise-reduced averaged signal 512'. Depictions of these signals are shown in FIG. 5C described further below.

Referring again to FIG. 5A, in some embodiments, the noise-reduced signal 512' from noise averager 540 is coupled to seed-envelope splitter 524, while in other embodiments, noise averager 540 is omitted and signal 512 from device 511 is directly coupled to seed envelope splitter 524. As can be noted, seed-mixing splitter 541 is used to divide its input optical signal into a plurality of portions, each of which is subjected to a different delay before being recombined into a single signal 512' by seed-mixing combiner 549; in contrast, seed-envelope splitter 524 is used to divide its input optical signal into a plurality of portions, each of which is subjected to a different envelope (amplitude) modulation before being recombined into a single signal 591 by seed-output combiner 526.

In various embodiments, seed-envelope splitter 524 outputs a minority portion of the optical initial seed signal 512 or 512' (such as 1% in some embodiments (as in the embodiment shown here); or, in other embodiments, 0.1%, 0.2%, 0.5%, 2%, 5%, or 10% or other suitable minority portion of the initial seed signal 512 or 512') to optical signal path 513 (e.g., in some embodiments, optical signal path 513 includes an optical fiber that couples the signal from splitter 524 to modulator 5251). Seed-envelope splitter 524 outputs a majority portion of the initial seed signal 512 or 512' (such as 99% in some embodiments (as in the embodiment shown here); or, in other embodiments, 99.9%, 99.8%, 99.5%, 98%, 95%, or 90% or other suitable majority portion of the input signal) to optical signal path 514 (e.g., in some embodiments, optical signal path 514 includes an optical fiber that couples the signal from splitter 524 to modulator 5252). By sending only a very small portion of the initial seed signal 512 or 512' to optical signal path 513, the very early portions of the leading edge of the Q-like-seed-pulse signal 591 can start at an extremely small value (virtually zero signal-light intensity) and then ramp up (the rate of increase in intensity) relatively very slowly (as compared to the rate of increase in intensity of later portions of the leading edge of the Q-like-seed-pulse signal 591). Because only a very small amount of light is passed along path 513, the amount of light output to path 516 when modulator 5251 is off is very small, providing a good extinction ratio to the final seed pulse 591. In contrast, a much larger portion of the total pulse is serially passed through a plurality of amplitude modulators 5252 . . . 5253. The serial configuration is used in order to achieve a high extinction ratio (i.e., the light intensity passed by the plurality of serial modulators 5252 through 5253 when the modulators are "off" is desired to be virtually zero) for this lower path; while the high extinction ratio of the upper path through modulator 5251 is achieved, in part, by the very small percentage of the initial seed signal 512 or 512' that is passed by splitter 524 to path 513.

In some embodiments, clock/timer-pulse controller 5270 (under the control of system controller 5279) controls the timing of a plurality of electronic drivers, e.g., electronic driver 5271, electronic driver 5272, and electronic driver 5273, such that the electrical modulation pulse from electronic driver 5271 starts up first (at a time $T_1$ relative to each seed pulse) such that the small amount of light through modulator 5251 starts its slow ramp up first and is passed to seed output combiner 526 to become part of the Q-like seed pulse 591. Then the electrical modulation pulse from electronic driver 5272 starts up second (at a time $T_2$ relative to each seed pulse) such that the moderate amount of light through modulator 5252 starts its slow ramp up next, but the output signal 515 from modulator 5252 is then passed through one or more additional modulators (e.g., modulator 5253) to increase the extinction ratio when the Q-like seed pulse 591 is supposed to be off (i.e., between Q-like seed pulses on signal 591). Then the electrical modulation pulse from electronic driver 5273 starts up third (at a time $T_3$ relative to each seed pulse) such that the moderate amount of light through modulator 5253 starts its slow ramp up next, and the output signal 517 from modulator 5253 is combined with the output signal 516 from modulator 5251 by combiner 526 to form the total of Q-like seed pulse 591. A further advantage of the serial modulators 5252 and 5253 is that the ramp-up rate very near the start of the pulse (e.g., the time between time $T_2$ and time $T_3$ relative to each seed pulse) is further slowed because only one of the modulators (modulator 5252) is starting to turn on, while the ramp-up rate later in the pulse is relatively much faster since both of the serial modulators 5252 and 5253 are ramping towards their full-on conditions (their transparent states). In some embodiments, the electrical pulse from electronic driver 5271 has a temporal shape of plot 571 starting at time $T_1$ and ending at time $T_6$, the electrical pulse from electronic driver 5272 has a temporal shape of plot 572 starting at time $T_2$ and ending at time $T_5$, and the electrical pulse from electronic driver 5273 has a temporal shape of plot 573 starting at time $T_3$ and ending at time $T_4$. These plots of electrical signal (e.g., current or voltage amplitude) versus time are shown in more detail in FIG. 5D described below.

FIG. 5B is a schematic diagram of a subsystem 502, an alternative embodiment in which only modulators 5251 and 5252 are coupled in parallel, and their respective outputs are coupled together by combiner 526 and its output is then connected serially through modulator 5253 whose output 592 is coupled to amplifier chain 112. In contrast to the serial/parallel Q-like-seed-pulse generator 510 described for FIG. 5A, this alternative configuration is herein referred to as a parallel/serial Q-like-seed-pulse generator 520. In some embodiments, a noise averager 540 (as described above) is included to reduce noise amplitude, while in other embodiments, noise averager 540 is omitted. As was the case for subsystem 501 of FIG. 5A, the seed-envelope splitter 524 sends a very small portion of optical signal 512 (or 512') as optical signal 513 into modulator 5251, which is gradually "opened" under control of the initial low-amplitude slow-rising electrical signal from electronic driver (ED1) 5271, which starts gradually rising at time $T_1$, and controls modulator 5251 to allow a gradually increasing amount of the optical signal 513 through as signal 516. The low-amplitude, slow-rising optical-signal waveform 516 from modulator 5251 is further attenuated by the initially "off" modulator 5253, which allows only a small "leakage" amount of the initial light from modulator 5251 through when modulator 5253 is "off." In some embodiments, modulator 5252 is a serial combination of two or more optical modulators that are each driven by similar signals (e.g., from a single electronic driver 5272), in order to achieve a higher extinction ratio. After time $T_1$, at a slightly later time $T_2$, modulator 5252 is gradually "opened" under control of the slow-rising electrical signal from electronic driver 5272, which starts at time $T_2$, and controls modulator 5252 to allow a gradually increasing amount of the optical signal 514 through as signal 517. Seed output combiner (SOC) 526 combines signal 516 and signal 517, which are then passed to modulator 5253, which remains in its "off" state until time $T_3$, allowing only a leakage amount of the combined signals 516 and 517 through until a still later time $T_3$, when modulator 5253 is gradually opened under control of the slow-rising electrical signal from electronic driver (ED3) 5273, which starts gradually opening at time $T_3$. This provides a Q-like seed-signal pulse that gradually builds up from just a few photons at its early leading edge to a gradually accelerating ramp up later on the leading edge, thus preventing much of the pulse steepening that would otherwise occur in power amplifier chain 112.

FIG. 5C is a schematic graph 503 showing a plot 1512 of a simulated noise portion of signal 512 of FIG. 5A or FIG. 5B and a plot 1512' of the noise portion of a noise-reduced signal 512' of FIG. 5A or FIG. 5B obtained by averaging thirty-two equal portions of signal 512, each delayed by a different time amount. The plot 1512 of the simulated noise amplitude has been normalized to an average value of one (1.0) with an amplitude variation of plus or minus one (of course, a real laser signal 512 might have a noise amplitude of a very small percentage of the average intensity, often much less than one percent). The plot 1512' represents the 32-period running average of the plot 1512 of the simulated noise portion of signal 512. As can be seen, such a running average 1512' is similar to a low-pass filter on the amplitude of the noise 1512, reducing the frequency of the noise as well as reducing its amplitude variation to about one fourth (about 25%) of the amount of amplitude variation of the noise 1512.

FIG. 5D is a schematic graph 504 showing plots of idealized electrical pulses 571, 572, and 573 used to drive respective optical modulators 5251, 5252, and 5253 in some embodiments of subsystem 501 of FIG. 5A or subsystem 502 of FIG. 5B. In some embodiments, the leading edge (which is the most important feature, since the energy in the amplifier chain 112 is mostly depleted by the time the trailing edge occurs) of one or more of these pulses approximates a Gaussian temporal shape. In some embodiments, the electrical pulse from electronic driver 5271 (plot 571) starts at time $T_1$ relative to each seed pulse and ends at time $T_6$ relative to each seed pulse; the electrical pulse from electronic driver 5272 (plot 572) starts at time $T_2$ relative to each seed pulse (i.e., later than time $T_1$) and ends at time $T_5$ relative to each seed pulse; and the electrical pulse from electronic driver 5273 (plot 573) starts at time $T_3$ relative to each seed pulse (i.e., also later than time $T_1$) and ends at time $T_4$ relative to each seed pulse. As mentioned, the timing and gradual ramp-up rates at the leading edge of the seed pulse 591 are more important to the efficient functioning of subsystem 501 or subsystem 502 than are the trailing edges. Further, in some embodiments, the timing and shape of the electrical pulses that drive modulators 5252 and 5253 can be interchanged (the electrical pulse of plot 573 could instead be delivered to modulator 5252 and the electrical pulse of plot 572 could instead be delivered to modulator 5253), since amplitude modulation is essentially a multiplicative function, and multiplication is commutative. Other embodiments use a number of optical modulators greater than three and a number of electrical drivers greater than three, with a resultant number of electrical signals greater than three.

FIG. 5E is a schematic graph 505 showing plots of idealized electrical pulses 574, 575, and 576 used to drive respective optical modulators 5254, 5255, and 5256 in some embodiments of subsystem 506 of FIG. 5F (described below). Because of the relative delays between the start times of the pulses, fewer than all of the modulators are starting to turn on at $T_1$ to $T_2$, thus providing the ability for fine control over the ramp-up rate very early in the pulse, and thus providing high dynamic range for the intensity of the seed pulse. As was the case described for FIG. 5A and FIG. 5B, subsystem 506 of FIG. 5F allows independent control over the temporal shape and over the spectral content (even spectral content that changes over time) of Q-like seed pulse 592.

FIG. 5F is a schematic diagram of a subsystem 506 that includes a laser-and-serial-modulator combination (called a serial-modulator Q-like-seed-pulse generator) 560 that outputs a Q-like-seed-pulse signal 596 (having an amplitude represented by plot 582) that is amplified by high-power amplifier 112 that outputs an amplified pulse 597, according to some embodiments of the present invention. In some embodiments, serial-modulator Q-like-seed-pulse generator 560 includes a broadband laser 511 whose operation (e.g., power level, temperature and the like) is controlled by system controller 5279, and which, in some embodiments, outputs a CW laser signal 512 (represented by plot 583) that is coupled into optical signal path 513 (e.g., in some embodiments, optical signal path 513 includes an optical fiber that couples signal from laser 511 to modulator 5254). By sending the CW laser signal 512 to optical signal path 533 and then through a plurality of serially connected modulators 5254, 5455 . . . 5256, the very early portions of the leading edge of the Q-like-seed-pulse signal 596 can start at an extremely small value (virtually zero signal-light intensity) and then ramp up (the rate of increase in intensity) relatively very slowly (as compared to the rate of increase in intensity of later portions of the leading edge of the Q-like-seed-pulse signal 596) because the rate of increase over time of the light passed by modulator 5254 is reduced by the other modulators that are "off" (only passing a leakage amount of light) during the early portions of the seed pulse. Because only a very small amount of light is passed by the later "off" modulators (the plurality of modulators 5255 through 5256 driven by the plurality of electronic drivers 5275 . . . 5276, as indicated by the ellipses in the illustration here), the amount of light output to path 532 when modulator 5254 is off (before the start of the seed pulse) is very small, providing a good extinction ratio to the final Q-like-seed-pulse signal 596. In contrast, once modulator 5254 has started too turn on, a much larger portion of the total pulse is serially passed through the plurality of amplitude modulators 5255 through 5256, in order to achieve the higher rate of increase over time later in the pulse. In some embodiments, clock/timer-pulse controller 5270 (under control of system controller 5279) controls the timing of electronic driver 5274, electronic driver 5275, and electronic driver 5276 (which are connected to modulators 5254, 5255, and 5256, respectively), such that the electrical modulation pulse (represented by magnitude-versus-time plot 574) from electronic driver 5274 starts up first (at a time $T_1$ relative to each seed pulse) such that the small amount of light output through modulator 5254 (signal 534 represented by magnitude-versus-time plot 584) starts its slow ramp up first, and is slightly passed through the "off" modulators 5255 through 5256 as leakage signal light) to become the initial (slow-ramp) part of the Q-like seed pulse 596. Then the electrical-modulation pulse from electronic driver 5275 (represented by magnitude-versus-time plot 575) starts up second (at a time $T_2$ relative to each seed pulse) such that the moderate amount of light through modulator 5254 and then modulator 5255 (signal 535 represented by magnitude-versus-time plot 585) starts its slow ramp up next, but the output signal 535 from modulator 5255 is then passed through one or more additional modulators (e.g., where the ellipsis is shown between modulator 5255 and modulator 5256) to increase the extinction ratio when the Q-like seed pulse 596 is supposed to be off (i.e., between pulses). Then the electrical modulation pulse from electronic driver 5276 starts up third (at a time $T_3$ relative to each seed pulse) such that the moderate amount of light through modulator 5254 and then modulator 5255 and then modulator 5256 starts its moderate ramp up next, and the output signal 532 from modulator 5256 is the total of Q-like seed pulse 596. A further advantage of the serial modulators 5255 and 5256 is that the ramp-up rate very near the start of the pulse (e.g., the time between time $T_2$ and time $T_3$ relative to each seed pulse) is further slowed because only one of the modulators (modulator 5255) is initially starting to turn on, while the ramp-up rate later in the pulse is relatively much faster since all three of the serial-connected modulators 5254, 5255 and 5256 are ramping towards their respective full-on condition (their transparent state).

Regarding FIG. 5F, the combination of the serial-connected modulators 5254, 5255 and 5256 with the different sequential ramp-up-start times $T_1$, $T_2$ and $T_3$ relative to each seed pulse, wherein these times can be programmed (e.g., as control instructions) into system controller 5279 and/or clock/timer-pulse controller 5270 (under control of system controller 5279), provides a simulated Q-like seed pulse 596 that can be readily customized to changing conditions and/or system configurations (e.g., different amplifier chains 112 or different pump lasers that supply optical-pump power to a given amplifier chain 112) without the need to re-customize a Q-switch seed laser to change its pulse shape, which might otherwise be required.

Regarding FIG. 5A and FIG. 5B, the combination of input seed-envelope splitter 524, which can be exchanged for another splitter delivering different amounts of the laser signal 512 to the various branches of the serial/parallel pulse-envelope-modulator array (e.g., by swapping a 1%-99% splitter for a 0.1%-99.9% splitter), and the different sequential ramp-up start times $T_1$, $T_2$ . . . $T_3$ relative to each seed pulse, wherein these times can be programmed (e.g., as control instructions) into system controller 5279 and/or clock/timer-pulse controller 5270 (under control of system controller 5279), provides a simulated Q-like seed pulse 591 (FIG. 5A) or 592 (FIG. 5B) that can be readily customized to changing conditions and/or system configurations (e.g., different amplifier chains 112 or different pump lasers that supply optical-pump power to a given amplifier chain 112) without the need to re-customize a Q-switch seed laser to change its pulse shape, which might otherwise be required.

Further, the spectral components (the wavelength and linewidth, and in some embodiments, the chirp (wavelength change over time—see the following paragraph)) of the Q-like seed pulse 591 of FIG. 5A, the Q-like seed pulse 592 of FIG. 5B, or the Q-like seed pulse 596 of FIG. 5F can be adjusted (by device 511 (as controlled by system controller 5279) and/or the choice between broadband laser (as shown in FIG. 5A) or controlled-linewidth ASE source or sliced-chirped-laser pulse source as the light source for device 511) independently of adjustments to the temporal shape of the pulse (under the control of controller 5270 and drivers 5271, 5272, . . . 5273).

In some embodiments, the lower part count, lower part cost and/or simpler configuration leads to lower cost and a more rugged and reliable system when using Q-switched seed lasers (as described for FIGS. 1A-1G3), or the quasi-Q-switched seed lasers (as described for FIGS. 2A-2B), while other embodiments that provide Q-like seed pulses (as described for FIGS. 5A-5B and 5F) provide independent control over the seed-signal pulse shape and spectral content.

In some embodiments, the present invention provides an apparatus and process wherein high-power-amplified Q-switched-temporal-shape pulse laser signals (such as from Yb-doped fiber power amplifiers that are pumped using semiconductor pump lasers and provided Q-switched-temporal-shape pulsed Q-seed signals having a wavelength of between about 1050 nm and 1150 nm) are converted to a plurality of different longer wavelengths using cascaded Raman converter (CRC) fibers having fiber-Bragg gratings (FBGs) that form overlapping resonator cavities at each of a plurality of successively longer wavelengths, such as described in commonly assigned co-pending U.S. patent application Ser. No. 12/624,327 titled "SPECTRALLY BEAM COMBINED LASER SYSTEM AND METHOD AT EYE-SAFER WAVELENGTHS" filed Nov. 23, 2009 by inventor Roy D. Mead (which issued as U.S. Pat. No. 8,441,718 on May 14, 2013), which is incorporated herein by reference. In some embodiments, the output laser beams from a plurality of cascaded Raman converter (CRC) fiber systems are at a plurality of different closely-spaced narrow-band wavelengths in the general range of about 1400 nanometers (nm) to about 1500 nm. Since the front parts (e.g., cornea) of the human eye are relatively opaque to such wavelengths, the output of such wavelengths is relatively safer for human eyes (thus, these are called eye-safer wavelengths) than are wavelengths in the visible spectrum (about 400 nm to about 700 nm) or the near infrared (IR) wavelengths of 700 nm to 1350 nm, where the cornea is relatively transparent and permanent damage to the retina of the eye can readily happen.

In some embodiments, the present invention provides an apparatus and process wherein eye-safer wavelengths of between about 1500 nm and 2000 nm are provided by a thulium-holmium co-doped fiber power amplifier.

In some embodiments, the present invention provides a method that includes generating an amplified pulse from a Q-switched-temporal-shape seed pulse, and generating a plurality of different wavelengths of laser light by Raman shifting the amplified Q-switched-temporal-shape pulse in optical fibers to wavelengths longer than 1300 nm; and spectral-beam combining the plurality of Raman-shifted wavelengths into a single Raman-shifted output beam.

Some embodiments of the method further include providing a vehicle having an enclosure; supplying electrical power; using the electrical power, controlling and powering the plurality of optical-fiber amplified Q-switched-temporal-shape-pulse Raman laser beams; and controlling an output direction of the single output beam in one of a plurality of different possible directions relative to the vehicle.

In some embodiments, the present invention provides a method that includes generating a seed signal having a Q-switched-pulsed-laser temporal shape using a first pump source; providing an optical gain fiber having a second pump source; and amplifying the Q-switched pulsed-laser seed signal in the optical gain fiber to obtain an output beam having a power of at least one milliJoule (1 mJ).

Some embodiments of the method further include providing a vehicle having an enclosure; supplying electrical power; using the electrical power, controlling and powering the pump source; and controlling an output direction of the output beam in one of a plurality of different possible directions relative to the vehicle.

In some embodiments of the method, the generating of the seed signal having the Q-switched-pulsed-laser temporal shape includes optically amplitude-modulating a signal inside a uni-directional ring cavity.

In some embodiments of the method, the generating of the seed signal having the Q-switched-pulsed-laser temporal shape includes optically amplitude-modulating a signal inside a laser cavity that is implemented in a single package having a volume of no more than 6 $cm^3$ (e.g., 3 cm by 2 cm by 1 cm). In other embodiments, the single package has a volume of no more than 20 $cm^3$. In other embodiments, the single package has a volume of no more than 10 $cm^3$. In other embodiments, the single package has a volume of no more than 8 $cm^3$. In other embodiments, the single package has a volume of no more than 7 $cm^3$. In other embodiments, the single package has a volume of no more than 5 $cm^3$. In other embodiments, the single package has a volume of no more than 4 $cm^3$. In other embodiments, the single package has a volume of no more than 3 $cm^3$. In other embodiments, the single package has a volume of no more than 2 $cm^3$. In other embodiments, the single package has a volume of no more than 1 $cm^3$.

In some embodiments of the method, the generating of the seed signal having the Q-switched-pulsed-laser temporal shape includes generating an optical pulse having an FWHM duration of no more than 50 nanoseconds.

In some embodiments of the method, the amplifying of the Q-switched pulsed-laser seed signal includes outputting the output beam pulse with a power of at least 4 mJ.

In some embodiments of the method, wherein the seed signal has a linewidth of 1 THz or more, in order to reduce SBS problems.

In some embodiments, the present invention provides an apparatus that includes a Q-switched seed laser configured to output a Q-switched pulsed-laser seed signal; and an optical gain fiber having a first pump source and operatively coupled to the Q-switched seed laser and configured to amplify the Q-switched pulsed-laser seed signal in the optical gain fiber to obtain an output beam pulse having a power of at least one milliJoule (1 mJ). In some embodiments, the output beam pulse has a power of at least 2 mJ. In some embodiments, the output beam pulse has a power of at least 3 mJ. In some embodiments, the output beam pulse has a power of at least 4 mJ. In some embodiments, the output beam pulse has a power of at least 5 mJ. In some embodiments, the output beam pulse has a power of at least 6 mJ. In some embodiments, the output beam pulse has a power of at least 7 mJ. In some embodiments, the output beam pulse has a power of at least 8 mJ. In some embodiments, the output beam pulse has a power of at least 10 mJ. In some embodiments, the output beam pulse has a power of at least 15 mJ. In some embodiments, the output beam pulse has a power of at least 20 mJ.

Some embodiments of the apparatus further include a vehicle having an enclosure; an electrical power supply attached to the vehicle; a laser controller operatively coupled to receive electrical power from the electrical power supply and operably coupled to power and control the first pump source; and a beam-direction controller operably coupled to receive the output beam from the optical gain fiber and operable to direct the output beam in one of a plurality of different possible directions relative to the vehicle.

In some embodiments, the present invention provides an apparatus that includes a pulsed Q-seed source having a light source configured to output a Q-seed signal having a temporal shape that, for the leading edge of the Q-seed pulse, substantially matches the temporal shape of the leading edge of a Q-switched laser pulse; and an optical gain fiber having a first pump source and operatively coupled to the pulsed Q-seed source and configured to amplify the Q-seed pulse in the optical gain fiber to obtain an output beam having an energy of at least one milliJoule (1 mJ). In some embodiments, the output beam pulse has an energy of at least 2 mJ. In some embodiments, the output beam pulse has an energy of at least 3 mJ. In some embodiments, the output beam pulse has an energy of at least 4 mJ. In some embodiments, the output beam pulse has an energy of at least 5 mJ. In some embodiments, the output beam pulse has an energy of at least 6 mJ. In some embodiments, the output beam pulse has an energy of at least 7 mJ. In some embodiments, the output beam pulse has an energy of at least 8 mJ. In some embodiments, the output beam pulse has an energy of at least 10 mJ. In some embodiments, the output beam pulse has an energy of at least 15 mJ. In some embodiments, the output beam pulse has an energy of at least 20 mJ.

In some embodiments, the pulsed Q-seed source includes a semiconductor diode laser that is driven by an electrical pulse that causes the semiconductor diode laser to emit a pulse having the leading edge that substantially matches the temporal shape of the leading edge of a Q-switched laser pulse.

In some embodiments, the pulsed Q-seed source includes a semiconductor diode laser that outputs a CW laser signal that is coupled through an electro-optical modulator (EOM) that is driven by an electrical pulse that causes the electro-optical modulator to emit an amplitude-modulated pulse from the CW laser signal, the amplitude-modulated pulse having the leading edge of the seed pulse that substantially matches the temporal shape of the leading edge of a Q-switched laser pulse.

In some embodiments, the pulsed Q-seed source includes a semiconductor diode laser that outputs a CW laser signal that is coupled through an acousto-optical modulator (AOM) that is driven by an electrical pulse that causes the acousto-optical modulator to emit an amplitude-modulated pulse from the CW laser signal, the amplitude-modulated pulse having the leading edge of the seed pulse that substantially matches the temporal shape of the leading edge of a Q-switched laser pulse.

In some embodiments, the pulsed Q-seed source includes a chirped semiconductor diode laser that outputs a chirped-pulse laser signal that is coupled through a first modulator that is driven by an electrical pulse that causes the modulator to emit an amplitude-modulated temporal slice from the chirped-pulse laser signal, which is then coupled through a second electronically controlled amplitude modulator that imposes a Q-switched-like amplitude-modulated envelope to the pulse slice, the envelope forming the leading edge of the Q-seed pulse to substantially match the temporal shape of the leading edge of a Q-switched laser pulse.

In some embodiments, the pulsed Q-seed source includes a controlled-linewidth ASE signal source that outputs a controlled-linewidth ASE signal that is coupled through an electronically controlled amplitude modulator that imposes a Q-switched-like amplitude-modulated envelope to the controlled-linewidth ASE signal, the envelope forming the leading edge of the Q-seed pulse to substantially match the temporal shape of the leading edge of a Q-switched laser pulse.

In some embodiments, the seed signal has a linewidth of at least 1 terahertz (THz), in order to reduce SBS problems. In some embodiments, the seed signal has a linewidth of at least 100 gigahertz (GHz), in order to reduce SBS problems. In some embodiments, the seed signal has a linewidth of at least 10 THz, in order to reduce SBS problems. In some embodiments, the seed signal has a linewidth of at least 100 THz, in order to reduce SBS problems. In some embodiments, the seed signal has a linewidth of at least 0.1 nanometer (nm), in order to reduce SBS problems. In some embodiments, the seed signal has a linewidth of at least 0.2 nm, in order to reduce SBS problems. In some embodiments, the seed signal has a linewidth of at least 0.4 nm, in order to reduce SBS problems. In some embodiments, the seed signal has a linewidth of at least 0.6 nm, in order to reduce SBS problems. In some embodiments, the seed signal has a linewidth of at least 0.8 nm, in order to reduce SBS problems. In some embodiments, the seed signal has a linewidth of at least 1 nm, in order to reduce SBS problems.

In some embodiments of the apparatus, the Q-switched seed laser is implemented in a single package having a volume of no more than six cubic centimeters (6 cm$^3$). In other embodiments, the single package has a volume of no more than 20 cm$^3$. In other embodiments, the single package has a volume of no more than 10 cm$^3$. In other embodiments, the single package has a volume of no more than 8 cm$^3$. In other embodiments, the single package has a volume of no more than 7 cm$^3$. In other embodiments, the single package has a volume of no more than 5 cm$^3$. In other embodiments, the single package has a volume of no more than 4 cm$^3$. In other embodiments, the single package has a volume of no more than 3 cm$^3$. In other embodiments, the single package has a volume of no more than 2 cm$^3$. In other embodiments, the single package has a volume of no more than 1 cm$^3$.

In some embodiments of the apparatus, the Q-switched seed laser generates an optical pulse having an FWHM duration of no more than 50 nanoseconds.

In some embodiments of the apparatus, the output beam pulse has a power of at least 4 milliJoules (mJ).

In some embodiments of the apparatus, the seed signal has a linewidth of at least 1 terahertz (THz), in order to reduce SBS problems.

In some embodiments, the present invention provides an apparatus that includes a pulsed Q-seed source having a light source configured to output a Q-seed signal having a temporal shape that, for at least the leading edge of the Q-seed pulse, substantially matches a temporal shape of a leading edge of a Q-switched laser pulse; and an optical gain fiber having a first pump source and operatively coupled to the pulsed Q-seed source and configured to amplify the seed pulse in the optical gain fiber to obtain an output beam having an energy of at least one milliJoule (1 mJ).

In some embodiments, the apparatus further includes a vehicle having an enclosure; an electrical power supply attached to the vehicle; a laser controller operatively coupled to receive electrical power from the electrical power supply and operably coupled to power and control the first pump source; and a beam-direction controller operably coupled to receive the output beam from the optical gain fiber and operable to direct the output beam in one of a plurality of different possible directions relative to the vehicle.

In some embodiments of the apparatus, the pulsed seed source includes a semiconductor diode laser that is driven by an electrical pulse that causes the semiconductor diode laser to emit a pulse having the leading edge of the seed pulse that substantially matches the temporal shape of the leading edge of a Q-switched laser pulse.

In some embodiments of the apparatus, the pulsed seed source includes a semiconductor diode laser that outputs a continuous-wave (CW) laser signal that is coupled through an electro-optical modulator (EOM) that is driven by an electrical pulse that causes the electro-optical modulator to emit an amplitude-modulated pulse from the CW laser signal, the amplitude-modulated pulse having the leading edge of the seed pulse that substantially matches the temporal shape of the leading edge of a Q-switched laser pulse.

In some embodiments of the apparatus, the pulsed seed source includes a semiconductor diode laser that outputs a CW laser signal that is coupled through an acousto-optical modulator (AOM) that is driven by an electrical pulse that causes the acousto-optical modulator to emit an amplitude-modulated pulse from the CW laser signal, the amplitude-modulated pulse having the leading edge of the seed pulse that substantially matches the temporal shape of the leading edge of a Q-switched laser pulse.

In some embodiments of the apparatus, the seed signal has a beam-intensity full-width half-maximum (FWHM) linewidth of at least 1 terahertz (THz), in order to reduce SBS problems.

In some embodiments, the present invention provides a method that includes providing and optical gain fiber and a first pump source; generating a Q-seed signal pulse having a temporal shape that, for at least the leading edge of the Q-seed signal pulse, substantially matches a temporal shape of a leading edge of a Q-switched laser pulse; coupling the first pump source to provide pump light to the optical gain fiber; and amplifying the Q-seed signal pulse in the optical gain fiber to obtain an output beam having an energy of at least one milliJoule (1 mJ).

In some embodiments, the method further includes providing a vehicle having an enclosure and an electrical power supply attached to the vehicle, receiving electrical power from the electrical power supply and operably coupling the electrical power to power and control the first pump source; and receiving the output beam from the optical gain fiber and directing the output beam in one of a plurality of different possible directions relative to the vehicle.

In some embodiments of the method, the pulsed seed source includes a semiconductor diode laser that is driven by an electrical pulse that causes the semiconductor diode laser to emit a pulse having the leading edge of the seed pulse that substantially matches the temporal shape of the leading edge of a Q-switched laser pulse.

In some embodiments of the method, the generating of the Q-seed signal pulse includes using a semiconductor diode laser to outputs a continuous-wave (CW) laser signal, coupling the CW laser signal through an electro-optical modulator (EOM); driving the EOM with an electrical pulse that causes the EOM to emit an amplitude-modulated pulse from the CW laser signal, the amplitude-modulated pulse having the leading edge of the seed pulse that substantially matches the temporal shape of the leading edge of a Q-switched laser pulse.

In some embodiments of the method, the generating of the Q-seed signal pulse includes using includes using a semiconductor diode laser to outputs a CW laser signal; coupling the CW laser signal through an acousto-optical modulator (AOM); driving the AOM with an electrical pulse that causes the acousto-optical modulator to emit an amplitude-modulated pulse from the CW laser signal, the amplitude-modulated pulse having the leading edge of the seed pulse that substantially matches the temporal shape of the leading edge of a Q-switched laser pulse.

In some embodiments of the apparatus, the seed signal has a beam-intensity full-width half-maximum (FWHM) linewidth of at least 1 terahertz (THz), in order to reduce SBS problems.

In some embodiments of the apparatus, the pulsed Q-seed source includes a Q-switched laser that includes a gain medium within a lasing cavity, an optical pump source, and a 1×N electrically controlled optical switch as a Q-switch in the cavity, wherein the optical switch includes a first state that optically couples light from the optical pump source to the gain medium while blocking signal lasing in the cavity and a second state that permits signal lasing in the cavity. In some embodiments, in the second state the lasing signal is output, e.g., in some embodiments, through a partially transmissive mirror, evanescent fiber coupler, or the like (such as reference number 126 of FIG. 1B2 or FIG. 1B4).

In some embodiments, the present invention provides an apparatus that includes a Q-switched laser that includes a gain medium within a lasing cavity, an optical pump source, and a 1×N electrically controlled optical switch as a Q-switch in the cavity, wherein the optical switch has a plurality of states including a first state that optically couples light from the optical pump source to the gain medium while blocking signal lasing in the cavity and a second state that permits signal lasing in the cavity.

In some embodiments of the apparatus, the 1×N optical switch is a 1×2 electrically controlled optical switch. In some embodiments of the apparatus, the 1×N optical switch is a 1×3 electrically controlled optical switch.

In some embodiments, the present invention provides an apparatus that includes an optical gain fiber having a second optical pump source; means for generating a seed signal having a Q-switched-pulsed-laser temporal shape; and means for amplifying the Q-switched pulsed-laser seed signal in the optical gain fiber to obtain an output beam having a power of at least one milliJoule (1 mJ).

In some embodiments, the apparatus further includes a vehicle having an enclosure; means for controlling and powering the pump source; and means for controlling an output direction of the output beam in one of a plurality of different possible directions relative to the vehicle.

In some embodiments of the apparatus, the means for generating the seed signal includes means for optically amplitude-modulating a signal inside a uni-directional ring cavity. In some embodiments of the apparatus, the means for generating the seed signal includes means for optically amplitude-modulating a signal inside cavity that is implemented in a single package having a volume of no more than six (6) cm3. In some embodiments of the apparatus, the means for generating the seed signal includes means for generating an optical pulse having a full-width half-maximum (FWHM) duration of no more than 50 nanoseconds.

In some embodiments of the apparatus, the means for amplifying the Q-switched pulsed-laser seed signal includes means for outputting the output beam pulse with a power of at least 4 mJ.

In some embodiments of the apparatus, the means for generating the seed signal generates the seed signal with a linewidth of at least 1 terahertz (THz), in order to reduce SBS problems.

In some embodiments, the embodiments described herein are combined with the apparatus and method embodiments of the patents and patent applications listed at the beginning and elsewhere in this application and incorporated herein by reference to form combinations within the scope of the present invention.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," "third," etc., are used merely as labels, and are not intended to impose numerical requirements on their objects.

What is claimed is:

1. An apparatus comprising:
a Q-switched seed laser, wherein the Q-switched seed laser includes:
   a first optical pump source,
   a first optical-gain waveguide optically coupled to receive pump light from the first optical pump source and configured to amplify signal light that propagates through the first optical-gain waveguide, and
   a solid-state optical amplifier configured to receive the amplified signal light from the first optical-gain waveguide and, in a first mode, configured to attenuate the amplified signal light, and in a second mode, configured to enable generation of a Q-switched pulsed-laser seed signal;
a vehicle having an enclosure;
an electrical power supply attached to the vehicle;
a laser controller operatively coupled to receive electrical power from the electrical power supply and operably coupled to power and control the first optical pump source;
a high-power amplification system having at least a second pump source and a second optical-gain waveguide, wherein the high-power amplification system is operatively coupled to receive the Q-switched pulsed-laser seed signal and operatively configured to amplify the Q-switched pulsed-laser seed signal in the second optical-gain waveguide to obtain an output beam; and
a beam-direction controller operably coupled to receive the output beam from the second optical-gain waveguide and operable to direct the output beam in one of a plurality of different possible directions relative to the vehicle.

2. An apparatus comprising:
a Q-switched seed laser, wherein the Q-switched seed laser includes:
   a first optical pump source, and
   a lasing cavity, wherein the lasing cavity includes:
      a first optical-gain waveguide optically coupled to receive pump light from the first optical pump source and configured to amplify signal light that propagates through the first optical-gain waveguide, and
      a solid-state optical amplifier configured to receive the amplified signal light from the first optical-gain waveguide and, in a first mode, configured to attenuate the amplified signal light, and in a second mode, configured to enable generation of a Q-switched pulsed-laser seed signal in the lasing cavity,
wherein the Q-switched seed laser is implemented in a single package having a volume of no more than six (6) cm$^3$.

3. An apparatus comprising:
a Q-switched seed laser, wherein the Q-switched seed laser includes:
   a first optical pump source, and
   a lasing cavity, wherein the lasing cavity includes:
      a first optical-gain waveguide optically coupled to receive pump light from the first optical pump source and configured to amplify signal light that propagates through the first optical-gain waveguide, and
      a solid-state optical amplifier configured to receive the amplified signal light from the first optical-gain waveguide and, in a first mode, configured to attenuate the amplified signal light, and in a second mode, configured to enable generation of a Q-switched pulsed-laser seed signal in the lasing cavity,
wherein the Q-switched seed laser generates an optical pulse having a full-width half-maximum (FWHM) duration of between one and five nanoseconds, inclusive.

4. The apparatus of claim 3, further comprising:
a high-power amplification system that includes at least a second optical pump source and a second optical-gain waveguide, wherein the high-power amplification system is operatively coupled to receive the Q-switched pulsed-laser seed signal and is operatively configured to amplify the Q-switched pulsed-laser seed signal in the second optical-gain waveguide to obtain an output beam,
wherein the Q-switched seed laser includes an output coupler beam splitter configured to transmit a first portion of the Q-switched pulsed-laser seed signal to the high-power amplification system and configured to transmit a second portion of the Q-switched pulsed-laser seed signal as feedback into the first optical-gain waveguide.

5. The apparatus of claim 3, further comprising:
a high-power amplification system that includes at least a second optical pump source and a second optical-gain waveguide, wherein the high-power amplification system is operatively coupled to receive the Q-switched pulsed-laser seed signal and is operatively configured to amplify the Q-switched pulsed-laser seed signal in the second optical-gain waveguide to obtain an output beam,
wherein the second optical-gain waveguide includes a first high-gain optical fiber amplifier and a second high-gain optical fiber amplifier optically coupled in a chain configuration.

6. The apparatus of claim 3, further comprising:
a high-power amplification system that includes at least a second optical pump source and a second optical-gain waveguide, wherein the high-power amplification system is operatively coupled to receive the Q-switched pulsed-laser seed signal and is operatively configured to amplify the Q-switched pulsed-laser seed signal in the second optical-gain waveguide to obtain an output beam,
wherein the high-power amplification system further includes a hollow-core delivery fiber having a fiber endcap.

7. The apparatus of claim 3 further comprising:
a vehicle having an enclosure;
an electrical power supply attached to the vehicle;
a laser controller operatively coupled to receive electrical power from the electrical power supply and operably coupled to power and control the first optical pump source;
a high-power amplification system having at least a second pump source and a second optical-gain waveguide, wherein the high-power amplification system is operatively coupled to receive the Q-switched pulsed-laser seed signal and operatively configured to amplify the Q-switched pulsed-laser seed signal in the second optical-gain waveguide to obtain an output beam; and
a beam-direction controller operably coupled to receive the output beam from the second optical-gain waveguide and operable to direct the output beam in one of a plurality of different possible directions relative to the vehicle.

8. An apparatus comprising:
a Q-switched seed laser, wherein the Q-switched seed laser includes:
 a first optical pump source, and
 a lasing cavity, wherein the lasing cavity includes:
  a first optical-gain waveguide optically coupled to receive pump light from the first optical pump source and configured to amplify signal light that propagates through the first optical-gain waveguide, and
  a solid-state optical amplifier configured to receive the amplified signal light from the first optical-gain waveguide and, in a first mode, configured to attenuate the amplified signal light, and in a second mode, configured to enable generation of a Q-switched pulsed-laser seed signal in the lasing cavity,
wherein the Q-switched seed laser generates an optical pulse having an energy of at least 4 milliJoules (mJ).

9. The apparatus of claim 8, wherein the first optical-gain waveguide and the solid-state optical amplifier are configured as a Q-switched ring laser, the ring laser further comprising an optical isolator configured to force unidirectional light travel around the ring laser.

10. The apparatus of claim 8, wherein the solid-state optical amplifier is an electrically powered semiconductor-diode optical amplifier.

11. The apparatus of claim 8, wherein the solid-state optical amplifier is an electrically powered semiconductor-diode optical amplifier, the apparatus further comprising:
an electrical driver that supplies electrical power to the semiconductor-diode optical amplifier to enable generation of the Q-switched pulsed-laser seed signal.

12. The apparatus of claim 8, wherein the solid-state optical amplifier is an optically powered optical amplifier.

13. The apparatus of claim 8, wherein the solid-state optical amplifier is an optically powered optical amplifier, the apparatus further comprising an electrically powered pump-light semiconductor-diode that is activated by an electrical pulse to supply pump light to the optically powered optical amplifier to enable the generation of the Q-switched pulsed-laser seed signal.

14. The apparatus of claim 8, wherein the first optical-gain waveguide is a planar waveguide formed on a substrate.

15. The apparatus of claim 8, wherein the Q-switched seed laser includes a wavelength-division multiplexer (WDM) configured to couple the amplified signal light from the first optical-gain waveguide to the solid-state optical amplifier and to couple the pump light from the first optical pump source into the first optical-gain waveguide.

16. A method comprising:
providing a lasing cavity that includes a first optical-gain waveguide and a solid-state optical amplifier;
optically pumping the first optical-gain waveguide in order to amplify signal light propagating through the first optical-gain waveguide; and
in a first mode of the solid-state optical amplifier, attenuating the amplified signal light, and in a second mode of the solid-state optical amplifier, enabling generation of a Q-switched pulsed-laser seed signal in the lasing cavity, wherein the Q-switched pulsed-laser seed signal has an energy of at least 1 milliJoule (mJ).

17. The method of claim 16, further comprising:
configuring the first optical-gain waveguide and the solid-state optical amplifier as a Q-switched ring laser; and
forcing unidirectional light travel around the ring laser.

18. The method of claim 16, wherein the enabling of the generation of the Q-switched pulsed-laser seed signal includes supplying electrical power to the solid-state optical amplifier.

19. The method of claim 16, wherein the enabling generation of the Q-switched pulsed-laser seed signal includes optically powering the solid-state optical amplifier.

20. An apparatus comprising:
a lasing cavity, wherein the lasing cavity includes a first optical-gain waveguide;
an optical pump source coupled to supply pump light to the first optical-gain waveguide in order to amplify signal light propagating through the first optical-gain waveguide;
solid-state means for, in a first mode, attenuating the amplified signal light, and in a second mode, enabling generation of a Q-switched pulsed-laser seed signal in the lasing cavity, wherein the Q-switched pulsed-laser seed signal has an energy of at least 1 milliJoule (mJ).

* * * * *